United States Patent
Choo et al.

(10) Patent No.: US 9,959,879 B2
(45) Date of Patent: *May 1, 2018

(54) CONTEXT-BASED ARITHMETIC ENCODING APPARATUS AND METHOD AND CONTEXT-BASED ARITHMETIC DECODING APPARATUS AND METHOD

(71) Applicant: SAMSUNG ELECTRONICS CO., LTD., Suwon-si (KR)

(72) Inventors: Ki Hyun Choo, Seoul (KR); Jung-Hoe Kim, Hwaseong-si (KR); Eun Mi Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 98 days.

This patent is subject to a terminal disclaimer.

(21) Appl. No.: 14/922,958

(22) Filed: Oct. 26, 2015

(65) Prior Publication Data

US 2016/0049160 A1    Feb. 18, 2016

Related U.S. Application Data

(63) Continuation of application No. 12/801,632, filed on Jun. 17, 2010, now Pat. No. 9,171,550.

(30) Foreign Application Priority Data

Jun. 19, 2009 (KR) .................. 10-2009-0055113
Jun. 24, 2009 (KR) .................. 10-2009-0056301
(Continued)

(51) Int. Cl.
*G10L 19/00* (2013.01)
*G10L 21/04* (2013.01)
(Continued)

(52) U.S. Cl.
CPC .......... *G10L 19/20* (2013.01); *G10L 19/0017* (2013.01); *H03M 7/4006* (2013.01); *H03M 7/4012* (2013.01); *H03M 7/4018* (2013.01)

(58) Field of Classification Search
CPC ... G10L 19/00; G10L 19/0017; G10L 19/002; G10L 19/02; G10L 19/0208;
(Continued)

(56) References Cited

U.S. PATENT DOCUMENTS 5,798,719 A    8/1998   Wise et al.
5,801,649 A    9/1998   Feddrickson
(Continued)

FOREIGN PATENT DOCUMENTS

CN    1681213 A    10/2005
CN    1684371 A    10/2005
(Continued)

OTHER PUBLICATIONS

Communication dated Sep. 11, 2015, issued by the Korean Intellectual Property Office in counterpart Korean Patent Application No. 10-2010-0000643.
(Continued)

*Primary Examiner* — Paras D Shah
(74) *Attorney, Agent, or Firm* — Sughrue Mion, PLLC

(57) ABSTRACT

A context-based arithmetic encoding apparatus and method and a context-based arithmetic decoding apparatus and method are provided. The context-based arithmetic decoding apparatus may determine a context of a current N-tuple to be decoded, determine a Most Significant Bit (MSB) context corresponding to an MSB symbol of the current N-tuple, and determine a probability model using the context of the N-tuple and the MSB context. Subsequently, the context-based arithmetic decoding apparatus may perform a decoding on an MSB based on the determined probability
(Continued)

model, and perform a decoding on a Least Significant Bit (LSB) based on a bit depth of the LSB derived from a process of decoding on an escape code.

3 Claims, 30 Drawing Sheets

(30) Foreign Application Priority Data

| Oct. 21, 2009 | (KR) | 10-2009-0100457 |
|---|---|---|
| Dec. 10, 2009 | (KR) | 10-2009-0122733 |
| Jan. 4, 2010 | (KR) | 10-2010-0000281 |
| Jan. 5, 2010 | (KR) | 10-2010-0000643 |

(51) Int. Cl.
*H03M 7/00* (2006.01)
*H04N 7/26* (2006.01)
*G10L 19/20* (2013.01)
*H03M 7/40* (2006.01)

(58) Field of Classification Search
CPC ....... G10L 19/032; G10L 19/06; G10L 19/16; G10L 19/18; G10L 19/24
USPC .................. 704/500–504; 341/50, 51, 200
See application file for complete search history.

(56) References Cited

U.S. PATENT DOCUMENTS

| 6,094,636 | A | 7/2000 | Kim |
| 6,188,336 | B1 | 2/2001 | Kim |
| 6,289,128 | B1* | 9/2001 | Allen ...................... H03M 7/30 341/51 |
| 6,349,284 | B1 | 2/2002 | Park et al. |
| 6,400,289 | B1 | 6/2002 | Banerji |
| 6,438,525 | B1 | 8/2002 | Park |
| 6,529,604 | B1 | 3/2003 | Park et al. |
| 6,664,913 | B1 | 12/2003 | Craven et al. |
| 6,704,368 | B1* | 3/2004 | Nefedov ................ H04L 1/005 375/264 |
| 7,272,567 | B2 | 9/2007 | Fejzo |
| 7,372,378 | B2* | 5/2008 | Sriram .................. H03M 7/425 341/51 |
| 7,426,462 | B2 | 9/2008 | Young et al. |
| 7,617,110 | B2 | 11/2009 | Kim et al. |
| 7,623,047 | B2 | 11/2009 | Ordentlich et al. |
| 7,660,720 | B2 | 2/2010 | Oh et al. |
| 7,991,610 | B2 | 8/2011 | Sperschneider et al. |
| 8,013,866 | B2 | 9/2011 | Yoshida et al. |
| 8,046,235 | B2 | 10/2011 | Kim et al. |
| 8,224,658 | B2 | 7/2012 | Lei et al. |
| 8,412,533 | B2 | 4/2013 | Choo et al. |
| 2004/0193995 | A1 | 9/2004 | Park et al. |
| 2004/0208169 | A1 | 10/2004 | Reznik |
| 2005/0075888 | A1 | 4/2005 | Young et al. |
| 2005/0129109 | A1* | 6/2005 | Kim ...................... G10L 19/24 375/240.01 |
| 2005/0156762 | A1 | 7/2005 | Tsuru |
| 2005/0192799 | A1* | 9/2005 | Kim .................... G10L 19/0017 704/229 |
| 2005/0203731 | A1 | 9/2005 | Oh et al. |
| 2005/0203737 | A1 | 9/2005 | Miyazaki |
| 2005/0231396 | A1 | 10/2005 | Dunn |
| 2006/0235679 | A1 | 10/2006 | Sperschneider et al. |
| 2007/0078646 | A1 | 4/2007 | Lei et al. |
| 2007/0127580 | A1 | 6/2007 | Lei et al. |
| 2007/0140554 | A1 | 6/2007 | Strom et al. |
| 2007/0217695 | A1 | 9/2007 | Nakamura |
| 2008/0094259 | A1 | 4/2008 | Yu et al. |
| 2008/0284623 | A1 | 11/2008 | Beack et al. |
| 2009/0112897 | A1 | 4/2009 | Ordentlich et al. |
| 2011/0116542 | A1* | 5/2011 | Oger ...................... G10L 19/00 375/240.03 |
| 2011/0173007 | A1 | 7/2011 | Multrus et al. |

FOREIGN PATENT DOCUMENTS

| JP | 2001230935 A | 8/2001 |
| JP | 2005242363 A | 9/2005 |
| JP | 2005260969 A | 9/2005 |
| JP | 2006293375 A | 10/2006 |
| JP | 2007028531 A | 2/2007 |
| JP | 2007510170 A | 4/2007 |
| JP | 2007214814 A | 8/2007 |
| JP | 2008536410 A | 9/2008 |
| JP | 2009518934 A | 5/2009 |
| KR | 10-0359671 | 10/2002 |
| KR | 20050061371 A | 6/2005 |
| KR | 20050090941 A | 9/2005 |
| KR | 10-2007-0059849 A | 6/2007 |
| RU | 2 224 302 C2 | 10/1999 |
| RU | 97 122 039 A | 11/1999 |
| RU | 2194361 C2 | 12/2002 |
| RU | 2280323 C2 | 7/2006 |
| RU | 2317587 C1 | 2/2008 |
| WO | 2010003479 A1 | 1/2010 |

OTHER PUBLICATIONS

Communication dated Mar. 31, 2015, issued by the European Patent Office in counterpart European Application No. 10789763.9.
Fuchs, et al.; "MDCT-Based Coder for Highly Adaptive Speech and Audio Coding", 17th European Signal Processing Conference, Aug. 2009, 5 pages total.
Fuchs, et al.; "Updated Proposal of the CE on the Spectral Noiseless Coding in USAC", International Organisation for Standardisation, ISO/IEC JTC1/SC29/WG11 MPEG2010/M17270, Jan. 2010, 21 pages total.
Neuendorf, et al.; "Detailed Technical Description of Reverence Model 0 of the CfP on Unified Speech and Audio Coding (USAC)", International Organization for Standardization, ISO/IEC JTC1/SC29/WG11 MPEG2008/M13867, Oct. 2008, 99 pages total.
Japanese Office Action dated May 13, 2014 in corresponding Japanese Patent Application 2012-515996.
Max Neuendorf et al. A Novel Scheme for Low Bitrate Unified Speech and Audio Coding-MPEG RM0, Audio Engineering Society Convention Paper 7713 May 2009, pp. 1-13, URL: http://www.gel.userbrooke.ca/gournay/documents/publications/aes126_neuendorf.pdf.
Russia Notice of Allowance dated Apr. 1, 2013 in corresponding Russian Patent Application 2011151607.
Chinese Office First Office Action dated Jan. 24, 2014 in corresponding Chinese Patent Application 201080027852.X.
Notice of Allowance dated Nov. 15, 2012 in related U.S. Appl. No. 13/464,529.
International Search Report dated Dec. 30, 2012 in corresponding International Patent Application PCT/KR2010/003975.
Office Action dated Jul. 9, 2012 in U.S. Appl. No. 13/464,529.
Communication dated May 10, 2017 issued by the Korean Patent Office in counterpart Korean Patent Application No. 10-2017-0034922.
Communication dated Jul. 14, 2017 issued by the Russian Patent Office in counterpart Russian Patent Application No. 2013129559.
Communication dated Jan. 2, 2018, issued by The State Intellectual Property Office of P.R. China in counterpart Chinese Application No. 201610032446.1.
Communication dated Jan. 23, 2018, issued by the Russian Patent Office in counterpart Russian Application No. 2013129559.

\* cited by examiner

USAC
USAC DECODING APPARATUS

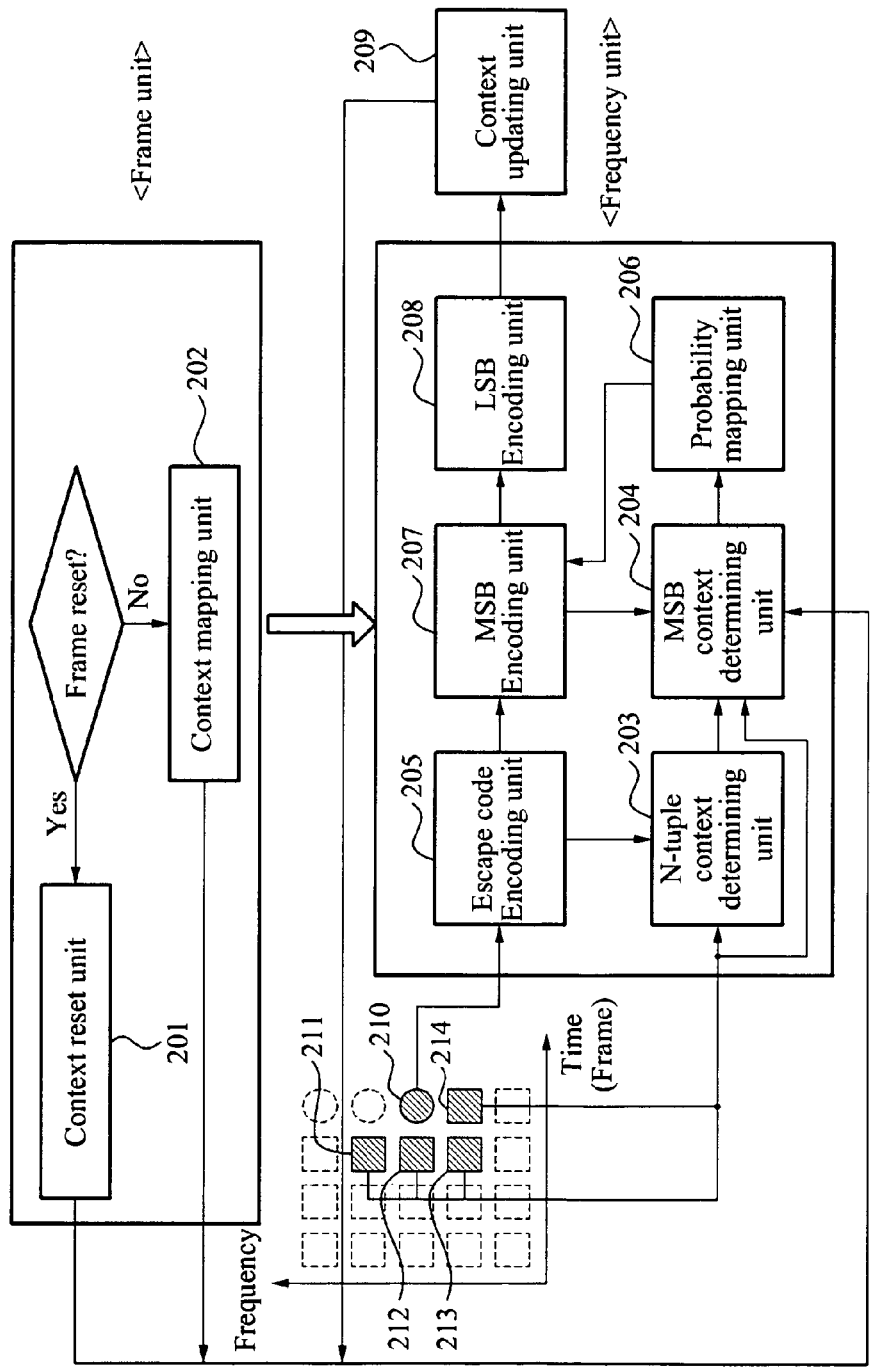

FIG. 4
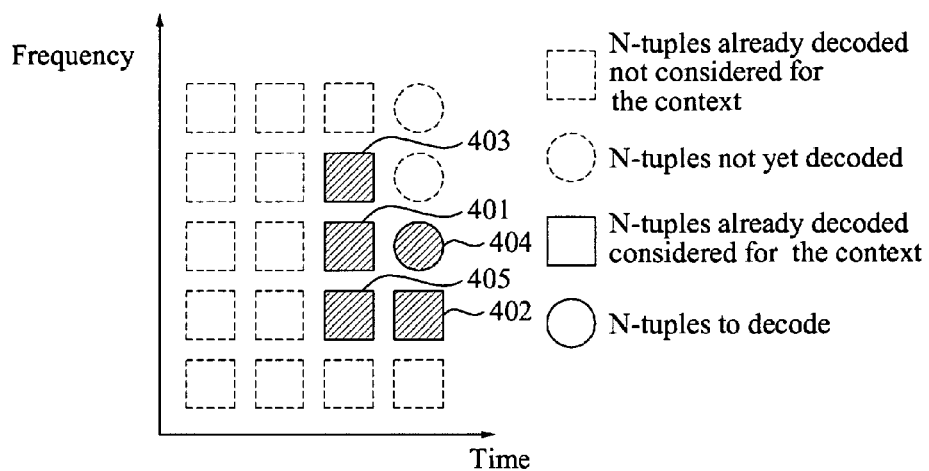
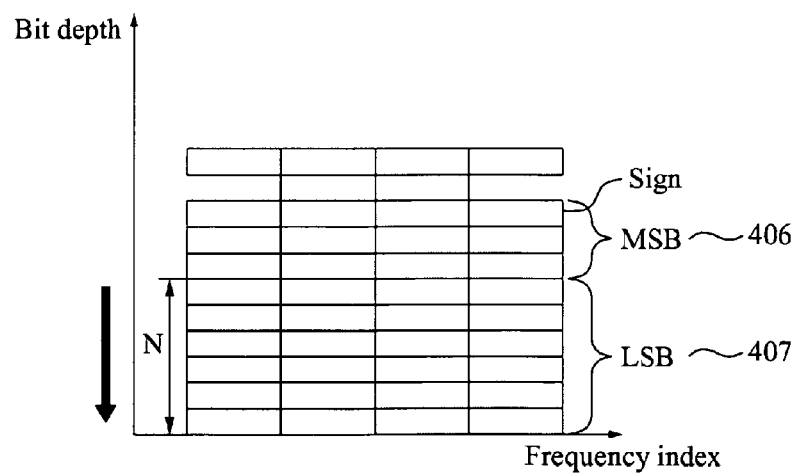

| A | Mode 0 | Mode 1 | Mode 2 | Mode 3 |
|---|---|---|---|---|
| MSB Context | A0, D1 | D1, C1 | D1, B1 | B0, D1 |

| Context Mode | Low Frequency | High Frequency |
|---|---|---|
| 0 | A0, D1 | A0, D1 |
| 1 | D1, C1 | D1, C1 |
| 2 | D1, B1 | D1, B1 |
| 3 | B0, D1 | B0, D1 |
| 4 | A0, D1 | D1, C1 |
| 5 | A0, D1 | D1, B1 |
| 6 | A0, D1 | B0, D1 |
| 7 | D1, C1 | A0, D1 |
| 8 | D1, C1 | D1, B1 |
| 9 | D1, C1 | B0, D1 |
| 10 | D1, B1 | A0, D1 |
| 11 | D1, B1 | D1, C1 |
| 12 | D1, B1 | B0, D1 |
| 13 | B0, D1 | A0, D1 |
| 14 | B0, D1 | D1, C1 |
| 15 | B0, D1 | D1, B1 |

FIG. 21
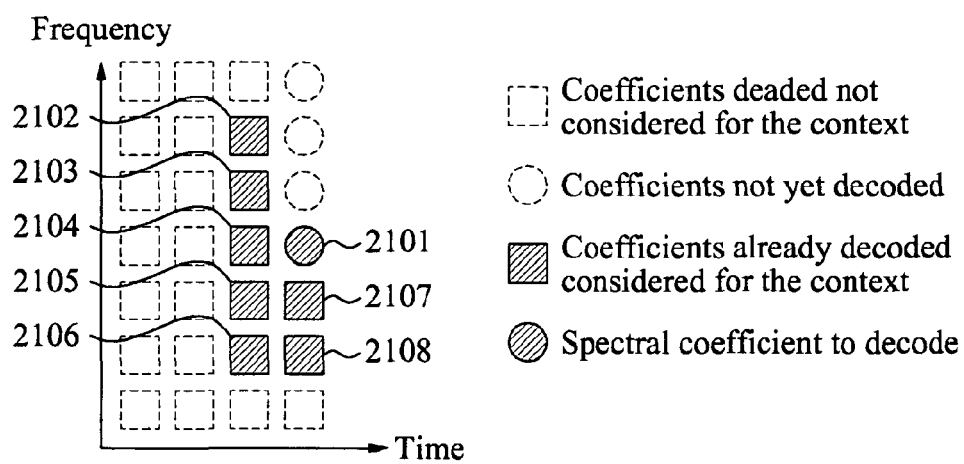
- ⬚ Coefficients deaded not considered for the context
- ◯ Coefficients not yet decoded
- ▧ Coefficients already decoded considered for the context
- ⊘ Spectral coefficient to decode
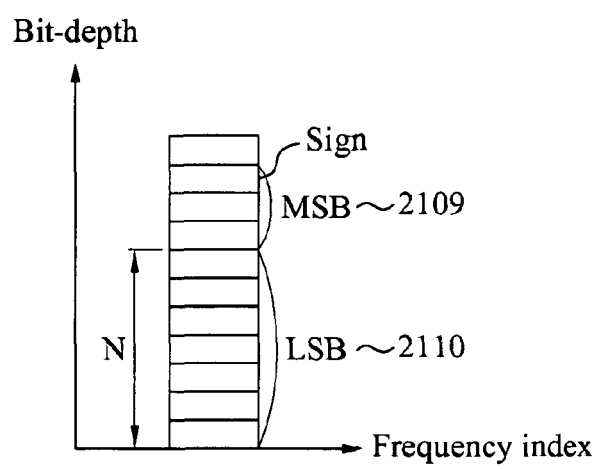

CONTEXT-BASED ARITHMETIC ENCODING APPARATUS AND METHOD AND CONTEXT-BASED ARITHMETIC DECODING APPARATUS AND METHOD

CROSS-REFERENCE TO RELATED APPLICATIONS

This application is a continuation of U.S. application Ser. No. 12/801,632, filed on Jun. 17, 2010, which is set to become U.S. Pat. No. 9,171,550 on Oct. 27, 2015 and which claims the priority benefit of Korean Patent Application No. 10-2009-0055113, filed on Jun. 19, 2009, Korean Patent Application No. 10-2009-0056301, filed on Jun. 24, 2009, Korean Patent Application No. 10-2009-0100457, filed on Oct. 21, 2009, Korean Patent Application No. 10-2009-0122733, filed on Dec. 10, 2009, Korean Patent Application No. 10-2010-0000281, filed on Jan. 4, 2010 and Korean Patent Application No. 10-2010-0000643, filed on Jan. 5, 2010, in the Korean Intellectual Property Office, the disclosures of which are incorporated herein by references.

BACKGROUND

1. Field

One or more embodiments relate to a coding and decoding method of an audio signal, and more particularly, to a lossless coding and decoding method.

2. Description of the Related Art

An encoding and decoding of an audio signal may generally be performed in a frequency domain. As a representative example, an Advanced Audio Coding (AAC) may be given. An AAC codec may perform a Modified Discrete Cosine Transformation (MDCT) for transforming into the frequency domain, and perform a frequency spectrum quantization using a masking degree of a signal in view of a psychological sound. A lossless compression scheme may be adopted in order to further compress a result of the performed quantization, and a Huffman coding may be used in the AAC. As the lossless compression scheme, a Bit-sliced Arithmetic Coding (BSAC) codec in which an arithmetic coding is applicable instead of the Huffman coding may be used.

An encoding and decoding of a speech signal may generally be performed in a time domain. A majority of speech codecs compressing in the time domain may be related with a code excited linear prediction (CELP). The CELP may be a speech encoding technology, and G. 729, an Adaptive Multi Rate-WideBand (AMR-WB), an internet Low Bitrate Codec (iLBC) an Enhanced Variable Rate Codec (EVRC), and the like which are extensively used may be CELP-based speech encoders. These coding schemes may be developed under an assumption that the speech signal is obtained using a linear prediction. In encoding a speech, a linear prediction coefficient and an excitation signal may be needed. In general, the linear prediction coefficient may be encoded using a line spectral pairs (LSP), and the excitation signal may be encoded using several codebooks. As examples of an encoding scheme developed based on the CELP, an algebraic code excited linear prediction (ACELP) encoding scheme, a Conjugate Structure code excited linear prediction (CS-CELP) encoding scheme, and the like may be given.

Due to a difference in a sensitivity between a low frequency band and a high frequency band in view of restrictions in a data rate and the psychological sound, the low frequency band may be sensitive to a fine structure of voice/music frequencies, and the high frequency band may be less sensitive to the fine structure. Thus, the lower frequency band may apply a greater number of bits to accurately encode the fine structure, and the high frequency band may apply a smaller number of bits to encode the fine structure. In this instance, the low frequency band may adopt an encoding scheme using the AAC codec, and the high frequency band may adopt an encoding scheme using energy information and adjustment information, which is referred to as a Spectral Band Replication (SBR) technology. The SBR may copy a low frequency signal in a Quadrature Mirror Filter (QMF) domain to generate a high frequency signal.

A scheme of reducing a number of used bits may be applicable even in a stereo signal. More specifically, a parameter indicating stereo information may be extracted after transforming the stereo signal into a mono signal, data obtained by compressing the stereo parameter and the mono signal may be transmitted, and the stereo signal may be decoded using the transmitted parameter in a decoder. As a scheme of compressing the stereo information, a Parametric Stereo (PS) technology may be used, and as a scheme of extracting a parameter of a multi-channel signal as well as the stereo signal and transmitting the extracted signal, a Moving Picture Experts Group (MPEG) surround technology may be used.

Also, more specifically taking an object of the above described lossless coding into account, the lossless coding may be performed when a quantization index of a quantized spectrum is assumed to be one symbol. Also, the lossless coding may be performed such that an index of the quantized spectrum is mapped on a bit plane to bundle bits.

In a case of performing a context-based lossless coding, it is possible to perform the lossless coding using information about a previous frame.

SUMMARY

According to an aspect of one or more embodiments, there may be provided a context-based arithmetic encoding apparatus, the apparatus including: an N-tuple context determining unit to determine a context of a current N-tuple to be encoded; an escape code encoding unit to perform an encoding on an escape code based on the context of the current N-tuple; a Most Significant Bit (MSB) context determining unit to determine an MSB context corresponding to an MSB symbol of the current N-tuple; a probability model mapping unit to determine a probability model using the context of the current N-tuple and the MSB context; an MSB encoding unit to perform an encoding on an MSB based on the determined probability model; and a Least significant Bit (LSB) encoding unit to perform an encoding on an LSB based on a bit depth of the LSB derived from the encoding of the escape code.

The apparatus further include a context reset unit to perform a context reset when a current frame is a reset frame, and a context mapping unit to map a context to map a frequency index between lengths of the current frame and a previous frame when the current frame is different from the reset frame.

The apparatus further include a context mode encoding unit to perform an encoding on a single context mode from a plurality of MSB contexts to be used when the MSB is encoded.

According to another aspect of one or more embodiments, there may be provided a context-based arithmetic decoding apparatus, the apparatus including: an N-tuple context determining unit to determine a context of a current N-tuple to be decoded; an escape code decoding unit to perform a decoding on an escape code based on the context of the current N-tuple; an MSB context determining unit to determine an MSB context corresponding to an MSB symbol of the current N-tuple; a probability model mapping unit to determine a probability model using the context of the current N-tuple and the MSB context; an MSB decoding unit to perform a decoding on an MSB based on the determined probability model; and an LSB decoding unit to perform a decoding on an LSB based on a bit depth of the LSB derived from the decoding of the escape code.

The apparatus may further include a context reset unit to perform a context reset when a current frame is a reset frame, and a context mapping unit to map a context to map a frequency index between lengths of the current frame and a previous frame when the current frame is different from the reset frame.

The apparatus may further include a context mode decoding unit to perform a decoding on a single context mode from a plurality of MSB contexts to be used when the MSB is decoded.

According to still another aspect of one or more embodiments, there may be provided a context-based arithmetic decoding method, the method including: performing a decoding on an MSB of a current N-tuple to be decoded, using an N-tuple context based on neighborhood N-tuples neighboring the current N-tuple; and performing a decoding on an LSB of the current N-tuple using an LSB context based on sign information of the MSB.

According to yet another aspect of one or more embodiments, there may be provided a context-based arithmetic decoding method, the method including: performing a decoding on an MSB of a current N-tuple to be decoded, using an N-tuple context based on neighborhood N-tuples neighboring the current N-tuple; and performing a decoding on an LSB of the current N-tuple using an LSB context based on sign information of the MSB and a bit depth of the LSB.

According to further aspect of one or more embodiments, there may be provided a context-based arithmetic decoding method, the method including: performing, depending on whether an N-tuple context is in a specific sub-set state, a decoding on an MSB of a current N-tuple to be decoded, using one of (1) the N-tuple context based on neighborhood N-tuples neighboring the current N-tuple and (2) the N-tuple context and an additional context; and performing a decoding on an LSB of the current N-tuple using an LSB context based on sign information of the MSB.

According to further aspect of one or more embodiments, there may be provided a context-based arithmetic decoding method, the method including: performing, depending on whether an N-tuple context is in a specific state, a decoding on an MSB of a current N-tuple to be decoded, using one of (1) the N-tuple context based on neighborhood N-tuples neighboring the current N-tuple and (2) the N-tuple context and an additional context; and performing a decoding on an LSB of the current N-tuple using an LSB context based on sign information of the MSB and a bit depth of the LSB.

According to further aspect of one or more embodiments, there may be provided a context-based arithmetic decoding method, the method including: performing a decoding on a context template of a current N-tuple to be decoded; determining an N-tuple context for the current N-tuple; performing a decoding on an escape code based on the N-tuple context; determining an MSB context corresponding to an MSB symbol of the current N-tuple, based on the decoded context template; determining a probability model using the N-tuple context and the MSB context; performing a decoding on an MSB based on the determined probability model; and performing a decoding on an LSB based on a bit depth of the LSB derived from the decoding of the escape code.

According to further aspect of one or more embodiments, there may be provided a context-based arithmetic decoding method, the method including: performing a decoding on an MSB of a current 1-tuple to be decoded, using a 1-tuple context based on neighborhood 1-tuples neighboring the current 1-tuple; performing a lev 0 estimation using an absolute value of each of the neighborhood 1-tuples used to perform the lev 0 estimation of the current 1-tuple when the MSB is decoded; and performing a decoding on an LSB of the current 1-tuple.

According to further aspect of one or more embodiments, there may be provided a context-based arithmetic decoding method, the method comprising: performing a decoding on an MSB of a current 2-tuple to be decoded, using at least one of a 2-tuple context based on neighborhood 2-tuples neighboring the current 2-tuple and an additional context; and performing a decoding an LSB of the current 2-tuple when the MSB of the current 2-tuple is decoded.

According to another aspect of one or more embodiments, there is provided at least one computer readable medium storing computer readable instructions to implement methods of one or more embodiments.

Additional aspects of embodiments will be set forth in part in the description which follows and, in part, will be apparent from the description, or may be learned by practice of the disclosure.

According to embodiments, a coding efficiency may be improved, and a required space of a memory may be reduced.

BRIEF DESCRIPTION OF THE DRAWINGS

These and/or other aspects will become apparent and more readily appreciated from the following description of embodiments, taken in conjunction with the accompanying drawings of which:

FIG. 2 illustrates a configuration of a first example of an arithmetic encoding apparatus according to an embodiment, in detail;

FIG. 4 is a diagram used for describing an N-tuple, a most significant bit (MSB), and a least significant bit (LSB) according to an embodiment;

FIG. 21 illustrates a 1-tuple, an MSB, and an LSB according to an embodiment;

DETAILED DESCRIPTION

Figure 1A:
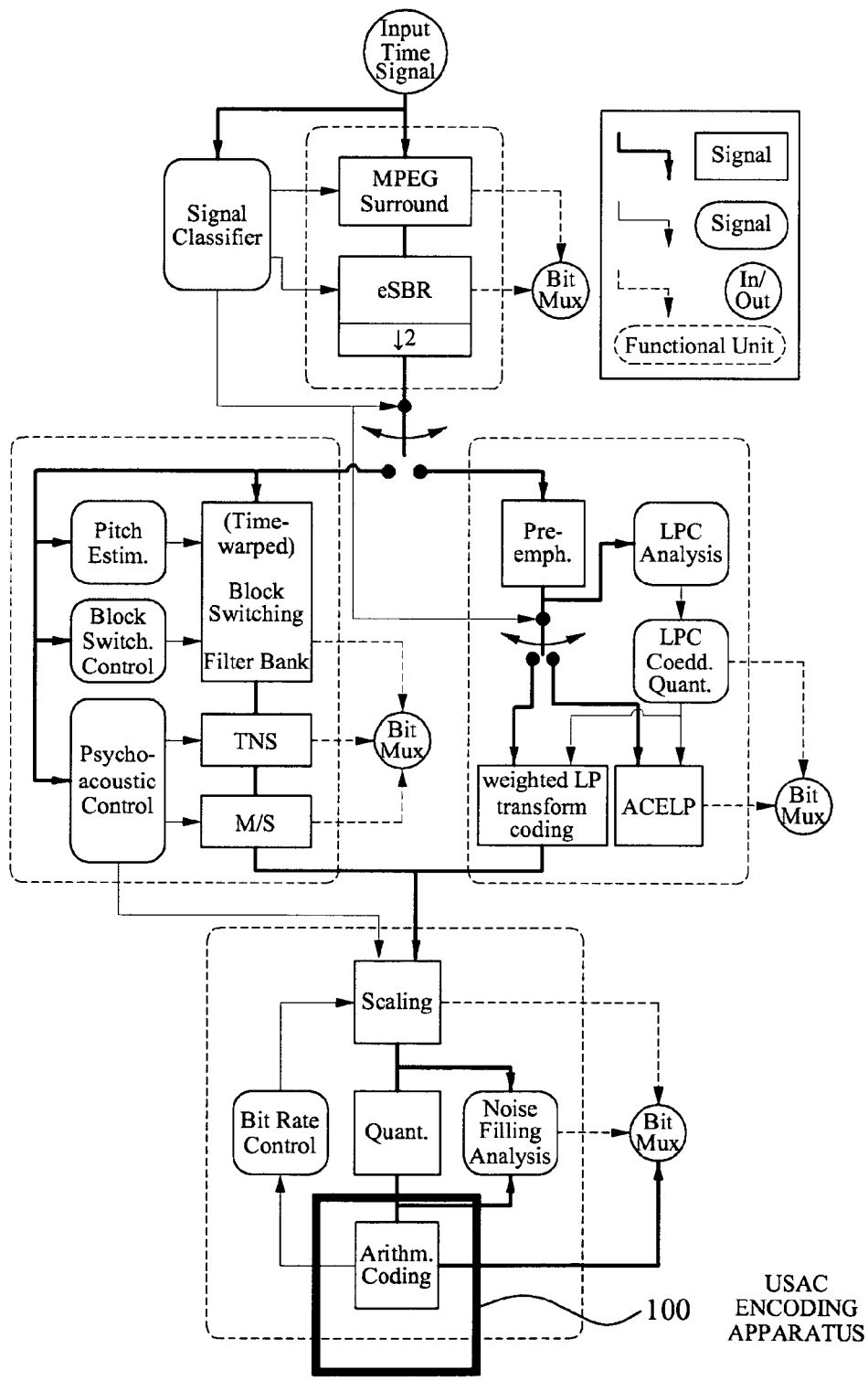
FIG. 1A illustrates a United Speech & Audio Coding (USAC) encoder.

Reference will now be made in detail to embodiments, examples of which are illustrated in the accompanying drawings, wherein like reference numerals refer to the like elements throughout. Embodiments are described below to explain the present disclosure by referring to the figures.

Figure 1B:
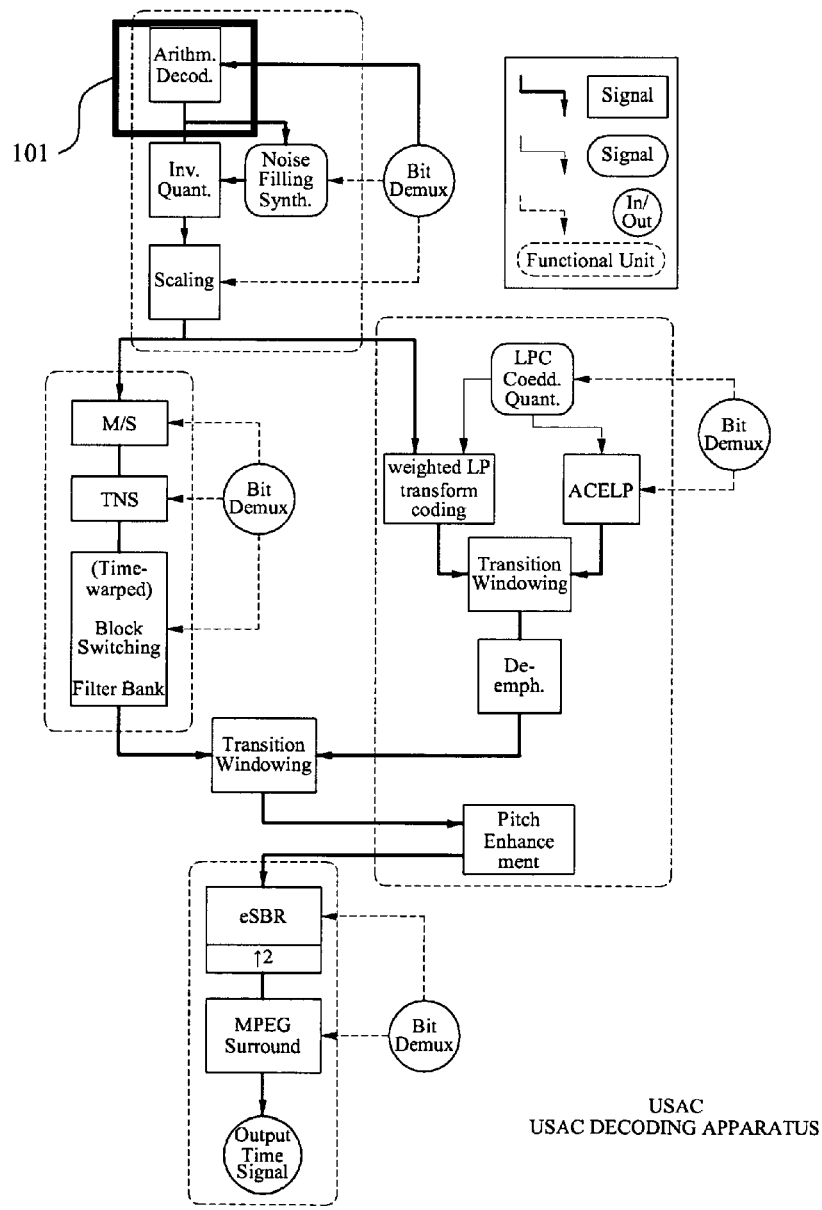
FIG. 1B illustrates a USAC decoder.

FIG. 1A illustrates a United Speech & Audio Coding (USAC) encoder, and FIG. 1B illustrates a USAC decoder.

A Moving Picture Experts Group (MPEG)-D USAC may briefly include three operation modes. First, in a stereo signal mode, a stereo signal may be expressed as a parameter using an MPEG surround, an enhanced Spectral Band Replication (eSBR) may be adopted in a high frequency band, and a core encoding scheme may be used in a low frequency band. Second, in a stereo signal mode, the eSBR may be adopted with respect to two channels in the high frequency band, and the core encoding scheme may be used in a low frequency band of the two channels may be given. Third, in a mono signal mode, the high frequency band may be encoded using the eSBR, and a low frequency signal may be encoded using the core encoding scheme.

The core encoding scheme include two kinds of modes. In a frequency domain (FD), a signal suitable for an encoder may be converted to a frequency domain using a Modified Discrete Cosine Transformation (MDCT), and an encoding may be performed on the converted signal, and an encoding may be performed on a signal unsuitable for the encoder, using a weighted LP transform coding (wLPT) scheme or an algebraic code excited linear prediction (ACELP) scheme. In a case of the wLPT scheme, a weighted LP signal may be converted to a frequency domain using an MDCT to perform an encoding on the converted signal. A quantization may be performed on the signals of two types of modes that are converted using the MDCT to thereby extract a quantized spectrum, and an arithmetic coding may be performed on the quantized spectrum to thereby perform a lossless encoding. A decoding may be the opposite of the encoding.

An USAC encoder and an USAC decoder in a low frequency band may select one of a FD coding mode and a Linear Prediction Domain (LPD) coding mode to perform an encoding or decoding on signals.

In this instance, with respect to the FD, the USAC encoder and the USAC decoder may perform a quantization or a noiseless coding on a spectrum in an MDCT domain. With respect to the LPD, the USAC encoder and the USAC decoder may selectively perform an encoding or decoding in accordance with an ACELP scheme or the wLPT scheme.

In this instance, the USAC encoder and the USAC decoder may perform an encoding and a decoding in accordance with the ACELP scheme through one of a Linear Prediction (LP), an adaptive codebook, and a fixed-codebook. The USAC encoder and the USAC decoder may convert a weighted LP residual signal to a frequency domain using an MDCT, and perform a quantization and a noiseless coding on the converted signal to perform an encoding and a decoding in accordance with the wLPT scheme.

In a high frequency band, the USAC encoder may perform an encoding on a high frequency signal using a parameter through the eSBR. Then, the USAC decoder may perform a decoding on the encoded signal, and generate a high frequency signal based on the decoded signal.

The USAC encoder may perform an encoding by expressing stereo information as a parameter using a Mpeg surround (MPS), and the USAC decoder may generate a stereo signal based on decoded information.

Embodiments, which will be described in detail, may relate to a noiseless coding performed in the USAC encoder and the USAC decoder, and more particularly, to a lossless encoding and decoding that is performed on spectrum data quantized by the FD scheme or the wLPT scheme. An arithmetic encoding apparatus 100 may perform a context-based arithmetic encoding in the USAC encoder, and an arithmetic decoding apparatus 101 may perform a context-based arithmetic decoding in the USAC decoder.

FIG. 2 illustrates a configuration of a first example of an arithmetic encoding apparatus 100 (first example) according to an embodiment, in detail.

The arithmetic encoding apparatus 100 includes a context reset unit 201, a context mapping unit 202, an N-tuple context determining unit 203, a Most Significant Bit (MSB) context determining unit 204, an escape code encoding unit 205, a probability mapping unit 206, an MSB encoding unit 207, a Least Significant Bit (LSB) encoding unit 208, and a context updating unit 209. Depending on embodiments, the escape code encoding unit 205 may be excluded.

Here, the context reset unit 201 and the context mapping unit 202 may be operated in a frame unit, and the N-tuple context determining unit 203 the MSB context determining unit 204, the escape code encoding unit 205, the probability mode mapping unit 206, the MSB encoding unit 207, and the LSB encoding unit 208 may be operated in a frequency unit in a frame. Specifically, the arithmetic encoding apparatus 100 may perform an encoding on an identical frame by increasing a frequency index.

When a current frame to be encoded is a reset frame, the context reset unit 201 may initialize a frequency spectrum of a previous frame as '0' When the current frame is not the reset frame, the context mapping unit 202 may align, in a case where a length of a frequency spectrum of the current frame is different from a length of the frequency spectrum of the previous frame, a length of the previous frame to be a length of the current frame.

The N-tuple context determining unit 203 may determine a context with respect to a current N-tuple 210 (4-tuple) to be encoded, using a quantized spectrum value of neighborhood N-tuples 211, 212, 213, and 214 neighboring the current N-tuple 210. The current N-tuple 210 may be encoded through the four neighborhood N-tuples 211, 212, 213, and the 214 having been encoded.

Here, the N-tuple may denote a set in which the quantized frequency spectrums are bundled in a unit of continuous N-numbered frequency spectrums, in a frequency-increasing order. Here, N may be not limited to a specific number, and may be changed based on a configuration of a system. The N-tuple may be configured of a set in which the quantized frequency spectrums are bundled in a unit of an arbitrary number 'N', and denote a number of the quantized frequency spectrums constituting the set. 'N' may be a positive integer. For example, the N-tuple may be used as a 4-tuple, that is, a set in which the quantized frequency spectrums are bundled in a unit of four frequency spectrums. According to an embodiment, a case where 'N' is 4 is described, however, N is not limited to a specific number. The N-tuple will be described further with reference to FIG. 4.

The N-tuple context determining unit 203 may perform a scaling down until a quantized spectrum value of each of the neighborhood N-tuples 212 and 214 with respect to the current N-tuple 210 is in a range of −4 to 3. Subsequently, the N-tuple context determining unit 203 may estimate a lev 0, that is, an initial LSB bit depth, based on a number of times the scaling down is performed. The level will be further described with respect to FIG. 4.

Also, the N-tuple context determining unit 203 may extract an MSB by performing the scaling down by the lev 0, and repeatedly perform the scaling down until the extracted MSB has a value ranging from −4 to 3.

The MSB context determining unit 204 may determine an MSB context from the neighborhood N-tuples 212 and 214 of the current N-tuple 210, with respect to an MSB to be encoded. Specifically, the MSB context determining unit 204 may determine, as the MSB context, both an MSB of the same frequency as that of a previous frame and an MSB of a previous frequency of a current frame, with respect to the MSB to be encoded.

The escape code encoding unit 205 may perform an encoding on an escape code using a probability model based on a context with respect to the current N-tuple 210.

The probability mapping unit 206 may map a final probability model using the context of the current N-tuple and the MSB context.

The MSB encoding unit 207 may sequentially perform an arithmetic encoding on an MSB of the current N-tuple 210 using the context of the current N-tuple 210 and the MSB context.

The LSB encoding unit 208 may perform an arithmetic encoding on an LSB in a bit unit up to a bit depth corresponding to the level.

The context updating unit 209 may update a quantized sample to encode a next N-tuple. Subsequently, the MSB context determining unit 204 may determine the MSB context using the updated quantized sample, with respect to the next N-tuple.

Figure 3:
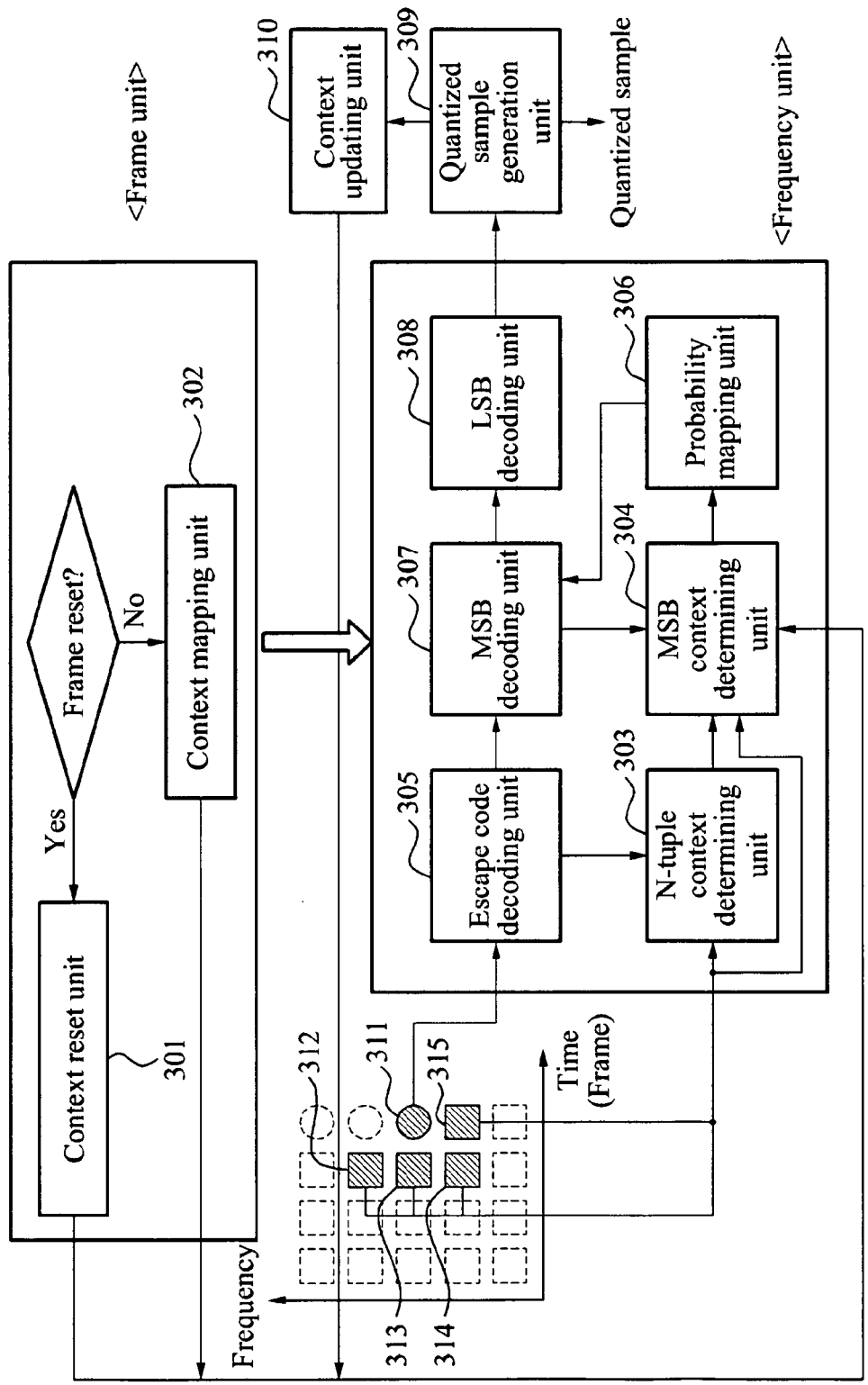
FIG. 3 illustrates a configuration of a first example of an arithmetic decoding apparatus according to an embodiment, in detail.

FIG. 3 illustrates a configuration of a first example of an arithmetic decoding apparatus 101 according to an embodiment, in detail.

The arithmetic decoding unit 101 includes a context reset unit 301, a context mapping unit 302, an N-tuple context determining unit 303, a context determining unit 304, an escape code decoding unit 305, a probability mapping unit 306, an MSB decoding unit 307, an LSB decoding unit 308, a quantized sample generation unit 309, and a context updating unit 310.

The context reset unit 301 and the context mapping unit 303 may be operated in a frame unit, and the N-tuple context determining unit 303, the MSB context determining unit 304, the escape code decoding unit 305, the probability mapping unit 306, the MSB decoding unit 307, the LSB decoding unit 308 may be operated in a frequency unit in a frame. Specifically, the arithmetic decoding apparatus 101 may perform a decoding on an identical frame by increasing a frequency index.

When a current frame to be decoded is a reset frame, the context reset unit 301 may initialize a frequency spectrum of a previous frame as '0'. When the current frame is not the reset frame, the context mapping unit 303 may align, in a case where a length of a frequency spectrum of the current frame is different from a length of the frequency spectrum of the previous frame, a length of the previous frame to be a length of the current frame.

The N-tuple context determining unit 203 may determine a context of a current N-tuple 311 (4-tuples) to be encoded, using a quantized spectrum value of neighborhood N-tuples 312, 313, 314, and 315 neighboring the current N-tuple 311. The current N-tuple 311 may be decoded through the four neighborhood N-tuples 312, 313, 314, and 315 having been decoded. The N-tuple will be further described with reference to FIG. 4.

The N-tuple context determining unit 303 may perform a scaling down until a quantized spectrum value of each of the neighborhood N-tuples 313 and 315 with respect to the current N-tuple 311 is in a range of −4 to 3. Subsequently, the N-tuple context determining unit 303 may estimate a lev 0, that is, an initial LSB bit depth, based on a number of times the scaling down is performed. The level will be further described with reference to FIG. 4.

The MSB context determining unit 304 may determine MSBs to be used as a context, based on the decoded MSB.

The escape code encoding unit 305 may perform a decoding on an escape code using a probability model based on the context determined in the N-tuple context determining unit 303. Also, the escape code decoding unit may perform the decoding on the escape code using a probability mode based on a context of a coding mode of core.

The probability mapping unit 306 may map a final probability model using the context of the current N-tuple 311 and an MSB context.

The MSB decoding unit 307 may sequentially perform an arithmetic encoding on an MSB of the current N-tuple 311 using the context of the current N-tuple 311 and the MSB context.

The LSB decoding unit 308 may perform an arithmetic encoding on an LSB in a bit unit up to a bit depth corresponding to the level.

The quantized sample generation unit 309 may generate a quantized sample of the current N-tuple using the arithmetically decoded MSB and LSB. The quantized sample generation unit 309 may left-shift up MSB values by the level, and provide LSB values to fit a bit depth.

The context updating unit 310 may update the quantized sample to decode a next N-tuple. Subsequently, the MSB context determining unit 304 may determine the MSB context using the updated quantized sample, with respect to the next N-tuple.

FIG. 4 is a diagram used for describing an N-tuple, an MSB, and an LSB according to an embodiment.

In an upper portion of FIG. 4, N-tuples are illustrated based on a time and a frequency. A current N-tuple 401 may denote N-tuples desired to be encoded or to be decoded. Four neighborhood N-tuples 402, 403, 404, and 405 are already encoded or decoded, and may be used when determining a context of the current N-tuple 401. In this instance, the neighborhood N-tuples 403, 404, and 405 may correspond to a previous frame, and the neighborhood N-tuple 402 may correspond to the same current frame as a frame of the current N-tuple 401.

In a lower portion of FIG. 4, MSBs and LSBs are illustrated based on a frequency index and a bit depth. In this instance, the MSBs may denote bits including sign information. According to an embodiment, the MSB may be denoted as being available 3 bits including the sign information. The definition of the MSB will be changed based on a configuration of a system.

Referring to FIG. 4, the LSB may denote a bit having a greater bit depth than that of the MSB. In this instance, the LSB may have a level value. The level value may be a value determined by a combination of the MSBs of contexts, and a bit depth of '0' may signify an LSB located immediately below the MSB. The N-tuple may correspond to the MSB, and may be divided into symbols in accordance with a frequency index. For example, in FIG. 4, the N-tuple may be configured of four symbols. Subsequently, the current N-tuple 401 may divide the four symbols according to a frequency to be encoded or decoded. In this instance, the tuple may correspond to the symbol. In FIG. 4, the four symbols included in the N-tuple are illustrated, however, a number of the symbols may be changeable.

Figure 5:
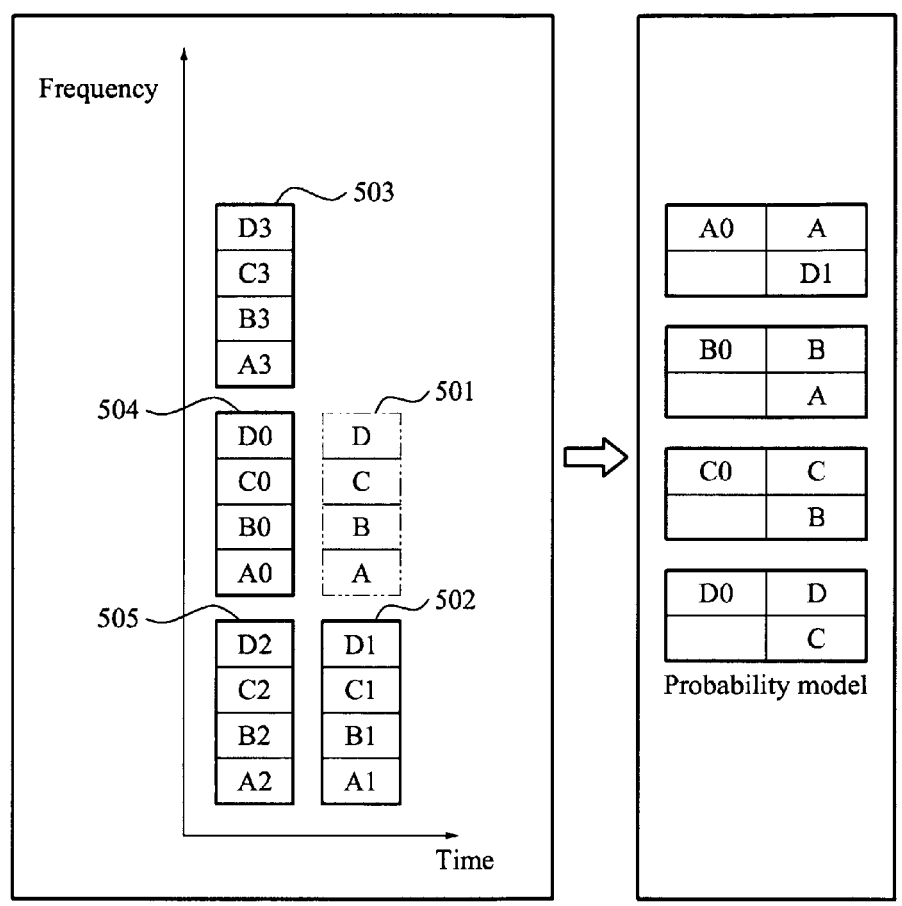
FIG. 5 illustrates a context and a probability model according to an embodiment.

FIG. 5 illustrates a context and a probability model according to an embodiment.

Referring to FIG. 5, a current N-tuple 501 including four symbols and four neighborhood N-tuples 502, 503, 504, and 505 are illustrated. The N-tuple context determining units 203 and 303 of FIGS. 2 and 3 may determine a context of the current N-tuple 501 using a quantized spectrum value of each of the neighborhood N-tuples 502, 503, 504, and 505 with respect to the current N-tuple 501.

The MSB context determining units 204 and 304 may determine, from the neighborhood N-tuples 502, 503, 504, and 505, a context corresponding to each of symbols A, B, C, and D constituting the current N-tuple 501. As described above, the symbol may denote an MSB. For example, the MSB context determining units 204 and 304 may determine, as the context, both a symbol of the same frequency as that of a previous frame and a symbol of a previous frequency of a current frame, with respect to the symbols constituting the current N-tuple 501. Specifically, the MSB context determining units 204 and 304 may determine, as the context, both an MSB of the same frequency as that of a previous frame and an MSB of a previous frequency of a current frame, with respect to an MSB intended to be encoded or decoded.

The probability mapping unit s 206 and 306 may map a final probability model using the context of the N-tuple and an MSB context. For example, to map a probability model for a symbol A (MSB A) of the current N-tuple 501, the probability mapping unit s 206 and 306 may map, as the probability model, the neighborhood N-tuples 502, 503, 504, and 505, that is, the context of the current N-tuple 501, an MSB AO of the neighborhood N-tuple 504, that is, a context of the MSB A, and an MSB D1 of the neighborhood N-tuple 502. A probability mode of each of A, B, C, and D of MSBs constituting the current N-tuple 501 is illustrated in FIG. 5.

In this instance, when an MSB corresponding to each of A, B, C, and D is upper 3-bits including sign information, eight kinds (−4, −3, −2, −1, 0, 1, 2, and 3) may be obtained as the MSB values. Subsequently, the probability mapping units 206 and 306 may assign a probability value to the eight MSB values in total. Specifically, the probability mapping units 206 and 306 may map the probability model under conditions of eight kinds of MSB values (AO, BO, CO, and DO) of the same frequency as that of a previous frame and of eight kinds of MSB values (D1, A, B, and C) of a previous frequency of a current frame. Subsequently, a probability table may be prob[8][8][8]. This probability table may be prob[64][8].

For example, a probability model may be selected as prob[−4+4] [−3+4] when an MSB value of the same frequency as that of the previous frame is −4 and an MSB value of the previous frequency of the current frame is −3. Specifically, the selected probability model may be configured of p={p(−4), p(−3), p(−2), p(−1), p(0), p(1), p(2), p(3)}. Thus, a final probability table for the current N-tuple 501 may be configured of prob[32] [64*8]. In this instance, the probability mapping unit s 206 and 306 may configure a probability table corresponding to each mode information based on mode information of FD or wLPT(TCX).

Also, the probability mapping unit s 206 and 306 may use a probability model mapping table to improve a use efficiency of a memory when the same value among the probability models is overlapped. The probability model mapping table may denote as separately expressing an index. For example, the probability model mapping table may be expressed as an unsigned shotr map[2048], an unsigned short prob[748][8], and the like. Specifically, a number of conditions where the above described expression of the probability model mapping table is generated is 2048, and a total number of the probability models is 748. Consequently, the unsigned short[32][64*8] may be 32*64*8*0.5=8192 word, and 2048*0.5+748*0.5=4016 word is obtained when using the probability model mapping table, thereby reducing the memory.

Figure 6:
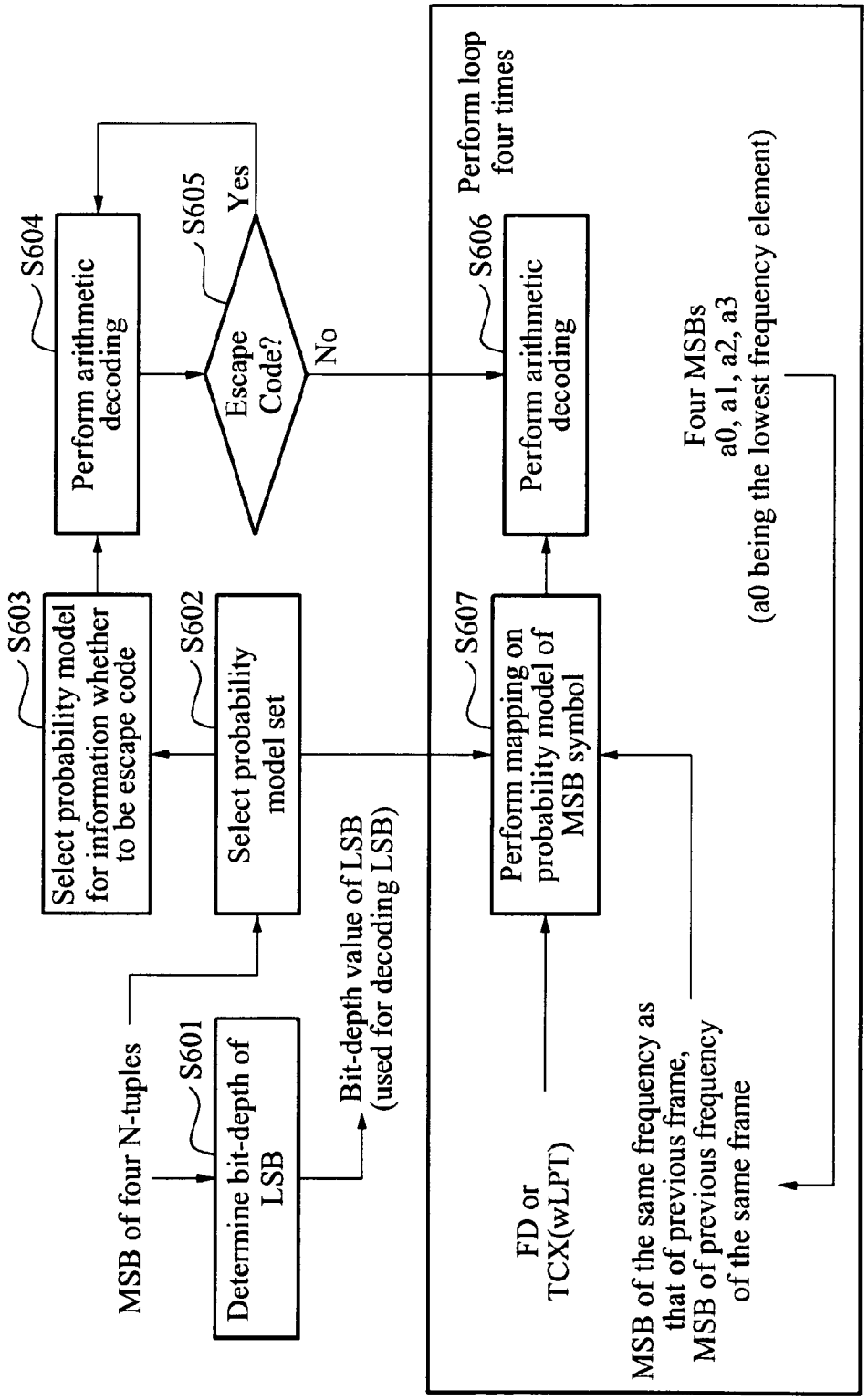
FIG. 6 is a flowchart illustrating a first example of an MSB decoding method according to an embodiment.

FIG. 6 is a flowchart illustrating an MSB decoding method (first example) according to an embodiment.

In operation S601, the arithmetic decoding apparatus 101 may determine a bit depth of an LSB using four MSBs included in a current N-tuple. The bit depth of the LSB may be used when performing a decoding on the LSB. In operation S602, the arithmetic decoding apparatus 101 may select a probability model set with respect to the four MSBs. In operation S603, the arithmetic decoding apparatus 101 may select a probability model about whether an MSB to be decoded is an escape code, and perform the arithmetic decoding on the MSB. In operation S605, the arithmetic decoding apparatus 101 may perform a decoding on whether the MSB is the escape code, using a table of ari_pk_mod_e sc[32][2]. When the arithmetic decoding is in the escape code, the arithmetic decoding apparatus 101 may return to operation 604, and otherwise, the arithmetic decoding apparatus 101 may perform operation S606.

In operation S607, in a case of an FD mode or a TCX (wLPT) mode, the arithmetic decoding apparatus 101 may map a probability model of an MSB symbol using both an MSB of the same frequency as that of a previous frame and an MSB of a previous frequency of the same frame. In operation S606, the arithmetic decoding apparatus 101 may perform an arithmetic decoding on the four MSBs included in the current N-tuple based on a result of the mapped probability model.

Figure 7:
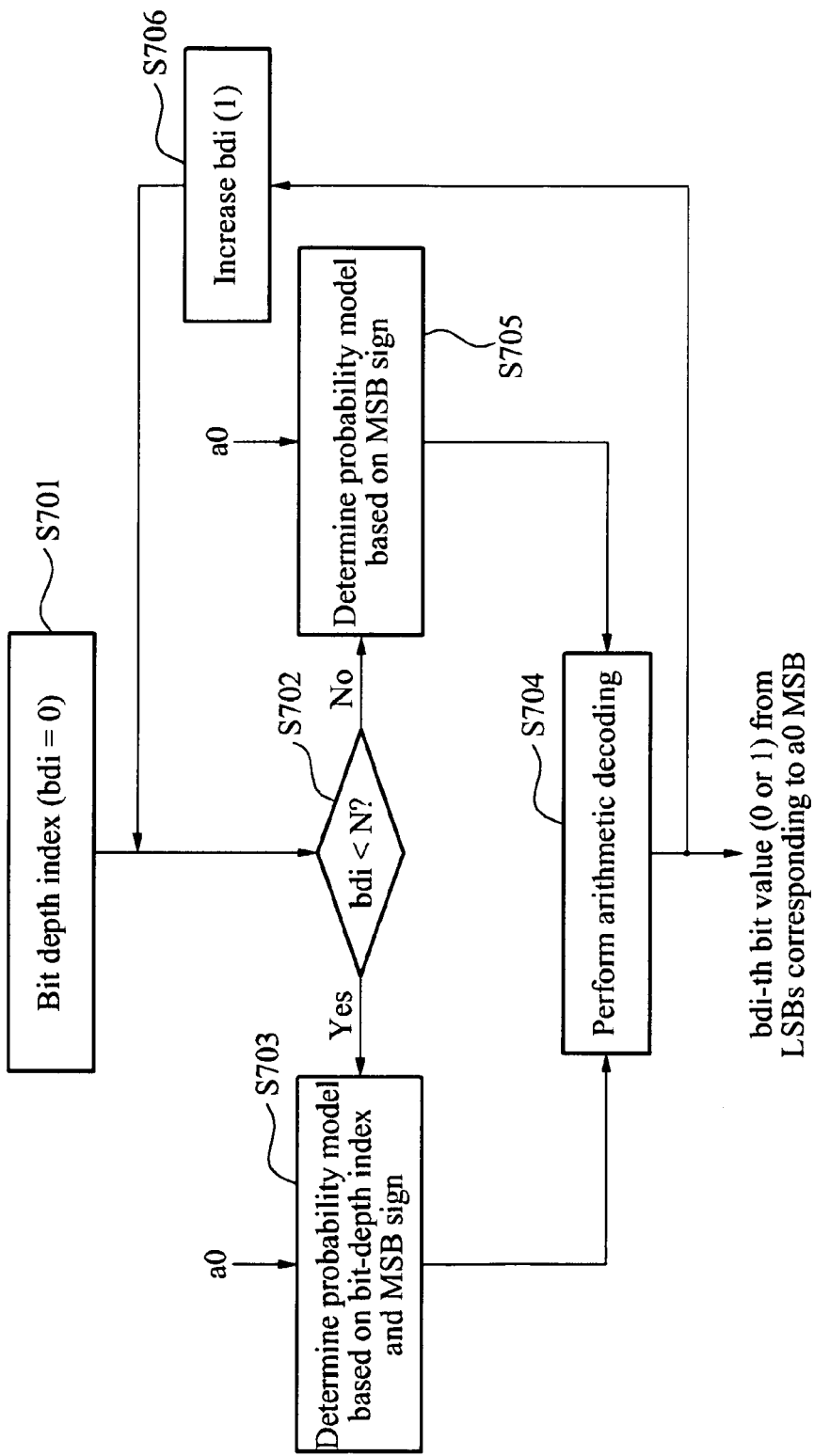
FIG. 7 is a flowchart illustrating a first example of an LSB decoding method according to an embodiment.

FIG. 7 is a flowchart illustrating an LSB decoding method (first example) according to an embodiment.

In operation S701, the arithmetic decoding apparatus 101 may set a bit depth index (bid) derived from the decoding of the MSB. In operation S702, the arithmetic decoding apparatus 101 may determine whether the bit depth index is less than 'N', that is, a level of an LSB. In operation S703, when the bit depth index is less than 'N', the arithmetic decoding apparatus 101 may determine a probability model based on the bit depth index and a sign of the MSB. In operation S705, when the bit depth index is greater than 'N', the arithmetic decoding apparatus 101 may determine a probability model based on the sign of the MSB. Next, in operation S704, the arithmetic decoding apparatus 101 may perform an arithmetic decoding in a bit unit of the LSB, and output a bit value (1 or 0) corresponding to the bit depth index among LSBs corresponding to the MSB. In this instance, the arithmetic decoding apparatus 101 may classify an MSB having been already encoded or decoded as being '0', a positive value, and a negative value, and perform the arithmetic decoding on the classified MSBs.

For example, the arithmetic decoding apparatus 101 may use bit depth information as a context when the bit depth is less than N(5), and otherwise, the arithmetic decoding apparatus 101 may classify only three cases when the MSB is '0', the positive value, and the negative value. The arithmetic decoding apparatus 101 may increase the bit depth index by 1 unit after performing the arithmetic decoding, so that an LSB corresponding to the next bit depth may be arithmetically decoded.

Figure 8:
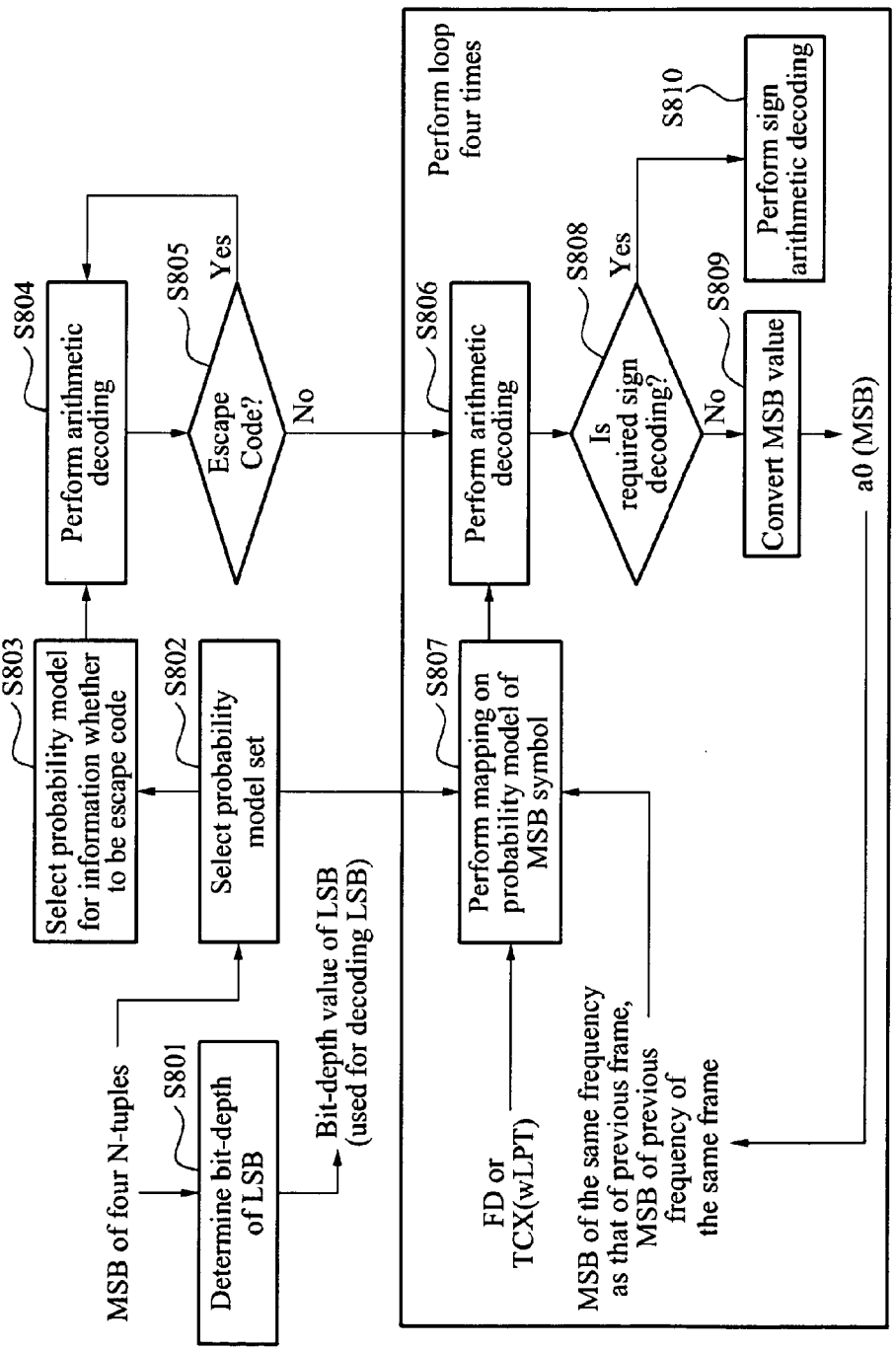
FIG. 8 is a flowchart illustrating an MSB decoding method using a sign classification according to an embodiment.

FIG. 8 is a flowchart illustrating an MSB decoding method using a sign classification according to an embodiment.

The sign classification may denote that only an expression scheme with respect to a symbol of an MSB is changed. Operations S801 to S805 of FIG. 8 may correspond to operations S601 to S606 of FIG. 6.

In operation S806, when an MSB to be decoded in operation S805 is an escape code, the arithmetic decoding apparatus 101 may perform a magnitude arithmetic decoding. In this instance, in operation S808, the arithmetic encoding apparatus 100 may determine whether a decoding is needed to be performed on a sign of the MSB. In operation S810, when the decoding is needed to be performed on the sign of the MSB, the arithmetic encoding apparatus 100 may perform the decoding on the sign of the MSB. In operation S809, when the decoding is not needed to be performed on the sign of the MSB, the arithmetic encoding apparatus 100 may convert the sign to an MSB value. For example, −4 and 0 are fixed values, and thereby there is no need to perform a decoding on a sign of each of −4 and O. The converted MSB value may be used when mapping a probability model of an MSB symbol in operation S807. Referring to FIG. 8, an MSB magnitude of the same frequency index may be first decoded, a decoding may be performed on a sign of the MSB magnitude, and then an encoding of a next frequency index may be performed.

When performing the decoding on the MSB, a context may be used in the same manner as the above, or a changed symbol may be used. Specifically, the arithmetic decoding apparatus 101 may use both an MSB of the same frequency as that of a previous frame and an MSB of a previous frequency of a current frame when decoding an MSB of current frame. In this instance, a magnitude of a probability model may be [32] [8] [8] [5], and a sign of the probability model may indicate [32][8][8][2]. The arithmetic decoding apparatus 101 may use the changed symbol, and a magnitude of a probability model of the changed symbol may be [32] [5] [5] [5], and a sign of the probability model of the changed symbol may indicate [32][5][5][2]•

Figure 9:
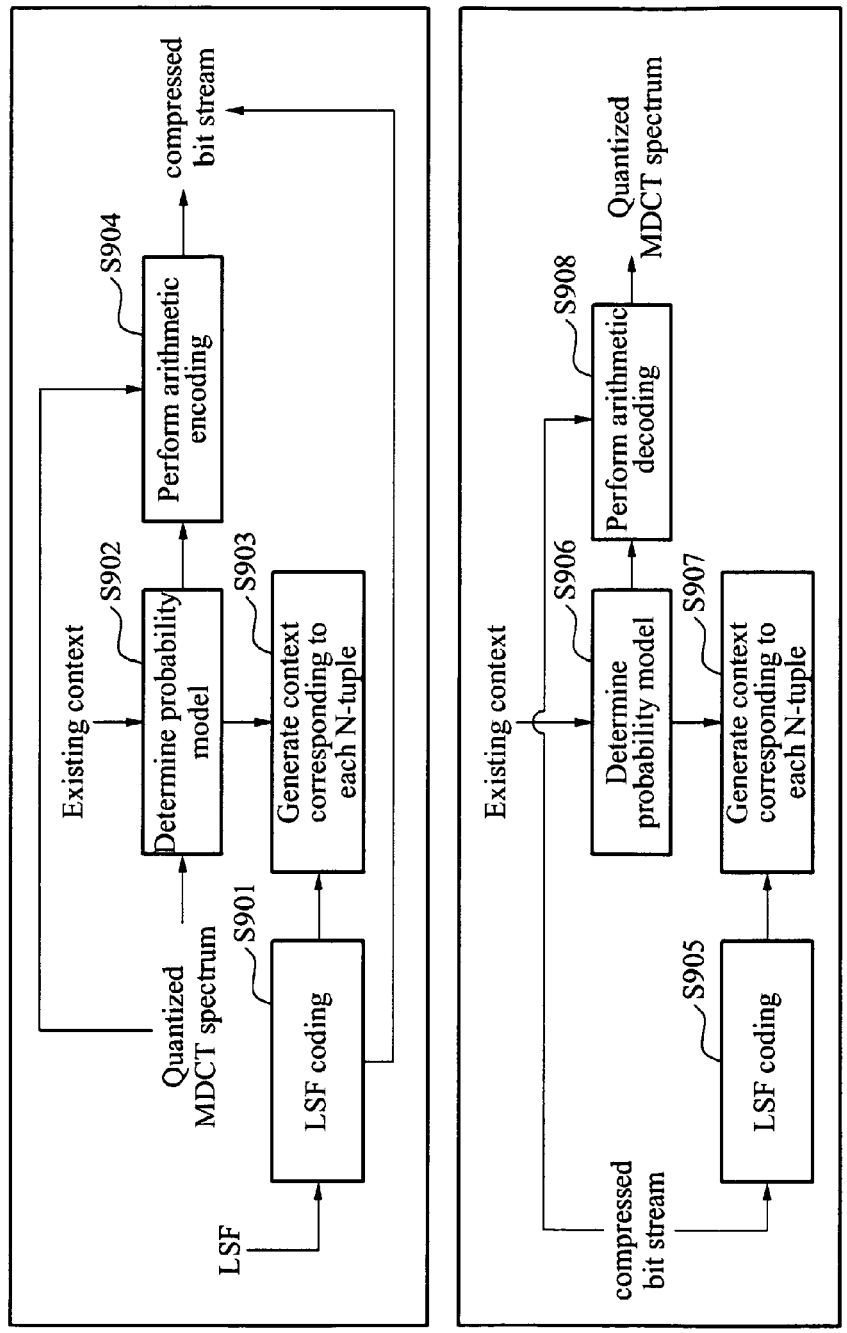
FIG. 9 is a flowchart illustrating each of an encoding method and a decoding method using a Line Spectral Frequency (LSF) according to an embodiment.

FIG. 9 is a flowchart illustrating each of an encoding method and a decoding method using a Line Spectral Frequency (LSF) according to an embodiment.

IN a wLPT mode, a context may be determined additionally using a Linear Predictive Coding (LPC) information. In this instance, an LPC coefficient may be converted to an LSF that is effective for being quantized. A difference between the LSFs may greatly related to a spectrum peak, and the spectrum peak may be generated when an interval between the LSFs is relatively less. Also, when the interval between the LSFs is less, a probability where a spectrum envelop is high even after an LP filtering may be relatively high, and thus an MSB of a quantized sample may be relatively great.

The flowchart of an MSB encoding method is illustrated in an upper portion of FIG. 9, and the flowchart of an MSB decoding method is illustrated in a lower portion of FIG. 9.

In operation S901, the arithmetic encoding apparatus 100 may perform an LSF encoding. In operation S902, the arithmetic encoding apparatus 100 may generate a context corresponding to an N-tuple, using a quantized LSB derived from the encoding of the LSF. In operation S903, the arithmetic encoding apparatus 100 may determine a probability model using both a quantized MDCT spectrum and an existing context. In operation S904, the arithmetic encoding apparatus 100 may perform an arithmetic encoding on an MSB. The arithmetically encoded MSB and the quantized LSF may be included in a bit stream.

In operation S905, the arithmetic decoding apparatus 101 may perform an LSG encoding from a compressed bit stream. In operation S907, the arithmetic decoding apparatus 101 may generate a context corresponding to an N-tuple, using the quantized LSF derived from the encoding of the LSF.

The arithmetic decoding apparatus 101 may determine a probability model using both the quantized MDCT spectrum and an existing context in operation S906, and perform an arithmetic decoding on an MSB in operation S904.

When the context is determined using the LSF, a structure of a current bit stream may be needed to be changed. Specifically, when the structure of the current bit stream is configured in an order of acelp_core_mode, Ipd_mode, ACELP or TCX data, and LPC data, the changed structure of the bit stream may be configured in an order of acelp_core_mode, Ipd_mode, LPC data, and ACELP or TCX data.

Figure 10:
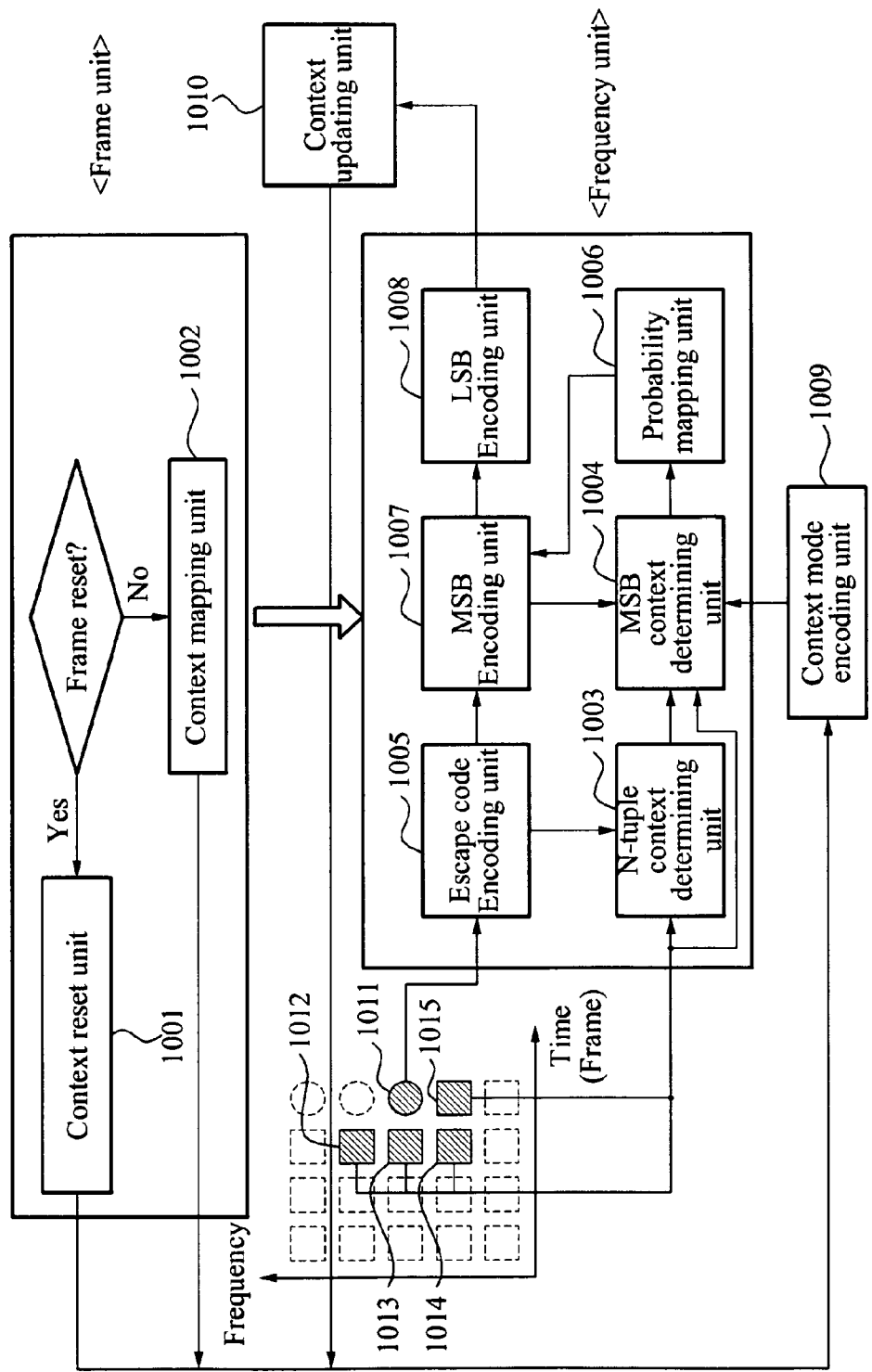
FIG. 10 illustrates a configuration of a second example of an arithmetic encoding apparatus according to an embodiment, in detail.

FIG. 10 illustrates a configuration of a second example of an arithmetic encoding apparatus 100 according to an embodiment, in detail.

The arithmetic encoding apparatus 100 includes a context reset unit 1001, a context mapping unit 1002, an N-tuple context determining unit 1003, an MSB context determining unit 1004, an escape code encoding unit 1005, a probability mapping unit 1006, an MSB encoding unit 1007, an LSB encoding unit 1008, a context mode encoding unit 1009, and a context updating unit 1010.

The arithmetic encoding apparatus 100 of FIG. 10 may further include a context mode encoding unit 1009 in comparison with the arithmetic encoding apparatus 100 of FIG. 2.

When a current frame to be encoded is not a reset frame, the context mapping unit 1002 may align, in a case where a length of a frequency spectrum of the current frame is different from a length of the frequency spectrum of the previous frame, a length of the previous frame to be a length of the current frame.

Also, the context mapping unit 1002 may additionally map encoded MSBs of the previous frame.

The N-tuple context determining unit 1003 may determine a context with respect to a current N-tuple 1011 (4-tuple) to be encoded, using a quantized spectrum value of neighborhood N-tuples 1012, 1013, 1014, and 1015 neighboring the current N-tuple 1011.

The current N-tuple 1011 may be encoded through the four neighborhood N-tuples 1012, 1013, 1014, and 1015 having been encoded.

The N-tuple context determining unit 1003 may perform a scaling down until a quantized spectrum value of each of the neighborhood N-tuples 212 and 214 with respect to the current N-tuple 1011 is in a range of −4 to 3. Subsequently, the N-tuple context determining unit 1003 may estimate a lev 0 based on a number of times the scaling down is performed. Also, the N-tuple context determining unit 1003 may extract an MSB by performing the scaling down by the lev 0, and repeatedly perform the scaling down until the extracted MSB has a value ranging from −4 to 3. A number of times the scaling down is additionally performed may determine a number of times an encoding is performed on the escape code.

The MSB context determining unit 1004 may determine an MSB context from the neighborhood N-tuples 1013 and 1015 of the current N-tuple 1011, with respect to an MSB desired to be encoded. Specifically, the MSB context determining unit 1004 may determine, as the MSB context, both an MSB of the same frequency as that of a previous frame and an MSB of a previous frequency of a current frame, with respect to the MSB desired to be encoded.

Here, the context mode encoding unit 1009 may perform an encoding on a single context mode finally transmitted among a plurality of contexts to be used when performing the encoding on the MSB. The plurality of contexts may denote MSBs neighboring a symbol to be decoded. The context mode may be transmitted by a bit-packing scheme, and transmitted by an arithmetic encoding scheme. The transmission of the context mode may be performed once for each frame. The context mode encoding unit 1009 may perform the bit packing scheme by assigning a bit expressing a candidate number. The context mode encoding unit 1009 will be further described with reference to FIG. 16.

The MSB context determining unit 1004 may select an appropriate MSB context in accordance with a context mode.

The escape code encoding unit 1005 may perform an encoding on an escape code using a probability model based on a context of the current N-tuple 1010. Specifically, the escape code encoding unit 1005 may perform an arithmetic encoding on whether an MSB to be decoded is the escape code, and perform the arithmetic encoding on an MSB when the MSB to be decoded is not the escape code. As the context used when performing the encoding on the escape code, the context of the N-tuple and a core coding mode (FD or wLPD). When the MSB to be decoded is the escape code, the MSB may be encoded to be 1, and when the MSB to be decoded is not escape code, the MSB may be encoded to be 0. When the encoding is performed on the MSB using the escape code, a bit depth 'level' of an LSB may be updated by increasing a value of lev 0 by +2 unit.

The probability mapping unit 1006 may map a final probability model using the context of the current N-tuple 1011 and the MSB context. The probability mapping unit 1006 may use a mapping table and a probability table. A process of mapping the probability model may be a process of obtaining, from the probability table, a probability model to be applied when performing a decoding on the MSB. Specifically, when there exist probability models for all cases, a burden for a size of a memory may be reduced. Thus, to reduce the size of the memory, the probability mapping unit 1006 may use the mapping table to obtain a probability model depending on the context. The mapping table may be configured by assigning an index of the probability table to a total arrangement corresponding to a context of each probability. The probability table may be configured of all probability values used when performing the decoding on the MSB.

The MSB encoding unit 1007 may sequentially perform an arithmetic encoding on an MSB of the current N-tuple, using the context of the current N-tuple 1010 and the MSB context.

The LSB encoding unit 1008 may perform an arithmetic encoding on an LSB in a bit unit up to a bit depth corresponding to the level. The encoding of the LSB may be performed in the bit unit, and the LSB encoding unit 1008 may perform the arithmetic encoding on the LSB using, as a context, bit depth information signifying a distance from an MSB and sign information (positive number, negative number, and zero) of the MSB.

The context updating unit 1010 may update a quantized sample to perform an encoding on the next N-tuple. Subsequently, the MSB context determining unit 1004 may determine the MSB context using the updated quantized sample with respect to the N-tuple.

Figure 11:
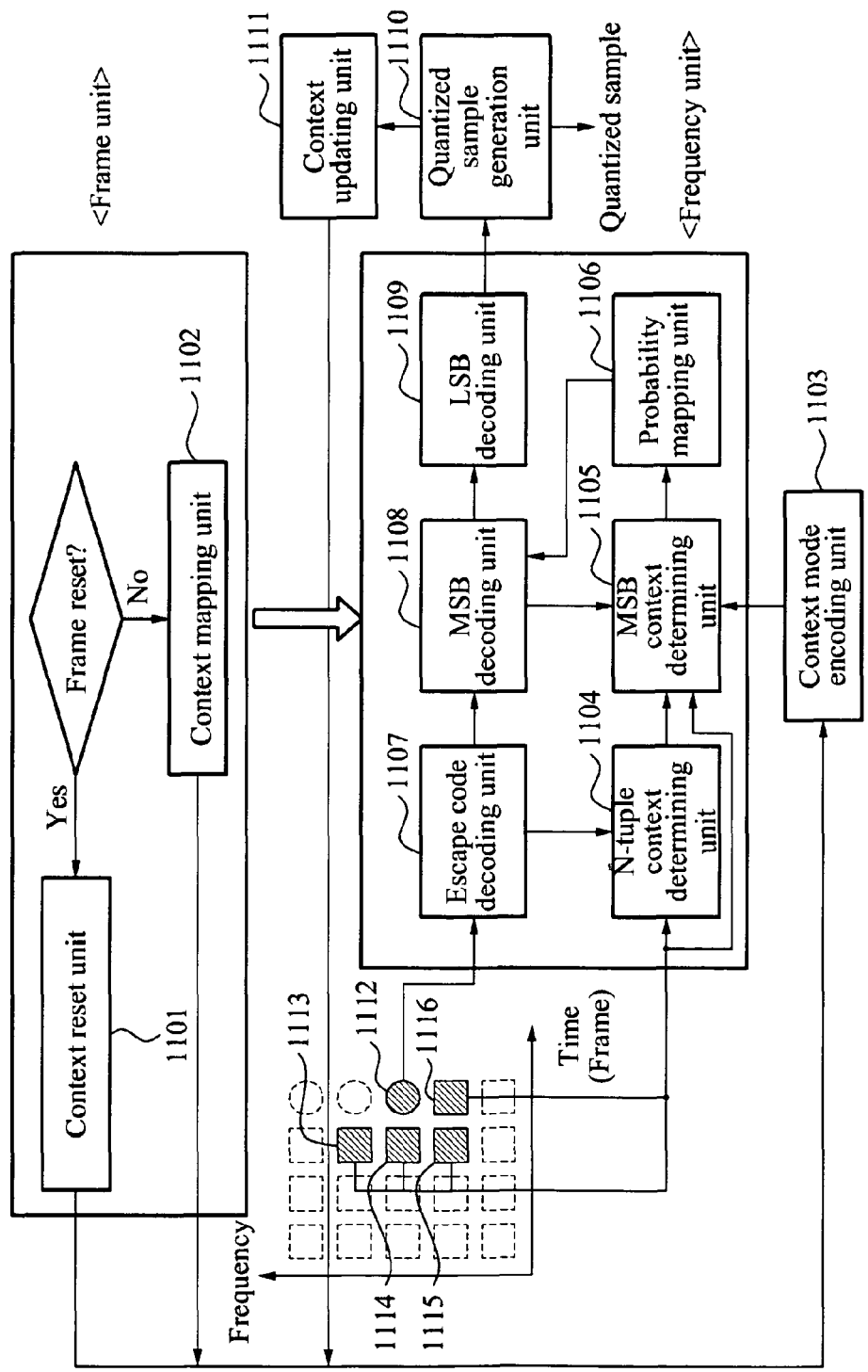
FIG. 11 illustrates a configuration of a second example of an arithmetic decoding apparatus according to an embodiment, in detail.

FIG. 11 illustrates a configuration of a second example of an arithmetic decoding apparatus according to an embodiment, in detail.

The arithmetic decoding apparatus 101 includes a context reset unit 1101, a context mapping unit 1102, a context mode decoding unit 1103, an N-tuple context determining unit 1104, an MSB context determining unit 1105, an escape code decoding unit 1106, a probability mapping unit 1107, an MSB decoding unit 1108, an LSB decoding unit 1109, a quantized sample generation unit 1110, and a context updating unit 1111. The arithmetic decoding apparatus 101 of FIG. 11 may further include the context mode decoding unit 1103 in comparison with the arithmetic decoding apparatus 101 of FIG. 3.

The arithmetic decoding apparatus 101 of FIG. 2 or 11 may divide MSBs and LSBs to perform a decoding. Specifically, the arithmetic decoding apparatus 101 may decode only the MSBs, or decode both the MSBs and LSBs.

When a current frame to be decoded is not a reset frame, the context mapping unit 1102 may align, in a case where a length of a frequency spectrum of the current frame is different from a length of the frequency spectrum of the previous frame, a length of the previous frame to be a length of the current frame. Also, the context mapping unit 1102 may further perform a mapping on decoded MSB values of the previous frame. Specifically, the context mapping unit 1102 may receive candidates of various combinations of the MSB context to perform a decoding on the received candidates, and select a context mode where a bit rate of the decoded results is the smallest to thereby perform a decoding on the selected context mode.

The context mode decoding unit 1103 may perform a decoding on a single context mode finally transmitted from among a plurality of contexts used when performing the MSB. The plurality of contexts may denote MSBs neighboring a symbol to be decoded. The context mode may be transmitted by a bit packing scheme, or transmitted by performing an arithmetic decoding. The transmission of the context mode may be performed once for each frame. The context mode decoding unit 1103 may perform the bit packing scheme by assigning a bit expressing a candidate number. The context mode decoding unit 1103 will be further described with reference to FIG. 16. Subsequently, the MSB context determining unit 1104 may select an appropriate MSB context in accordance with a context mode.

The N-tuple context determining unit 1104 may determine a context with respect to a current N-tuple 1112 to be decoded, using a quantized spectrum value of neighboring N-tuples (4-tuples) 1113, 1114, 1115, and 1116 neighboring the current N-tuple 1112. The current N-tuple 1112 may be decoded through the neighboring N-tuples 1113, 1114, 1115, and 1116 already decoded.

The N-tuple context determining unit 1104 may perform a scaling down until a quantized spectrum value of each of the neighborhood N-tuples 1114 and 1116 is in a range of −4 to 3. Subsequently, the N-tuple context determining unit 1104 may estimate a lev 0 based on a number of times the scaling down is performed.

The MSB context determining unit 1105 may determine an MSB context from the neighborhood N-tuples 1114 and 1116 of the current N-tuple 1112, with respect to an MSB to be decoded. Specifically, the MSB context determining unit 1105 may determine, as the MSB context, both an MSB of the same frequency as that of a previous frame and an MSB of a previous frequency of a current frame, with respect to the MSB to be decoded.

The probability mapping unit 1106 may map a final probability model using the context of the current N-tuple 1112 and the MSB context. The probability mapping unit 1106 may use a mapping table and a probability table. A process of mapping the probability model may be a process of obtaining, from the probability table, a probability model to be applicable when performing the MSB. Specifically, when there exist probability models for all cases, a burden for a size of a memory may be reduced. Thus, to reduce the size of the memory, the probability mapping unit 1106 may use the mapping table to obtain a probability model depending on the context. The mapping table may be configured by assigning an index of the probability table to a total arrangement corresponding to a context of each probability. The probability table may be configured of all probability values used when performing the decoding on the MSB.

The escape code decoding unit 1107 may perform a decoding on an escape code using a probability model based on the context of the current N-tuple 1112. Specifically, the escape code encoding unit 1107 may perform an arithmetic decoding on whether an MSB to be decoded is the escape code, and perform the arithmetic decoding on an MSB when the MSB to be decoded is not the escape code. As the context used when performing the decoding on the escape code, the context of the N-tuple and a core coding mode (FD or wLPD). When the MSB to be decoded is the escape code, the MSB may be decoded to be 1, and when the MSB to be decoded is not escape code, the MSB may be decoded to be 0. When the decoding is performed on the MSB using the escape code, a bit depth 'level' of an LSB may be updated by increasing a value of lev 0 by +2 unit.

The MSB decoding unit 1108 may sequentially perform an arithmetic decoding on an MSB of the current N-tuple, using the context of the current N-tuple 1112 and the MSB context.

The N-tuple according to an embodiment may denote a set configured of a plurality of quantized frequency spectrums. The arithmetic decoding apparatus 101 may divide the set of the plurality of quantized frequency spectrums, into MSBs and LSBs each including a sign bit.

Subsequently, the N-tuple context determining unit 1104 may determine a first context (N-tuple context) using a quantized frequency spectrum value of a set (neighborhood N-tuples) neighboring a set (current N-tuple) to be currently decoded.

The escape code decoding unit 1107 may estimate a bit depth of the LSB based on the set (neighborhood N-tuples) neighboring the set (current N-tuple) to be currently decoded. The escape code decoding unit 1107 may perform, using a decoding mode as a context, a decode on a symbol expressing whether the MSB to be decoded is the escape code. Subsequently, the escape code decoding unit 1107 may update the estimated bit depth of the LSB based on a number of times the escape code is decoded.

The MSB context determining unit 1105 may determine a second context (MSB context) using a decoded MSB symbol neighboring an MSB symbol (MSB symbol of the current N-tuple) to be currently decoded. In this instance, the context mode decoding unit 1103 may perform a decoding on relative position information (context mode) of the MSB symbol (MSB symbol of the current N-tuple) to be currently decoded, with respect to the decoded MSB symbol used as the context. Subsequently, the MSB context determining unit 1105 may generate the second context using the relative position information. In this instance, the relative position information may be decoded through an arithmetic decoding, using a core decoding mode as a context. Alternatively, the relative position information may be expressed as a value corresponding to the second context to be used when performing a decoding on the MSB symbol (MSB symbol of the current N-tuple) in a plurality of frequency bands.

Consequently, the MSB decoding unit 1108 may decode an MSB using the generated first context and the generated second context.

The LSB decoding unit 1109 may perform an arithmetic decoding on the LSB in a bit unit up to a bit depth corresponding to the level. The decoding of the LSB may be processed in a bit, and the LSB decoding unit 1109 may perform the arithmetic decoding on the LSB using bit-depth information signifying a distance from the MSB and using decoding information (positive number/negative number/0) of the MSB as a context.

As described above, the arithmetic decoding apparatus 101 may divide the LSB decoding unit 1109 and the MSB decoding unit 1108 to perform the decoding. In this instance, the LSB decoding unit 1109 may generate a third context using sign information of the MSB. The LSB decoding unit 1109 may generate a fourth context using bit depth information of the LSB. Subsequently, the LSB decoding unit 1109 may perform a decoding the LSB in a bit unit using the generated third context and the generated fourth context.

For example, when using the third context, the LSB decoding unit 1109 may perform the decoding on the LSB based on information indicating whether a sign of an MSB symbol corresponding to the same frequency position as that of the LSB is a positive number, a negative number, or zero. The LSB decoding unit 1109 may perform the decoding on the LSB using only the fourth context.

The quantized sample generation unit 1110 may generate a quantized sample with respect to the current N-tuple 1112 using the arithmetically decoded MSB and LSB.

The context updating unit 1111 may update the quantized sample to perform a decoding on the next N-tuple. Also, the decoded MSB may be updated.

Figure 12:
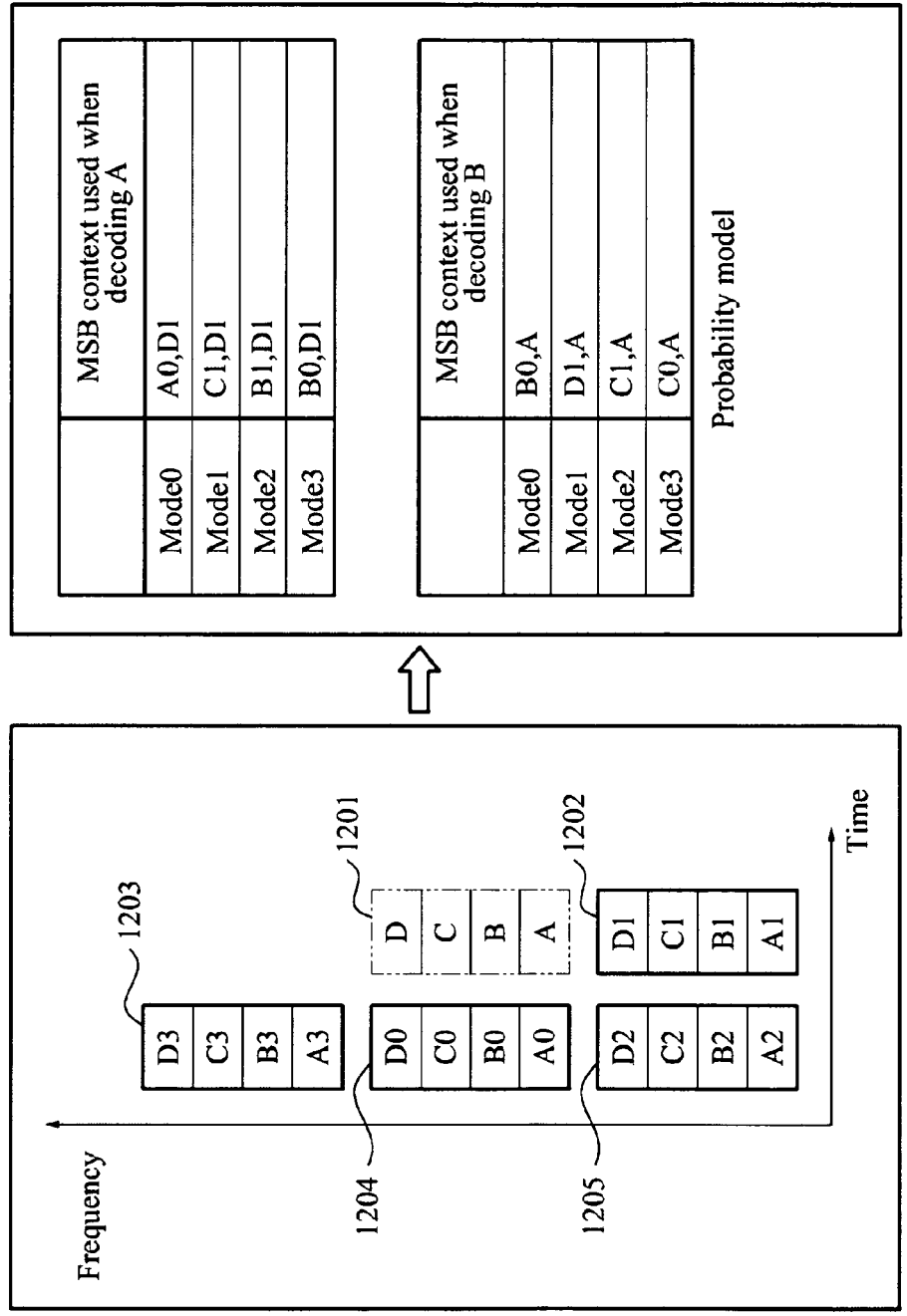
FIG. 12 illustrates a context and a probability model according to another embodiment.

FIG. 12 illustrates a context and a probability model according to another embodiment.

Referring to FIG. 12, a current N-tuple 1201 including four symbols and neighborhood N-tuples 1202, 1203, 1204, and 1205 are illustrated.

The N-tuple context determining unit 1103 or 1204 may determine, as a context of the current N-tuple 1201, a quantized spectrum value of the neighboring N-tuples 1202, 1203, 1204, and 1205, with respect to the current N-tuple 1201.

The MSB context determining unit 1103 or 1204 may determine, from the neighborhood N-tuples 1202, 1203, 1204, and 1205, contexts corresponding to each of symbols A, B, C, and D constituting the current N-tuple 120, based on context mode information.

As described above, the symbol may denote an MSB. For example, the MSB context determining unit 1103 or 1204 may determine, as a context, both a symbol of the same frequency as that of a previous frame and a symbol of a previous frequency of a current frame, with respect to the symbols constituting the current N-tuple 1201. Specifically, the MSB context determining unit 1103 or 1204 may determine, as the context, both an MSB of the same frequency as that of the previous frame and an MSB of the previous frequency and the current frame, with respect to an MS to be decoded.

The probability mapping unit 1106 or 1206 may map a final probability model using an MSB context and a context of the N-tuple in accordance with a context mode. For example, to map a probability model with respect to a symbol A (MSB A) of the current N-tuple 1201, the probability mapping unit s 1106 and 1206 may map, as the probability model, the neighborhood N-tuples 1202, 1203, 1204, and 1205, that is, the context of the current N-tuple 1201, an MSB of the neighborhood N-tuple 1204, that is, a context of the MSB A, and an MSB of the neighborhood N-tuple 1202, in accordance with a context mode (Mode 0, Mode 1, Mode 2, and Mode 3). A probability mode of each of A, B, C, and D of MSBs constituting the current N-tuple 1201 is illustrated in FIG. 12. A context of the MSB B of the current N-tuple 1201 may map, as the probability model, an MSB of the neighborhood N-tuple 1204 and an MSB of the neighborhood N-tuple 1202 in accordance with the context mode. In FIG. 12, the context of the current MSB may be differentially determined in accordance with the context mode in comparison with in FIG. 5.

Figure 13:
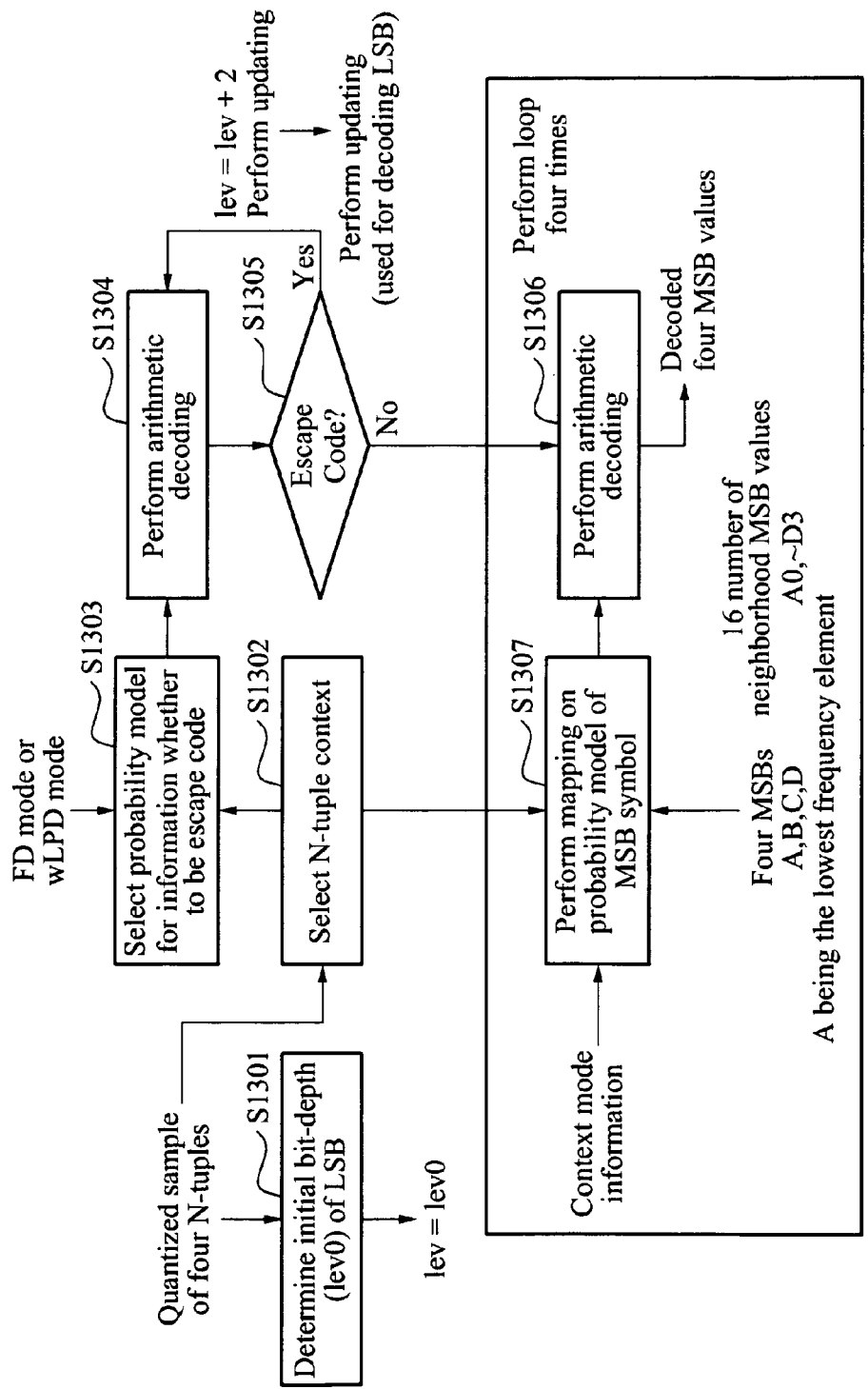
FIG. 13 illustrates a second example of an MSB decoding method according to an embodiment.

FIG. 13 illustrates a second example of an MSB decoding method according to an embodiment.

In operation 1301, the arithmetic decoding apparatus 101 may determine a lev 0, that is, an initial bit depth of an LSB through four MSBs (quantized sample) included in a current N-tuple. The bit depth of the LSB may be used when performing a decoding on the LSB. In operation S1302, the arithmetic decoding apparatus 101 may select a probability model set with respect to the four MSBs included in the current N-tuple. In operation S1303, the arithmetic decoding apparatus 101 may select a probability model whether an MSB to be decoded is an escape code in accordance with an FD or a wLPD. In operation S1304, the arithmetic decoding apparatus 101 may perform a decoding on the MSB. In operation S1305, the arithmetic decoding apparatus 1305 may perform a decoding on whether the MSB to be decoded is the escape code, using a table of ari_pk_mod_esc[32][2]. When what is the escape code, the arithmetic decoding apparatus 101 may return to operation 1304, and when what is not the escape code, the arithmetic decoding apparatus 101 may perform the operation 1301.

In operation S1307, the arithmetic decoding apparatus 101 may map a probability model of an MSB symbol in accordance with context mode information, with respect to the four MSBs included in the current N-tuple.

In operation S1306, the arithmetic decoding apparatus 101 may perform an arithmetic decoding on the MSB. Since the four MSBs are included in the current N-tuple, a loop operation may be performed four times.

Figure 14:
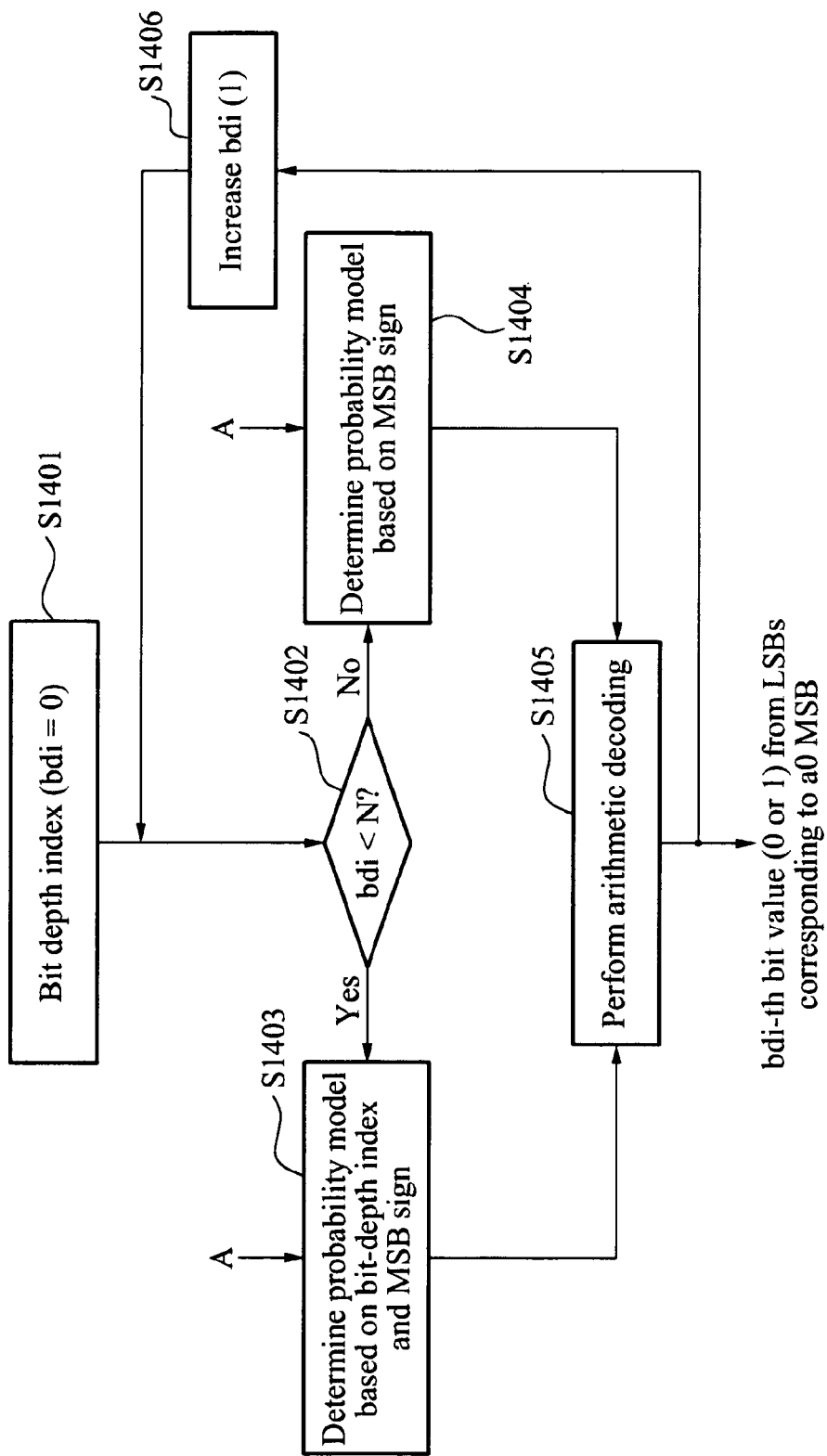
FIG. 14 illustrates a second example of an LSB decoding method according to an embodiment.

FIG. 14 illustrates a second example of an LSB decoding method according to an embodiment.

In operation S1401, the arithmetic decoding apparatus 101 may set a bit depth index (bid) derived from the decoding of the MSB. In operation S1402, the arithmetic decoding apparatus 101 may determine whether the bdi is less than or equal to 'N', that is, a level of an LSB. In operation S1403, when the bdi is less than 'N', the arithmetic decoding apparatus 101 may determine a probability model in accordance with the BID and a sign of the MSB. In operation S1405, when the bdi is greater than 'N', the arithmetic decoding apparatus 101 may determine the probability model in accordance with the sign of the MSB. Subsequently, the arithmetic decoding apparatus 101 may perform an arithmetic decoding in a bit unit of the LSB, and output a bit value (1 or 0) corresponding to the bdi among LSBs corresponding to the MSBs. In this instance, the arithmetic decoding apparatus 101 may divide three cases signifying whether a previously encoded or decoded MSB value is a positive number, a negative number, or 0, and perform an arithmetic encoding.

For example, when the bit depth is less than N(5), the arithmetic decoding apparatus 101 may use, as a context, bit depth information, and otherwise, the arithmetic decoding apparatus 101 may divide only three cases whether the MSB is a positive number, a negative number, or O. The arithmetic decoding apparatus 101 may perform an arithmetic decoding on the LSB corresponding to the next bit depth by increasing the bdi by 1 unit after performing the arithmetic decoding.

Figure 15:
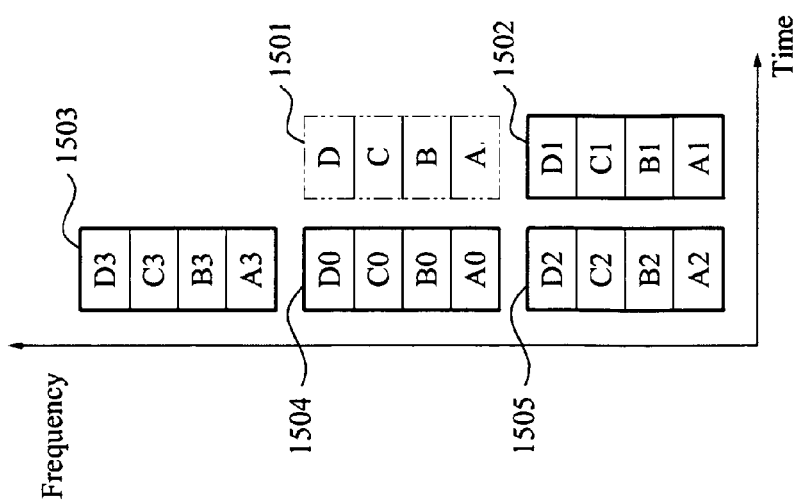
FIG. 15 illustrates a context mode according to an embodiment.

FIG. 15 illustrates a context mode according to an embodiment.

In FIG. 15, each of A, B, C, D, AO, BO, CO, DO, A1, B1, C1, D1, A2, B2, C2, D2, A3, B3, C3, and D3 may denote an MSB value having been already decoded or desired to be decoded, include a sign bit to be expressed as 3-bits, and have a value only ranging of −4 to 3.

A decoding may be performed on an MSB in a symbol unit with respect to an N-tuple. Specifically, the decoding may be performed on A, B, C, and D of MSBs in the stated order in accordance with a frequency index. When performing the decoding on the MSB value of A, B, C, and D, an arithmetic decoding may be performed on two MSBs among MSBs corresponding to a context of a current N-tuple and already decoded neighborhood N-tuples, using an MSB context. For example, when decoding A of the MSB of the current N-tuple 1501, an N-tuple context may be determined, and a probability model that decodes A by configuring an MSB context using an MSB A0 value of a neighborhood N-tuple 1504 and an MSB D1 value of a neighborhood N-tuple 1502 may be obtained to thereby perform the arithmetic decoding. In this instance, the MSB context may not be configured of only A0 and D1, and two MSB values among a plurality of MSB values neighboring the MSB A of the current N-tuple 1501 may be combined.

As described above, when configuring the MSB context, a context mode used when performing the decoding may be determined. Possible cases of the context mode may be expressed by bit-packing. Also, the context mode may be expressed such that an arithmetic decoding is performed on the context mode based on a number of times the context mode is used.

Also, the context mode may be transmitted once for each frame, so that an identical MSB context may be used in all frames. Also, the context mode may be transmitted twice for each frame, different MSB contexts corresponding to a low frequency band and a high frequency band may be used. Here, the frame may correspond to a single frame in a case of an FD mode, and may denote a unit using wLPT in a case of wLPT mode. For example, when MSB contexts are four types, and the MSB context is transmitted twice for each frame, 15 types of context modes may be configured as illustrated in FIG. 15. Also, the context mode may be divided into several sets to be expressed depending on whether the context mode is decoded in a decoding mode of core such as the FD mode or the wLPT mode, and a set of the context mode may be differently configured depending on a number of frequency spectrums.

When a context of an N-tuple decoding an MSB symbol A of the current N-tuple 1501 and an MSB context are determined, a decoding may be performed on an MSB value. When a probability model is used in all cases, a total number of cases of probability models may increase, thereby increasing an amount of a memory. To prevent the amount of the memory from increasing, a probability may be expressed using a probability mapping table and a probability table to use a representative probability model. For example, when an N_pki value is 32, MSB contexts are four types, an MSB value is in a range of −4 to 3, a total number of cases of probability may be 32*8*8*4=4096, and a number of symbols to be finally decoded is 8, and thereby only 65536 probability tables may be used as long as total probability tables are not combined. To prevent this, when a number of cases of the probability table is reduced by performing a combination on a probability model, and a mapping table of 32*8*8*4 is configured, the amount of the memory to be used may be reduced.

Figure 16:
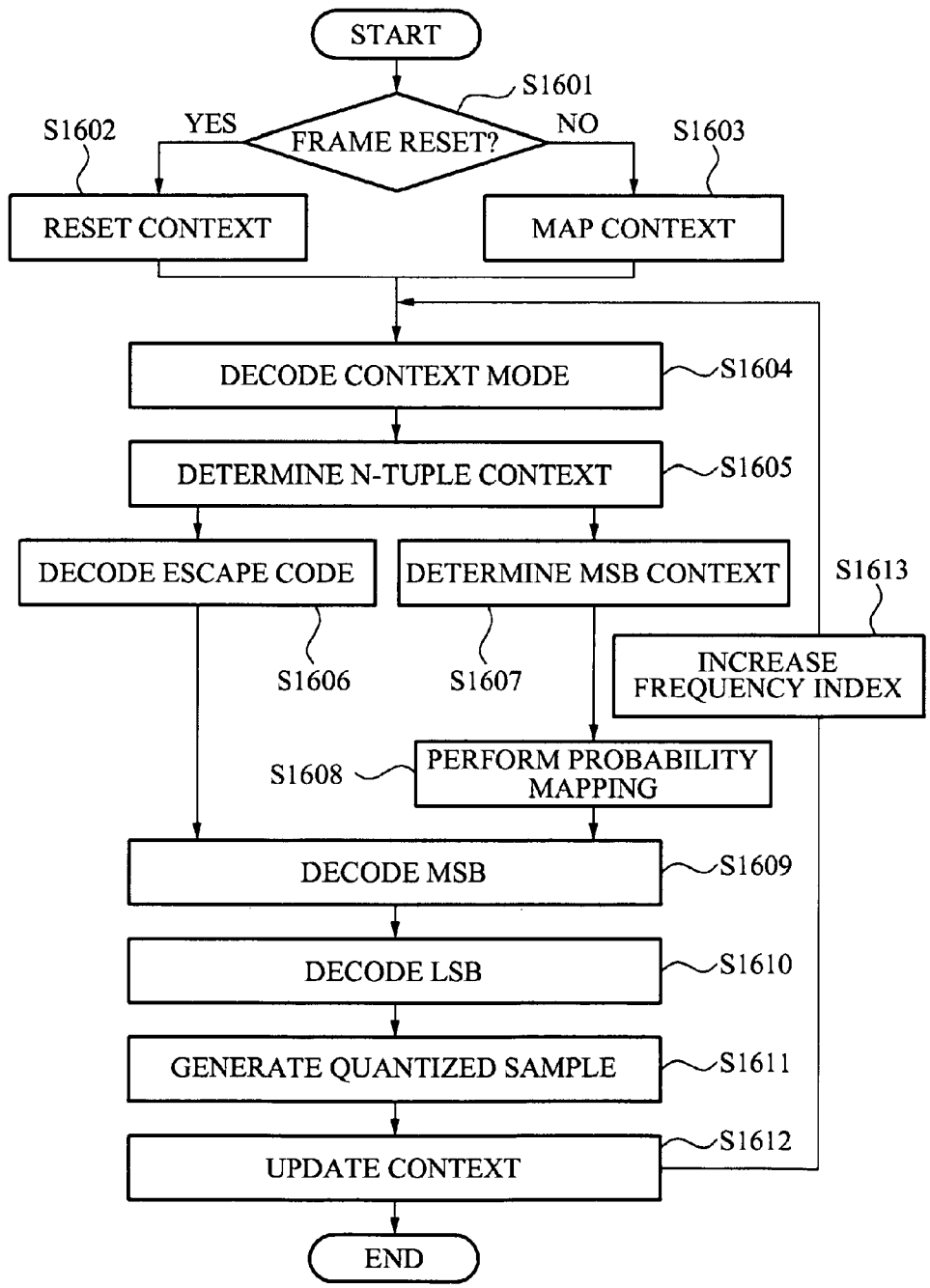
FIG. 16 is a flowchart illustrating a context-based arithmetic decoding method with respect to an N-tuple according to an embodiment.

FIG. 16 is a flowchart illustrating a context-based arithmetic decoding method with respect to an N-tuple according to an embodiment.

The method of FIG. 16 may correspond to operations of the arithmetic decoding apparatus 101 of FIGS. 3 and 12.

In operation S1601, the arithmetic decoding apparatus 101 may determine whether a current frame is a reset frame. When the current frame is the reset frame, the arithmetic decoding apparatus 101 may perform a context reset When the current frame is not the reset frame, the arithmetic decoding apparatus 101 may map a context. Specifically, the arithmetic decoding apparatus 101 may regularize a length of a previous frame as a length of the current frame to thereby map the context so that a frequency index between two frames may be mapped in a case where the length of the current frame is different from the length of the previous frame. Operations S1601 to S1603 may be performed in a frame unit.

In operation S1604, the arithmetic decoding apparatus 101 may decode a context mode to determine an MSB context. Subsequently, in operation S1605, the arithmetic decoding apparatus 101 may determine an N-tuple context. In this instance, a lev 0 of an initial LSB bit depth may be estimated.

In operation S1606, the arithmetic decoding apparatus 101 may decode an escape code based on a context (pki) of the N-tuple and FD/wLPT. Whenever the escape code is decoded, the lev 0 may be updated, and when a code different from the escape code is decoded, the arithmetic decoding apparatus 101 may perform a decoding on an MSB in operation S1609.

In operation S1607, the arithmetic decoding apparatus 101 may determine an MSB context corresponding to an MSB to be currently decoded. In operation S1608, the arithmetic decoding apparatus 101 may determine an appropriate probability mode based on an N-tuple context and the MSB context.

In operation S1609, the arithmetic decoding apparatus 101 may perform the decoding on the MSB based on the probability model.

In operation S1610, the arithmetic decoding apparatus 101 may decode bits corresponding to a bit depth of an LSB derived from the decoding of the escape code. In operation S1611, the arithmetic decoding apparatus 101 may generate a quantized sample through the MSB and LSB. In operation S1612, the arithmetic decoding apparatus 101 may update the context to decode the next N-tuple. In operation S1613, the arithmetic decoding apparatus 101 may increase a frequency index, and perform the decoding on the N-tuple.

Figure 17:
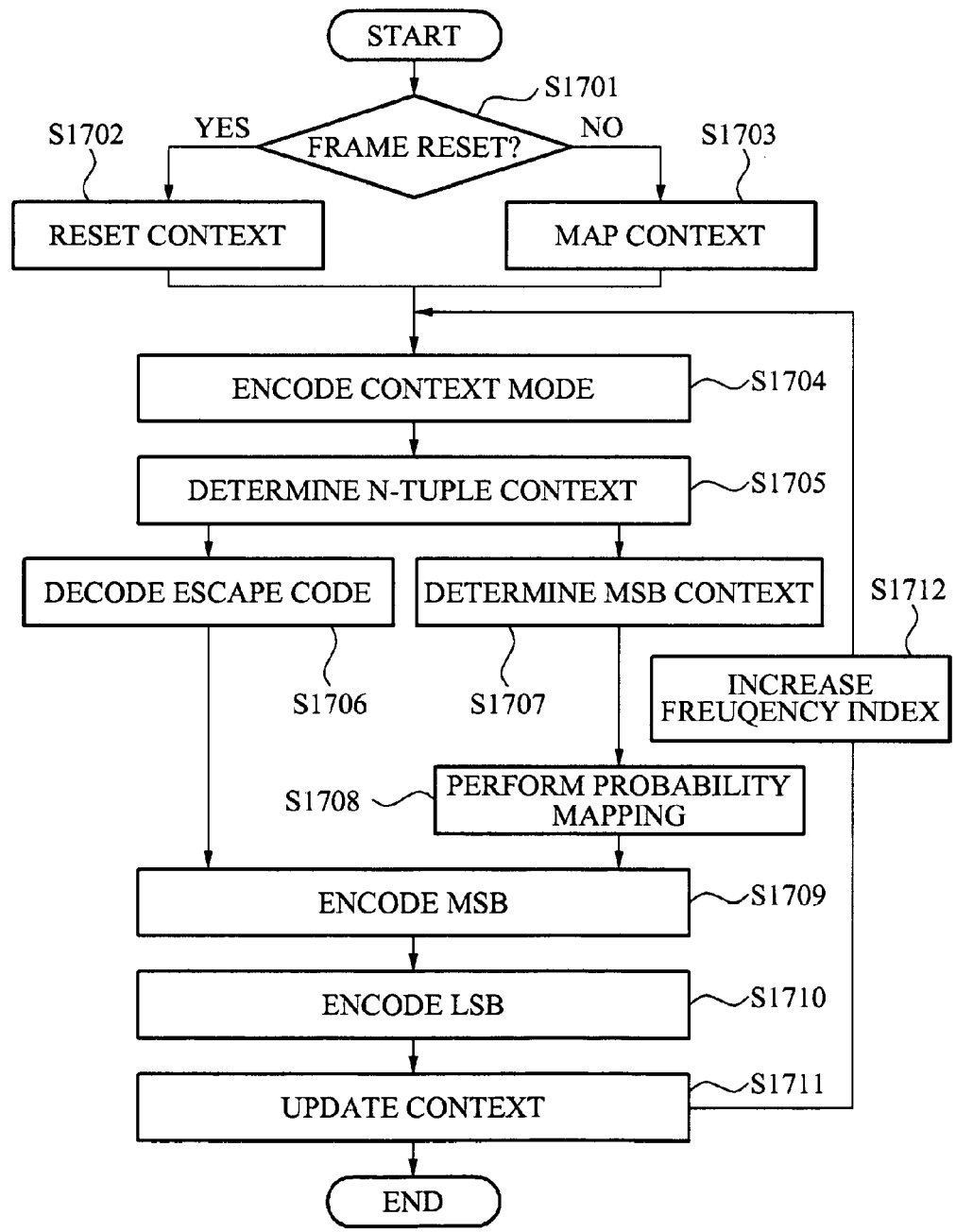
FIG. 17 is a flowchart illustrating a context-based arithmetic encoding method with respect to an N-tuple according to an embodiment.

FIG. 17 is a flowchart illustrating a context-based arithmetic encoding method with respect to an N-tuple according to an embodiment.

The method of FIG. 17 may correspond to operations of the arithmetic encoding apparatus 100 of FIGS. 2 and 11.

In operation S1701, the arithmetic encoding apparatus 100 may determine whether a current frame is a reset frame. When the current frame is the reset frame, the arithmetic encoding apparatus 100 may perform a context reset. When the current frame is not the reset frame, the arithmetic encoding apparatus 100 may map a context. Specifically, the arithmetic encoding apparatus 100 may regularize a length of a previous frame as a length of the current frame to thereby map the context so that a frequency index between two frames may be mapped in a case where the length of the current frame is different from the length of the previous frame. Operations S1601 to S1603 may be performed in a frame unit.

Operations S1701 and S1703 may be performed in a frame unit.

In operation S1704, the arithmetic encoding apparatus 100 may encode a context mode to determine an MSB context.

In operation S1705, the arithmetic encoding apparatus 100 may determine an N-tuple context with respect to a current N-tuple. In this instance, a lev 0 of an initial LSB bit depth may be estimated.

In operation S1706, the arithmetic encoding apparatus 100 may perform an encoding on the escape code based on the N-tuple context (pki) and FD/wLPT. Whenever the escape code is encoded, the lev 0 may be updated, when a mode different from the escape code is encoded, the arithmetic encoding apparatus 101 may perform an encoding on the MSB in operation S1709.

In operation S1707, the arithmetic encoding apparatus 100 may determine an MSB context corresponding to an MSB to be currently encoded. In operation S1708, the arithmetic encoding apparatus 100 may determine an appropriate probability model based on the N-tuple context and the MSB context.

In operation S1709, the arithmetic encoding apparatus 100 may perform an encoding an MSB based on the probability model.

In operation S1710, the arithmetic encoding apparatus 100 may perform an encoding bits corresponding to a bit depth of an LSB derived from the decoding of the escape code. In operation S1711, the arithmetic encoding apparatus 100 may generate a quantized sample through the MSB and LSB, and in operation S1712, the arithmetic encoding apparatus 100 may update a context to encode the next N-tuple.

In operation S1713, the arithmetic encoding apparatus 100 may increase a frequency index, and perform a decoding on the next N-tuple.

Figure 18:
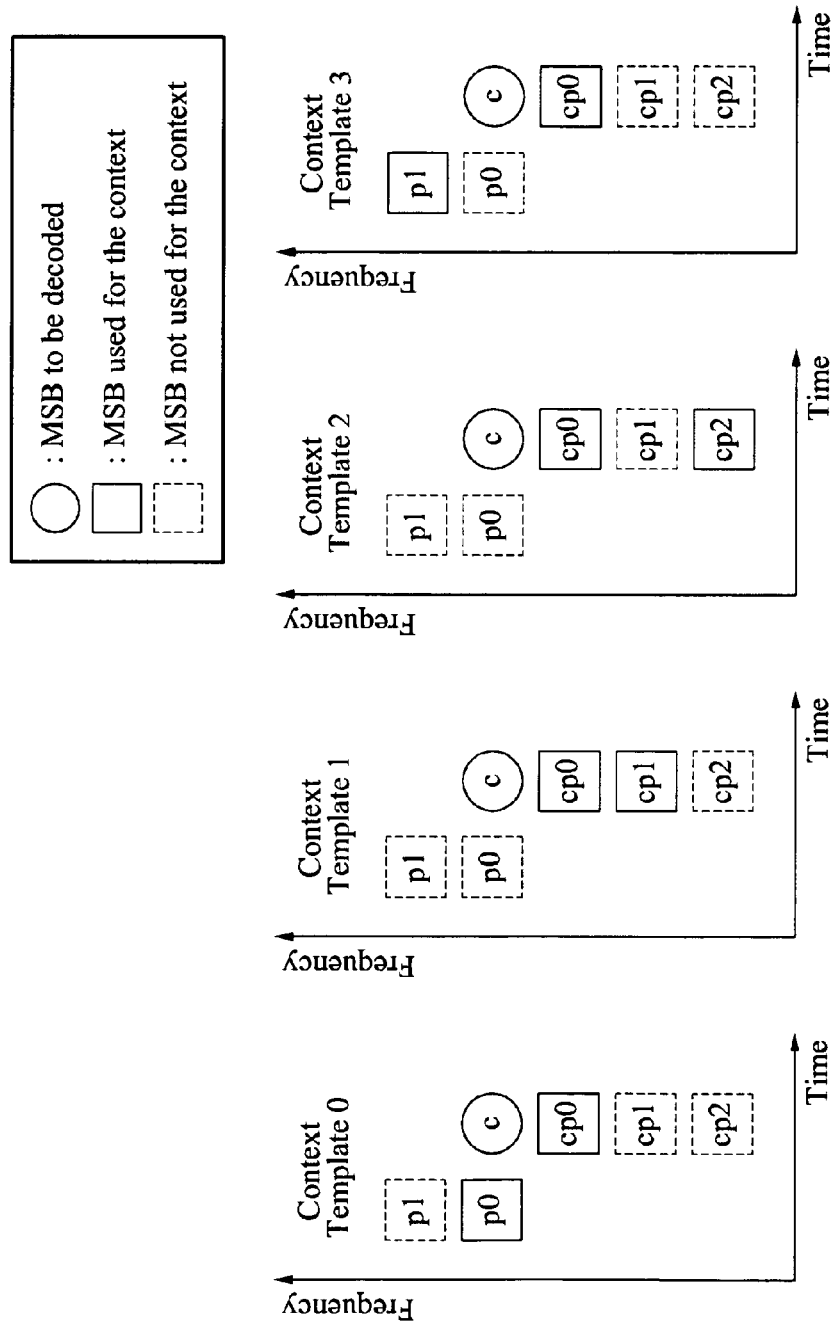
FIG. 18 illustrates an example of implementing a context mode according to an embodiment.

FIG. 18 illustrates an example of implementing a context mode according to an embodiment.

The context mode may denote relative position information of MSB values of a context to be used when perform a decoding using MSB values neighboring an MSB symbol to be current decoded. The relative position information may be expressed using an MSB context template. In this instance, the arithmetic decoding apparatus 101 may decode a signal context template index from among a plurality of MSB contexts when performing a decoding on the MSB. The arithmetic decoding apparatus 101 may determine a context template in accordance with a context template index to thereby determine an MSB context.

The context templates 0 to 3 may denote relative position information, ' c' may denote an MSB symbol to be currently decoded, and p0, p1, cp0, cp1, and cp2 may be an MSB symbol having been already decoded. In a case of the context template 0, an MSB symbol of the same frequency position as that of a previous frame and an MSB symbol of a previous frequency position of the same frame may be used as an MSB context.

The context template may have different values with respect to a low frequency band and a high frequency band. For example, to simultaneously express the context template, a context template index may be used. In this instance, the context template index may be determined for each frequency band. The context template index may be arithmetically decoded using a core decoding mode as a context.

For example, the context template index may be expressed as the following Equation 1.

$$ctidx = (ct\_l) | (ct\_h << 2)$$

$$0 \leq ct\_l \leq 3, 0 \leq ct\_h \leq 3 \qquad \text{[Equation 1]}$$

In Equation 1, ct-I and cth__ may denote a context template value of a low frequency band and a context template of a high frequency band, and four cases in total may be expressed. ctidx may denote a context template index. The LSB decoding unit may perform a decoding on an LSB through the following Equation 2.

$$ClsbM(x) = \begin{cases} 0, & x < 0 \\ 1, & x = 0 \\ 2, & x > 0 \end{cases} \qquad \text{[Equation 2]}$$

$$ClsbB(l) = \begin{cases} l, & l < 5 \\ 5, & l \geq 5 \end{cases}$$

$$x \in \{a0, b0, c0, d0\}, 0 \leq i < lev$$

X denotes an MSB value corresponding to the same frequency position as that of the LSB value, and I denotes a bit depth of the LSB. Also, a0, b0, c0, and d0 may denote the MSB symbol to be decoded.

Figure 19:
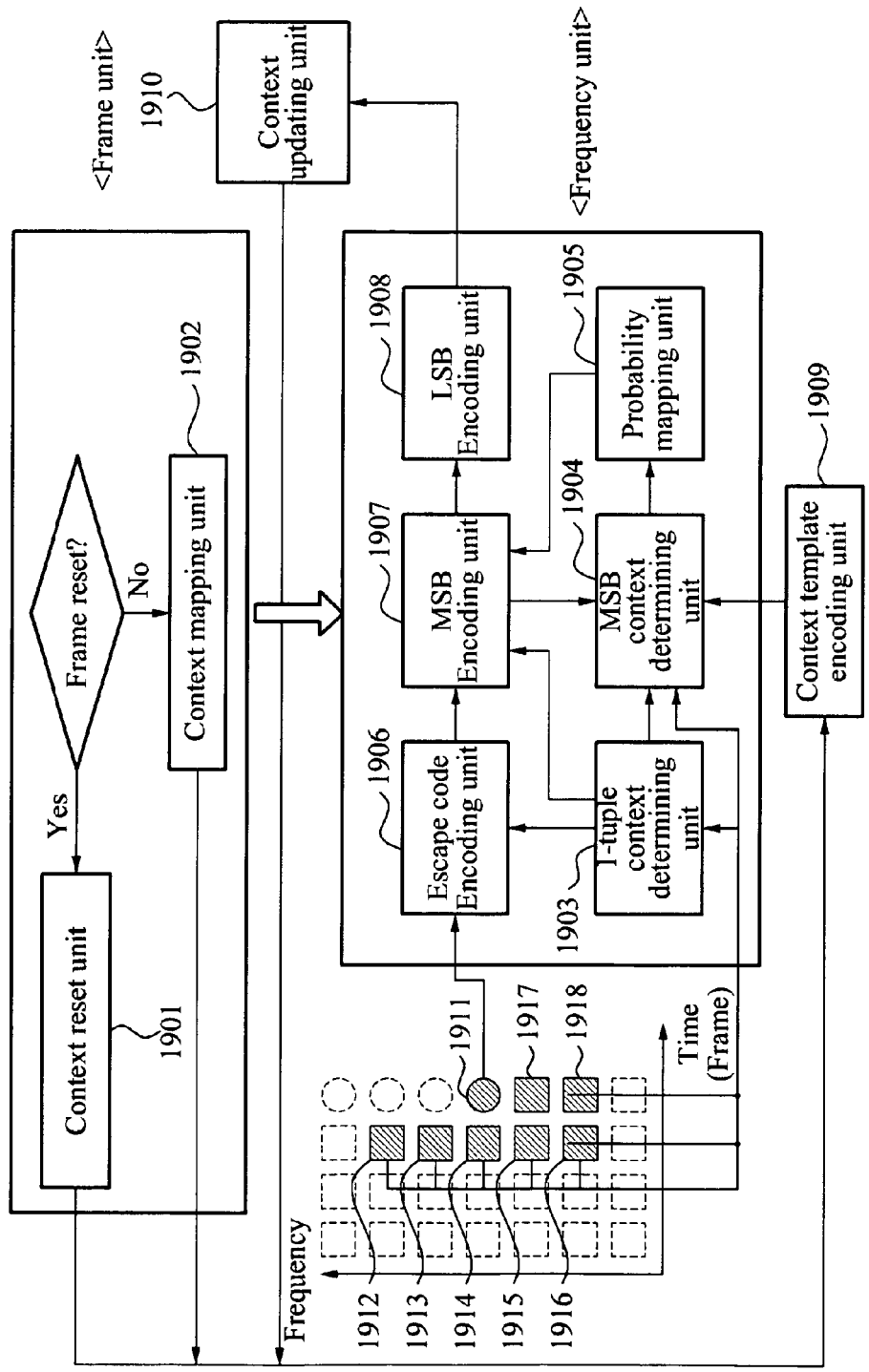
FIG. 19 illustrates a configuration of a third example of an arithmetic encoding apparatus according to an embodiment, in detail.

FIG. 19 illustrates a configuration of a third example of an arithmetic encoding apparatus according to an embodiment, in detail.

The arithmetic encoding apparatus 100 includes a context reset unit 1901, a context mapping unit 1902, a 1-tuple context determining unit 1903, an MSB context determining unit 1904, a probability mapping unit 1905, an escape code encoding unit 1906, an MSB encoding unit 1907, an LSB encoding unit 1908, a context template encoding unit 1909, and a context updating unit 1910.

The arithmetic encoding apparatus 100 may further include the 1-tuple context determining unit 1903 in comparison with the arithmetic encoding apparatus 100 of FIG. 10. Specifically, the arithmetic encoding apparatus 100 of FIG. 10 may perform an operation of using an N-tuple context, or the arithmetic encoding apparatus 100 may perform an operation using the 1-tuple context.

The context reset unit 1901 and the context mapping unit 1902 may be operated in a frame unit. When a current frame is a reset frame, the context reset unit 1901 may perform a context reset. When the current frame is not the reset frame, the context mapping unit 1902 may align, in a case where a length of a frequency spectrum of the current frame is different from a length of a frequency spectrum of a previous frame, a length of a previous frame to be a length of a current frame.

Also, the context mapping unit 1902 may additionally map encoded MSB values of the previous frame.

The 1-tuple context determining unit 1903 may determine a context of a current 1-tuple 1911 using a quantized spectrum value of neighborhood 1-tuples 1912 to 1918 neighboring the current 1-tuple 1911 to be encoded.

For example, the 1-tuple context determining unit 1903 may determine a context of the current 1-tuple 1911 using seven 1-tuples 1912 to 1918 having been already encoded.

The 1-tuple context determining unit 1903 may perform a mapping in 64 states, using the neighborhood 1-tuples 1912 to 1918, that is, seven quantized spectrums with respect to the current 1-tuple 1911. Also, the 1-tuple context determining unit 1903 may reduce an amount of quantized spectrum information by respectively mapping 0 into 0, −1 or 1 into 1, 2 or −2 into 2, and more than 3 or less than −4 into 3 in a training process. Subsequently, the 1-tuple context determining unit 1903 may configure a single state by bundling cases having a similar generation probability of the MSB symbols from all possible numbers of cases where a mapped quantized spectrum is generated, thereby generating a plurality of states.

The configured mapping relation may be performed through a hash table. In this instance, the 1-tuple context determining unit 1903 may determine the state by inputting, in the hash table configured in the training process, neighborhood 1-tuples 1912 to 1918, that is, seven quantized spectrums neighboring the current 1-tuple 1911.

Also, an additional quantized sample may be inputted in the hash table to thereby determine the state.

Also, to determine the context of the current 1-tuple, encoding mode information of a core may be further considered. The 1-tuple context determining unit 1903 may determine whether the encoding mode information of the core is an FD mode or a wLPT mode, and reflect the determined information in the training process. The 1-tuple context determining unit 1903 may input, in the hash table, already encoded neighborhood 1-tuples and the encoding mode information of the core to thereby determine the state.

The 1-tuple context determining unit 1903 may predict a number of times a scaling down of the current 1-tuple 1911, that is, an additionally currently quantized spectrum, is performed, thereby extracting MSB information and LSB information.

The number of times the scaling down is performed may be obtained by a prediction using neighborhood 1-tuples. In this instance, 1-tuple context determining unit 1903 may predict the number of times the scaling down of the current 1-tuple 1911, using at least one of seven neighborhood 1-tuples 1912 to 1918.

For example, when the prediction is performed using the neighborhood 1-tuple 1917 or 1918 corresponding to a previous frequency of a current frame, the 1-tuple context determining unit 1903 may perform a ½ scaling down until a value of the neighborhood 1-tuple 1917 or 1918 reaches a range expressed as a bit number expressing an MSB of the current 1-tuple 1911, and determine the number of times the scaling down is performed when the value reaches the range. In this instance, the MSB is defined as being three bits including sign information, the 1-tuple context determining unit 1903 may perform the ½ scaling down until the value of the neighborhood 1-tuple 1917 or 1918 is in a range of −4 to 3, thereby predicting a frequency of the scaling down with respect to the current 1-tuple 1911. The predicted frequency of the scaling down may signify the above described estimation process of the lev O.

According to an embodiment, the 1-tuple context determining unit 1903 may estimate the lev 0 using two neighborhood 1-tuples 1917 and 1918 corresponding to the previous frequency of the current frame, with respect to the current 1-tuple 1911. When using a plurality of neighborhood 1-tuples, accuracy of the estimation of the lev 0 may be improved.

According to another embodiment, the 1-tuple context determining unit 1903 may perform the estimation of the lev 0 using at least one of neighborhood 1-tuples 1917 and 1918 corresponding to the previous frequency of the current frame, with respect to the current 1-tuple 1911, and determine the number of times the scaling down is performed by comparing absolute values of the at least one of the neighborhood 1-tuples corresponding to the previous frequency of the current frame, with respect to the current 1-tuple 1911.

Specifically, the 1-tuple context determining unit 1903 may change, as an absolute value, the value of the at least one of the neighborhood 1-tuples corresponding to the previous frequency of the current frame, with respect to the current 1-tuple 1911, and when values where the scaling down is performed reach a predetermined threshold while performing the ½ scaling down on the changed absolute value, the scaling down may stop to be performed, and a value where the scaling down is finally performed may be determined as the estimation value of the lev O.

For example, when the MSB is defined as being three bits including sign information, the 1-tuple context determining unit 1903 may calculate an absolute value of each of the two neighborhood 1-tuples 1917 and 1918 corresponding to the previous frequency of the current frame, with respect to the current 1-tuple 1911, and then when the value where the scaling down is performed reaches 4 or less while performing the ½ scaling down on the two absolute values, the scaling down may stop to be performed, and a value where the scaling down is finally performed may be used as the estimation value of the lev O.

Also, according to an embodiment, the 1-tuple context determining unit 1903 may estimate the lev 0 selectively using a single neighborhood 1-tuple 1917 or two neighborhood 1-tuples 1917 and 1918, each of the neighborhood 1-tuples corresponding to the previous frequency of the current frame with respect to the current 1-tuple 1911.

For example, as described above, the lev 0 may be estimated in accordance with a mode of a core. The 1-tuple context determining unit 1903 may estimate the lev 0 using the single neighborhood 1-tuple in a case of the FD mode, and using the two neighborhood 1-tuples in a case of the wLPT mode. In the wLPT mode, since a frequency spectrum is relatively flat in comparison with the FD mode, the lev 0 may be more effectively estimated using several neighborhood 1-tuples rather than using the single neighborhood 1-tuple, with respect to the current 1-tuple 1911.

Also, the 1-tuple context determining unit 1903 may estimate a number of neighborhood 1-tuples used when estimating the lev 0 based on a tool used when performing an encoding in the FD mode. For example, as the tool used when performing the encoding in the FD mode, a temporal noise shaping (TNS), a Time Warped MDCT (TW-MDCT), and the like may be used. In this instance, when the encoding is performed using the TW-MDCT tool in the FD mode, the 1-tuple context determining unit 1903 may estimate the lev 0 using the two neighborhood 1-tuples 1917 and 1918.

Also, the 1-tuple context determining unit 1903 may estimate the lev 0 using the single neighborhood 1-tuple 1917, or using two neighborhood 1-tuples 1917 and 1918, based on information transmitted for each frame. For example, the 1-tuple context determining unit 1903 may estimate the lev 0 in accordance with a number of the neighborhood 1-tuples transmitted for each frame by adopting an arithmetic decoding scheme. Specifically, the 1-tuple context determining unit 1903 may generate a probability model based on a frequency with respect to a number of used neighborhood 1-tuples in accordance with the FD mode or the wLPT mode when performing the arithmetic decoding, and perform an arithmetic decoding by applying the generated probability model as a context.

The MSB context determining unit 1904 may generate an additional context in a case of a specific state, that is, a subset from among entire states mapped in the 1-tuple context determining unit 1903. In this instance, the generated additional context may be combined with all states in a process of selecting the probability model when encoding an MSB of the current 1-tuple 1911 in the MSB encoding unit 1907. As for the remaining states excluding the specific state from among the entire states, the MSB encoding unit 1907 may select the probability model using only the entire states.

For example, an MSB context generated through the MSB context determining unit 1904 may be as follows. A context template will be further described with reference to FIG. 22.

(1) an MSB value of the neighborhood 1-tuple 1917 or 1918, that is, a quantized spectrum corresponding to the previous frequency in the current frame or an MSB value of the neighborhood 1-tuple 1914, that is, a quantized spectrum corresponding to the current frequency in the previous frame (2) an MSB value of the quantized spectrum combined with the context template (3) a value extracted by additionally quantizing the neighborhood 1-tuple 1917 or 1918 corresponding to the previous frequency in the current frame or a value extracted by additionally quantizing the neighborhood 1-tuple 1914, that is, a quantized spectrum corresponding to the current frequency in the previous frame (4) a value extracted by additionally quantizing a quantized spectrum combined with the context template (5) a value extracted by additionally quantizing the neighborhood 1-tuples 1912 to 1916, that is, a quantized spectrum of the previous frame (6) a value extracted by changing the neighborhood 1-tuple 1917 or 1918 corresponding to the previous frequency in the current frame or a value extracted by changing the neighborhood 1-tuple 1914, that is, a quantized spectrum corresponding to the current frequency in the previous frame (7) a value extracted by changing a quantized spectrum combined with the context template A method of additionally quantizing the quantized spectrum in the MSB context determining unit 1904 may be as follows. First, the MSB context determining unit 1904 may additionally perform a quantization on the quantized spectrum in accordance with an FD mode and a wLPT mode.

Second, the MSB context determining unit 1904 may additionally perform the quantization to determine, as a context of a firstly quantized spectrum, a specific scheme in which −4 to 3 is mapped into −4 to 3, more than 4 is mapped into 3, and −5 or less may be mapped into −4.

When using the MSB value, the MSB encoding unit 1907 may perform a decoding on the current 1-tuple 1911 by selecting one from MSB values of the neighborhood 1-tuples 1912 to 1918, that is, the quantized spectrum where a lossless encoding is performed on the current frame or the previous frame.

A method of changing the quantized spectrum by the MSB context determining unit 1904 may be as follows.

The MSB context determining unit 1904 may extract a quantized frequency spectrum value by performing a scaling down on the neighborhood 1-tuples 1912 to 1918 by the lev 0 based on an estimation value of the lev 0 of the current 1-tuple 1911, that is, a current frequency spectrum to be subjected to a lossless encoding with respect to the current frame.

The MSB context determining unit 1904 may set the quantized frequency spectrum value as a minimum value or a maximum value when using the quantized frequency spectrum value extracted after performing the scaling down or when the quantized frequency spectrum value is outside a range expressed as a bit number expressing the MSB of the current 1-tuple 1911.

The escape code encoding unit 1905 may perform an escape code encoding when a value changed by performing a ½ scaling down on the current 1-tuple 1911 to be subjected to a lossless encoding by the estimated lev 0 exceeds a value expressed as the bit number defining the MSB of the current N-tuple 1911.

A scheme of performing an encoding on the escape code may include (1) a scheme of performing an encoding on information indicating whether an MSB to be decoded is an escape code and (2) a scheme of performing the encoding on the escape code included in an MSB symbol. Specifically, (1) the scheme of performing the encoding on the information may assign 1 to the escape code, and assign 0 to the escape code when the MSB is not the escape code, and perform an encoding on 0 or 1. When 0 is encoded, the MSB encoding unit 1907 may perform an encoding on the MSB of the current 1-tuple 1911. (2) The scheme of performing the encoding on the escape code may denote a scheme of performing an encoding on one symbol from nine symbols in total obtained by expressing eight MSB symbols and the escape code as a symbol of the same level. For example, the escape code encoding unit 1905 may set 0 to 7 as MSB symbols, and set 9 as the escape code to thereby encode the nine symbols.

The escape code encoding unit 1905 may not perform the encoding on the escape code in a case where a value of the current 1-tuple 1911 is in a range of −4 to 3 when performing a scaling down on the current 1-tuple 1911, that is, a quantized spectrum to be currently encoded by a predicted number of times the ½ scaling down is performed.

In a case where the value of the current 1-tuple 1911 is not in a range of −4 to 3 when performing the scaling down on the current 1-tuple, the escape code encoding unit 1905 may further perform the scaling down on the current 1-tuple 1911 to enable the value of the current 1-tuple 1911 to be included in the range of −4 to 3, and perform the encoding on the escape code by the number of times the scaling down is performed. In this instance, data lost in a process of performing the scaling down may be included in LSBs, and the LSB encoding unit 1908 may perform an encoding on the LSBs.

The probability model unit 1906 may map a final probability model using the context of the current 1-tuple 1911 and the MSB context. The probability mapping unit 1906 may use a mapping table and a probability table. A process of mapping the probability model may be a process of obtaining, from the probability table, a probability model to be applied when performing a decoding on the MSB. Specifically, when there exist probability models for all cases, a burden for a size of a memory may be reduced. Thus, to reduce the size of the memory, the probability mapping unit 1906 may use the mapping table to obtain a probability model depending on the context. The mapping table may be configured by assigning an index of the probability table to a total arrangement corresponding to a context of each probability. The probability table may be configured of all probability values used when performing the decoding on the MSB.

The MSB encoding unit 1907 may perform an encoding on an MSB of the current 1-tuple 1910 only using entire states generated in (i) the 1-tuple context determining unit 1903, or may select the probability model using a subset of a specific state from among the entire states generated in (ii) the 1-tuple context determining unit 1903 and using the additional context determined in the MSB context determining unit 1904, and thereby perform an arithmetic encoding on the MSB of the current 1-tuple 1910.

The LSB encoding unit 1908 may perform the arithmetic encoding using remaining bits up to a bit depth of an LSB of the current 1-tuple 1911, as a context. In this instance, the context may include sign information (negative number, 0, positive number) of the MSB of the neighborhood 1-tuple 1914 corresponding to a current frequency of the current 1-tuple 1911. Also, the sign information of the MSB of the neighborhood 1-tuple 1914 may include sign information including the negative number and the positive number excluding O. Subsequently, the LSB encoding unit 1908 may select the probability model in accordance with the sign information of the MSB of the neighborhood 1-tuple 1914, and then perform an encoding on the LSB.

Also, the LSB encoding unit 1908 may perform the encoding on the LSB using the context determined based on the bit depth of the LSB and the sign information of the MSB of the neighborhood 1-tuple 1914. In this instance, the bit depth of the LSB may be expressed as index (level) information.

The context template encoding unit 1909 may perform an encoding on a single context template finally transmitted from among a plurality of contexts to be used when performing the encoding on the MSB of the current 1-tuple 1911. The plurality of contexts may denote a value extracted to determine the MSB context in the MSB context determining unit 1904. The context template may signify a relative position of the neighborhood 1-tuple with respect to the current 1-tuple 1911 to be encoded, and a value to be used as the MSB context may be extracted from the position determined by the context template. The context template may be transmitted by a bit-packing scheme, and may be transmitted by an arithmetic encoding scheme. The transmission of the context template may be performed once for each frame. The context template encoding unit 1909 may assign bits expressing a candidate number to thereby perform the bit packing. Subsequently, the MSB context determining unit 1904 may select an appropriate MSB context in accordance with a context template.

The context updating unit 1910 may update a quantized sample to encode the next 1-tuple. Subsequently, the MSB context determining unit 1904 may determine the MSB context using the updated quantized sample with respect to the next 1-tuple.

Figure 20:
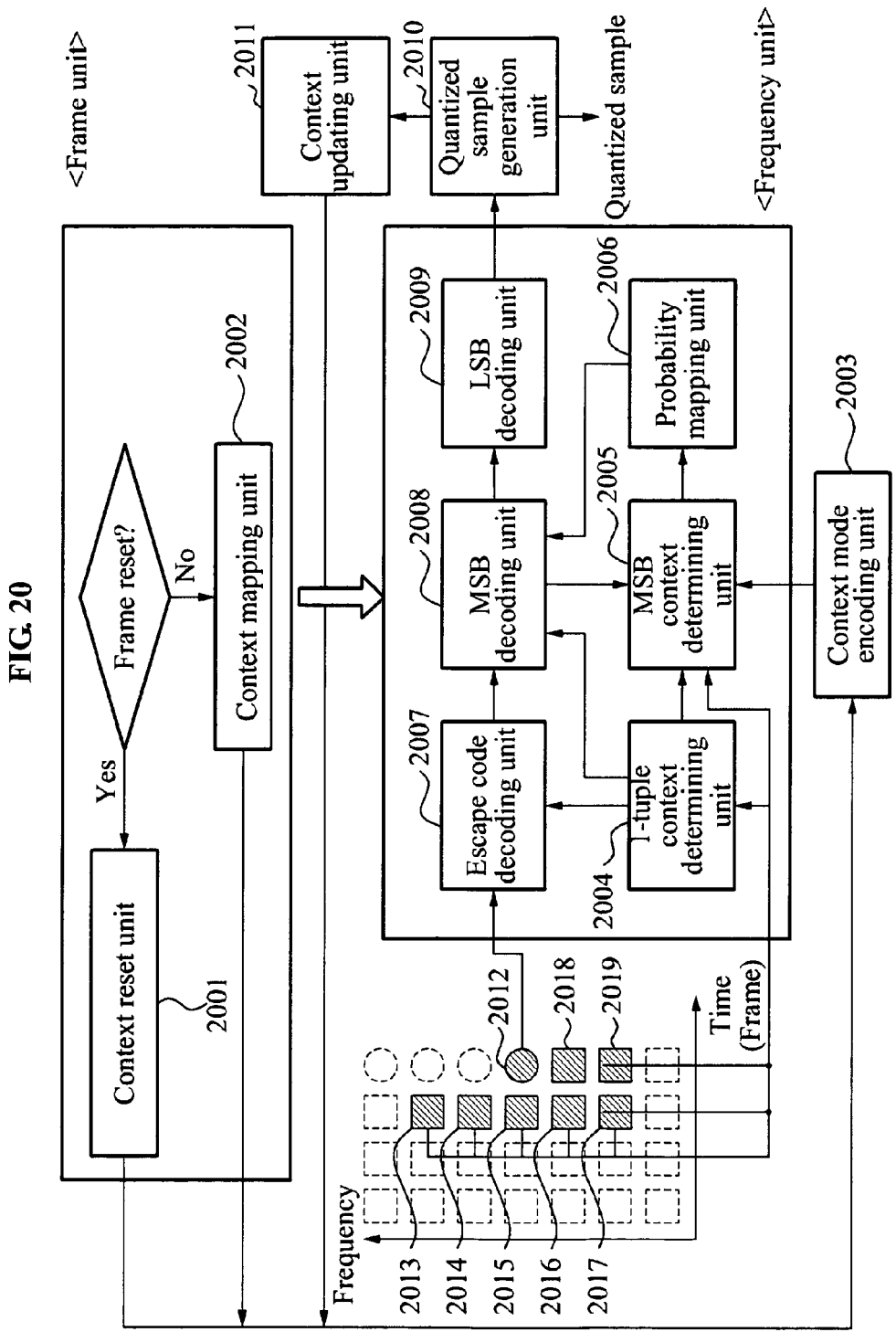
FIG. 20 illustrates a configuration of a third example of an arithmetic decoding apparatus according to an embodiment, in detail.

FIG. 20 illustrates a configuration of a third example of an arithmetic decoding apparatus 101 according to an embodiment, in detail.

The arithmetic decoding apparatus 101 of FIG. 20 may correspond to the arithmetic encoding apparatus 100 of FIG. 19, and operations of each of the components may be the same.

The arithmetic decoding apparatus 101 includes a context reset unit 2001, a context mapping unit 2002, a context template decoding unit 2003, a 1-tuple context determining unit 2004, an MSB context determining unit 2005, a probability mapping unit 2006, an escape code decoding unit 2007, an MSB decoding unit 2008, an LSB decoding unit 2009, a quantized sample generation unit 2010, and a context updating unit 2011.

In comparison with the arithmetic decoding apparatus 101 of FIG. 11, the arithmetic decoding apparatus 101 of FIG. 20 may use the 1-tuple context determining unit 2007. Specifically, the arithmetic decoding apparatus 101 of FIG. 11 may perform an operation of using the N-tuple context, and the arithmetic decoding apparatus 101 of FIG. 20 may perform an operation using the 1-tuple context.

The context unit 2001 and the context mapping unit 2002 may be operated in accordance with a frame unit.

When a current frame to be decoded is a reset frame, the context reset unit 2001 may perform a context reset. When the current frame to be decoded is not the reset frame, the context mapping unit 2002 may align, in a case where a length of a frequency spectrum of the current frame is different from a length of a frequency spectrum of a previous frame, a length of a previous frame to be a length of a current frame. Also, the context mapping unit 2002 may additionally map decoded MSB values of the previous frame.

The context template decoding unit 2003 may perform a decoding on a single context template finally transmitted from a plurality of contexts to be used when performing an MSB of a current 1-tuple 2012 to be decoded. The plurality of contexts may denote a value extracted to determine an MSB context in the MSB context determining unit 2005. The context template may express a relative position of a neighborhood 1-tuple with respect to the current 1-tuple 2012 to be decoded, and a value to be used as the MSB context may be extracted from the relative position. The context template may be transmitted by a bit-packing scheme, and transmitted by an arithmetic decoding scheme. The transmission of the context template may be performed once for each frame. The context template decoding unit 2003 may perform the bit packing scheme by assigning bits expressing a candidate number. Subsequently, the MSB context determining unit 2005 may select an appropriate MSB context in accordance with the context template.

The 1-tuple context determining unit 2004 may determine a context of the current 1-tuple 2012 using a quantized spectrum value of neighborhood 1-tuples 2013 to 2019 neighboring the current 1-tuple 2012 to be decoded. For example, the 1-tuple context determining unit 2004 may determine the context of the current 1-tuple 2012 using seven neighborhood 1-tuples 2013 to 2019 having been decoded.

The 1-tuple context determining unit 2004 may map neighborhood 1-tuples into 64 states using the seven neighborhood 1-tuples 2013 to 2019.

Also, the 1-tuple context determining unit 2004 may further quantize seven quantized spectrums. Specifically, the 1-tuple context determining unit 2004 may map 0 into 0, −1 or 1 into 1, 2 or −2 into 2, and more than 3 or less than −4 into 3, respectively, in a training process, thereby reducing information of the quantized spectrum. Subsequently, the 1-tuple context determining unit 2004 may configure a single state by bundling cases having a similar generation probability of MSB symbols from all possible numbers of cases where a mapped quantized spectrum is generated, thereby generating a plurality of states.

The 1-tuple context determining unit 2004 may determine the state by inputting, in the hash table configured in the training process, neighborhood 1-tuples 2013 to 2019, that is, seven quantized spectrums neighboring the current 1-tuple 2012. Also, an additional quantized sample may be inputted in the hash table to thereby determine the state.

Also, to determine the context of the current 1-tuple 2012, encoding mode information of a core may be further considered. The 1-tuple context determining unit 2004 may determine whether the encoding mode information of the core is an FD mode or a wLPT mode, and reflect the determined information in the training process. The 1-tuple context determining unit 2004 may input, in the hash table, already decoded neighborhood 1-tuples and the encoding mode information of the core to thereby determine the state.

The 1-tuple context determining unit 2004 may predict a number of times a scaling down of the current 1-tuple 2012, that is, an additionally currently quantized spectrum, is performed, thereby extracting MSB information and LSB information. The number of times the scaling down is performed may be obtained by performing the prediction using the neighborhood 1-tuples. In this instance, the 1-tuple context determining unit 2004 may predict the number of times the scaling down is performed with respect to the current 1-tuple 2012 using at least one of seven neighborhood 1-tuples 2013 to 2019.

For example, when the prediction is performed using the neighborhood 1-tuple 2018 or 2019 corresponding to a previous frequency of a current frame, the 1-tuple context determining unit 2004 may perform a ½ scaling down until a value of the neighborhood 1-tuple 2018 or 2019 reaches a range expressed as a bit number expressing an MSB of the current 1-tuple 2012, and determine the number of times the scaling down is performed when the value reaches the range. In this instance, the MSB is defined as being three bits including sign information, the 1-tuple context determining unit 2004 may perform the ½ scaling down until the value of the neighborhood 1-tuple 2013 or 2019 is in a range of −4 to 3, thereby predicting a frequency of the scaling down with respect to the current 1-tuple 2012. The predicted frequency of the scaling down may signify the above described estimation process of the lev O.

According to an embodiment, the 1-tuple context determining unit 2004 may perform an estimation of the lev 0 using two neighborhood 1-tuples 2018 and 2019 corresponding to a previous frequency of a current frame with respect to the current 1-tuple 2012. When using a plurality of the neighborhood tuples, accuracy of the estimation of the lev 0 may be improved.

According to another embodiment, the 1-tuple context determining unit 2004 may perform the estimation of the lev 0 using at least one of the neighborhood 1-tuples 2018 and 2019 corresponding to the previous frequency of the current frame, with respect to the current 1-tuple 2012, and determine a number of times the scaling down is performed by comparing absolute values of the at least one of the neighborhood 1-tuple corresponding to the previous frequency of the current frame with respect to the current 1-tuple 2012. Specifically, the 1-tuple context determining unit 2004 may change, as the absolute values, values of the at least one of the neighborhood 1-tuple corresponding to the previous frequency of the current frame with respect to the current 1-tuple 2012, and when values obtained while a ½ scaling down is performed reaches a predetermined threshold, the 1-tuple context determining unit 2004 may stop to perform the scaling down to determine, as the estimation value of the lev 0, a value obtained by finally performing the scaling down.

For example, the MSB is defined as being three bites including sign information, the 1-tuple context determining unit 2004 may calculate an absolute value of two neighborhood 1-tuples 2018 and 2019 corresponding to the previous frequency of the current frame with respect to the current 1-tuple 2012, and then when a value obtained while performing the ½ scaling down on the two absolute values reaches 4 or less, the 1-tuple context determining unit 2004 may stop to perform the scaling down to thereby use a value obtained by finally performing the scaling down, as the estimation value of the lev O.

Also, according to an embodiment, the 1-tuple context determining unit 2004 may estimate the lev 0 by selectively using the single neighborhood 1-tuple 2018 or the two neighborhood 1-tuples 2018 and 2019, each of the neighborhood 1-tuples corresponding to the previous frequency of the current frame with respect to the current 1-tuple 2012.

For example, as described above, the lev 0 may be estimated in accordance with a mode of a core. The 1-tuple context determining unit 2004 may estimate the lev 0 using the single neighborhood 1-tuple in a case of the FD mode, and using the two neighborhood 1-tuples in a case of the wLPT mode.

In the wLPT mode, since a frequency spectrum is relatively flat in comparison with the FD mode, the lev 0 may be more effectively estimated using several neighborhood 1-tuples rather than using the single neighborhood 1-tuple, with respect to the current 1-tuple 2012.

Also, the 1-tuple context determining unit 2004 may estimate a number of neighborhood 1-tuples used when estimating the lev 0 based on a tool used when performing an encoding in the FD mode. For example, as the tool used when performing the encoding in the FD mode, a TNS, a TW-MDCT, and the like may be used. In this instance, when the encoding is performed using the TW-MDCT tool in the FD mode, the 1-tuple context determining unit 2004 may estimate the lev 0 using the two neighborhood 1-tuples 2018 and 2019.

Also, the 1-tuple context determining unit 2004 may estimate the lev 0 using the single neighborhood 1-tuple 2018, or using two neighborhood 1-tuples 2018 and 2019, based on information transmitted for each frame. For example, the 1-tuple context determining unit 2004 may estimate the lev 0 in accordance with a number of the neighborhood 1-tuples transmitted for each frame by adopting an arithmetic decoding scheme. Specifically, the 1-tuple context determining unit 2004 may generate a probability model based on a frequency with respect to a number of used neighborhood 1-tuples in accordance with the FD mode or the wLPT mode when performing the arithmetic decoding, and perform an arithmetic decoding by applying the generated probability model as a context.

The MSB context determining unit 2005 may generate an additional context in a case of a specific state, that is, a subset from among entire states mapped in the 1-tuple context determining unit 2004. In this instance, the generated additional context may be combined with the entire states in a process of selecting the probability model when decoding an MSB of the current 1-tuple 2012 in the MSB decoding unit 2008. As for the remaining states excluding the specific state from among the entire states, the MSB decoding unit 2008 may select the probability model using only the entire states.

For example, an MSB context generated through the MSB context determining unit 2005 may be as follows. A context template will be further described with reference to FIG. 22.

(1) an MSB value of the neighborhood 1-tuple 2018 or 2019, that is, a quantized spectrum corresponding to the previous frequency in the current frame or an MSB value of the neighborhood 1-tuple 2015, that is, a quantized spectrum corresponding to the current frequency in the previous frame (2) an MSB value of the quantized spectrum combined with the context template (3) a value extracted by additionally quantizing the neighborhood 1-tuple 2018 or 2019 corresponding to the previous frequency in the current frame or a value extracted by additionally quantizing the neighborhood 1-tuple 2015, that is, a quantized spectrum corresponding to the current frequency in the previous frame (4) a value extracted by additionally quantizing a quantized spectrum combined with the context template (5) a value extracted by additionally quantizing the neighborhood 1-tuples 2013 to 2017, that is, a quantized spectrum of the previous frame (6) a value extracted by changing the neighborhood 1-tuple 2018 or 2019 corresponding to the previous frequency in the current frame or a value extracted by changing the neighborhood 1-tuple 2015, that is, a quantized spectrum corresponding to the current frequency in the previous frame (7) a value extracted by changing a quantized spectrum combined with the context template A method of additionally quantizing the quantized spectrum in the MSB context determining unit 2005 may be as follows.

First, the MSB context determining unit 2005 may additionally perform a quantization on the quantized spectrum in accordance with an FD mode and a wLPT mode.

Second, the MSB context determining unit 2005 may additionally perform the quantization to determine, as a context of a firstly quantized spectrum, a specific scheme in which −4 to 3 is mapped into −4 to 3, more than 4 is mapped into 3, and −5 or less is mapped into −4.

When using the MSB value, the MSB decoding unit 2008 may perform a decoding on the current 1-tuple 2012 by selecting one from MSB values of the neighborhood 1-tuples 2013 to 2019, that is, the quantized spectrum where a lossless encoding is performed on the current frame or the previous frame.

A method of changing the quantized spectrum by the MSB context determining unit 2005 may be as follows.

The MSB context determining unit 2005 may extract a quantized frequency spectrum value by performing a scaling down on the neighborhood 1-tuples 2013 to 2019 by the lev 0 based on an estimation value of the lev 0 of the current 1-tuple 2012, that is, a current frequency spectrum to be subjected to a lossless encoding with respect to the current frame.

The MSB context determining unit 2005 may set the quantized frequency spectrum value as a minimum value or a maximum value when using the quantized frequency spectrum value extracted after performing the scaling down or when the quantized frequency spectrum value is outside a range expressed as a bit number expressing the MSB of the current 1-tuple 2012.

The escape code decoding unit 2007 may perform an escape code encoding when a value changed by performing a ½ scaling down on the current 1-tuple 2012 to be subjected to a lossless encoding by the estimated lev 0 exceeds a value expressed as the bit number defining the MSB of the current N-tuple 2012.

A scheme of performing a decoding on the escape code may include (1) a scheme of performing a decoding on information indicating whether an MSB to be decoded is the escape code and (2) a scheme of performing the decoding on the escape code included in an MSB symbol. Specifically, (1) the scheme of performing the decoding on the information may assign 1 to the escape code, and assign 0 to the escape code when the MSB is not the escape code, and perform a decoding on 0 or 1. When 0 is decoded, the MSB decoding unit 2008 may perform a decoding on the MSB of the current 1-tuple 2012. (2) The scheme of performing the decoding on the escape code may denote a scheme of performing a decoding on one symbol from nine symbols in total obtained by expressing eight MSB symbols and the escape code as a symbol of the same level. For example, the escape code decoding unit 2007 may set 0 to 7 as MSB symbols, and set 9 as the escape code to thereby decode the nine symbols.

The escape code decoding unit 2007 may not perform the encoding on the escape code in a case where a value of the current 1-tuple 2012 is in a range of −4 to 3 when performing a scaling down on the current 1-tuple 2012, that is, a quantized spectrum to be currently decoded by a predicted number of times the ½ scaling down is performed.

In a case where the value of the current 1-tuple 2012 is not in a range of −4 to 3 when performing the scaling down on the current 1-tuple, the escape code decoding unit 2007 may further perform the scaling down on the current 1-tuple 2012 to enable the value of the current 1-tuple 2012 to be included in the range of −4 to 3, and perform the decoding on the escape code by the number of times the scaling down is performed. In this instance, data lost in a process of performing the scaling down may be included in LSBs, and the LSB decoding unit 2009 may perform an encoding on the LSBs.

The probability mapping unit 2006 may map a final probability model using the context of the current 1-tuple 2012 and the MSB context. The probability mapping unit 2006 may use a mapping table and a probability table. A process of mapping the probability model may be a process of obtaining, from the probability table, a probability model to be applied when performing a decoding on the MSB. Specifically, when there exist probability models for all cases, a burden for a size of a memory may be reduced. Thus, to reduce the size of the memory, the probability mapping unit 2006 may use the mapping table to obtain a probability model depending on the context. The mapping table may be configured by assigning an index of the probability table to a total arrangement corresponding to a context of each probability. The probability table may be configured of all probability values used when performing the decoding on the MSB.

The MSB decoding unit 2008 may perform a decoding on an MSB of the current 1-tuple 2012 only using entire states generated in (i) the 1-tuple context determining unit 2004 or may select the probability model using a subset of a specific state from among the entire states generated in (ii) the 1-tuple context determining unit 2004 and using the additional context determined in the MSB context determining unit 1904, and thereby perform an arithmetic decoding on the MSB of the current 1-tuple 2012.

The LSB decoding unit 2009 may perform the arithmetic decoding using remaining bits up to a bit depth of an LSB of the current 1-tuple 2012, as a context. In this instance, the context may include sign information (negative number, 0, positive number) of the MSB of the neighborhood 1-tuple 2015 corresponding to a current frequency of the current 1-tuple 2012. Also, the sign information of the MSB of the neighborhood 1-tuple 2015 may include sign information including the negative number and the positive number excluding 0. Subsequently, the LSB decoding unit 2008 may select the probability model in accordance with the sign information of the MSB of the neighborhood 1-tuple 2015, and then perform a decoding on the LSB.

Also, the LSB decoding unit 2009 may perform the decoding on the LSB using the context determined based on the bit depth of the LSB and the sign information of the MSB of the neighborhood 1-tuple 2014. In this instance, the bit depth of the LSB may be expressed as index (level) information.

The quantized sample generation unit 2010 may generate a quantized sample with respect to a current N-tuple 2012 using arithmetically decoded MSB and LSB.

The context updating unit 2011 may update a quantized sample to decode the next 1-tuple. Subsequently, the MSB context determining unit 2005 may determine an MSB context using the updated quantized sample with respect to the next 1-tuple.

FIG. 21 illustrates a 1-tuple, an MSB, and an LSB according to an embodiment.

In an upper portion of FIG. 21, 1-tuples are illustrated based on a time and a frequency. Here, the 1-tuple may denote a set in which quantized frequency spectrums are bundled in a unit of continuous I-numbered frequency spectrums, in a frequency-increasing order. The N-tuples are described with reference to FIG. 4, however, 1-tuples will be further described with reference to FIG. 21. Seven neighborhood 1-tuples 2102 to 2108 are already encoded or decoded, and may be used when determining the context of the current 1-tuple 2101. In this instance, neighborhood 1-tuples 2102 to 2106 may correspond to a previous frame, and neighborhood 1-tuples 2107 and 2108 may correspond to a current frame identical to the current 1-tuple 2101.

In a lower portion of FIG. 21, an MSB 2109 and an LSB 2110 are illustrated based on a frequency index and a bit depth. In this instance, the MSB 2109 may denote an MSB including sign information. According to an embodiment, the MSB 2109 may be denoted as being available three bits. The definition of the MSB may be changed based on a configuration of a system.

Referring to FIG. 21, the LSB 2110 may denote bits having a bit depth greater than that of the MSB 2109. In this instance, the LSB 2110 may have a value of level. The level may be a value determined by a combination of the MSBs of the contexts, and a bit depth of '0' may signify an LSB 2110 located immediately below the MSB 2109. The 1-tuple may correspond to the MSB 2109, and may be divided into symbols in accordance with a frequency index. For example, in FIG. 21, the 1-tuple may be configured of a single symbol. Subsequently, the current 1-tuple 2101 may divide the single symbol according to a frequency to be encoded or decoded. Specifically, the MSB 2109 may be decoded or encoded in a symbol unit. In this instance, the tuple may correspond to the symbol. In FIG. 21, the single symbol included in the 1-tuple is illustrated, however, a number of the symbols may be changeable in accordance with a system.

Figure 22:
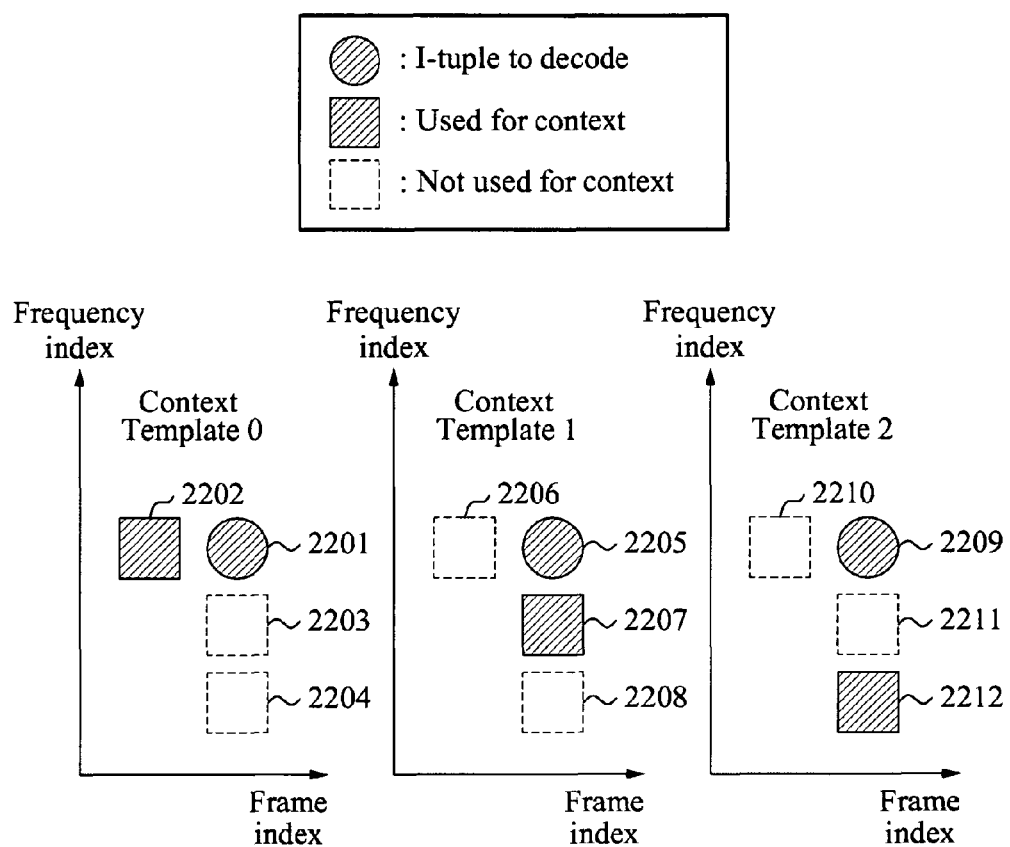
FIG. 22 illustrates an example of a context template according to an embodiment.

FIG. 22 illustrates an example of a context template according to an embodiment.

In FIG. 19, the MSB context determining unit 1904 may determine the MSB context using the context template. The context template may be configured as illustrated in FIG. 22.

Current 1-tuples 2201, 2205, and 2209 may denote tuples to be currently encoded. Neighborhood 1-tuples 2202, 2207, and 2212 may denote tuples used as an MSB context in accordance with the context template. Information about the context template may be transmitted once from an encoding apparatus to a frame by an arithmetic encoding scheme, and a probability model may be determined based on a generation frequency using the information about the context template. Also, the context template may be determined differently depending on a low frequency band and a high frequency band.

Figure 23:
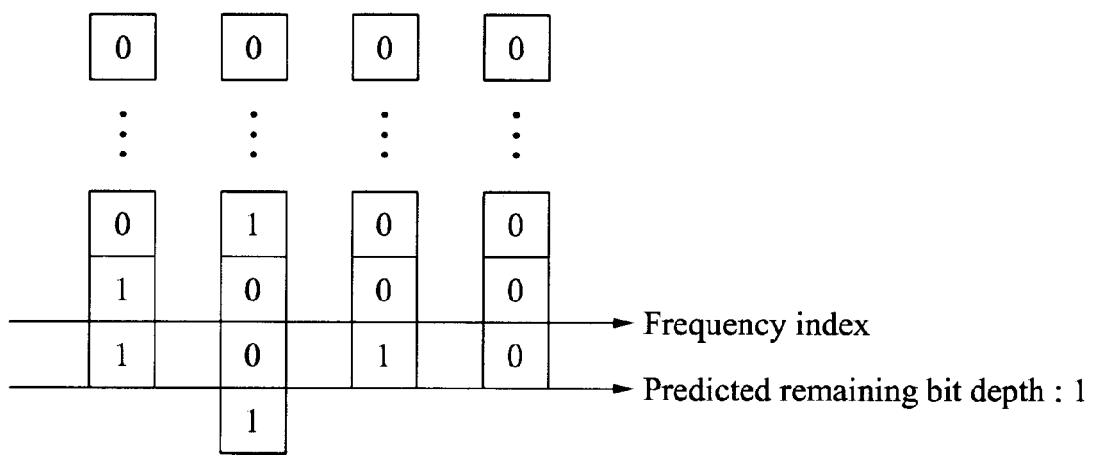
FIG. 23 illustrates a process of a spectral noiseless coding according to an embodiment.

FIG. 23 illustrates a process of a spectral noiseless coding according to an embodiment.

The spectral noiseless coding may denote a coding method to losslessly transmit quantized data from an encoding apparatus to a decoding apparatus. Specifically, the spectral noiseless coding may transmit the quantized data using a bit plane coding scheme. In this instance, the bit plane coding scheme may display the quantized data as a binary, and transmit a value expressed in a bit unit or as several bits. For example, when the quantized spectrum is (3, 7, 1, 0), a sequence of (11, 1001, 1, 0) where the quantized spectrum is expressed as the binary may be transmitted by the bit plane coding scheme. To restore the quantized data through the transmitted sequence, information indicating that each value constituting the sequence is expressed as 2 bits, 4 bits, 1 bit, and 1 bit may be further required.

The expressed bits may be information corresponding to a bit depth, and when the expressed bits are transmitted, as they are, to the decoding apparatus, an amount of the information may increase. To prevent the amount of the information from increasing, the encoding apparatus may predict a bit depth of a quantized spectrum to be transmitted, based on values neighboring the quantized spectrum, and transmit the predicted value up to the bit depth to the decoding apparatus. When the predicted bit depth is expressed as data having a greater bit depth, the encoding apparatus may transmit a number of remaining bits and the remaining bits to the decoding apparatus.

As illustrated in FIG. 23, when encoding (11, 1001, 1, 0), the spectral noiseless coding that transmits three bits including sign information and transmits remaining bits after predicting the bit depth is adopted.

All data at the time of transmission may be processed by an arithmetic decoding scheme based on a context. In this instance, 4-tuples may be configured in a unit of four spectral lines, and 1-tuple may be configured of a single spectral line. Hereinafter, the 4-tuples will be further described.

When the remaining bit depth is estimated as 1, the decoding apparatus may predict level information corresponding to a bit depth. The decoding apparatus may decode an MSB (three bits including sign information) of (1, 2, 0, 0), which is referred to as an MSB decoding. Subsequently, the decoding apparatus may decode additional remaining bits (0 bit, 1 bit, 1 bit, 0 bit). These additional remaining bits may correspond to an escape code frequency. Subsequently, the decoding apparatus may decode the remaining bits of LSBs in accordance with a number of the remaining bits, which is referred to as an LSB decoding.

Figure 24:
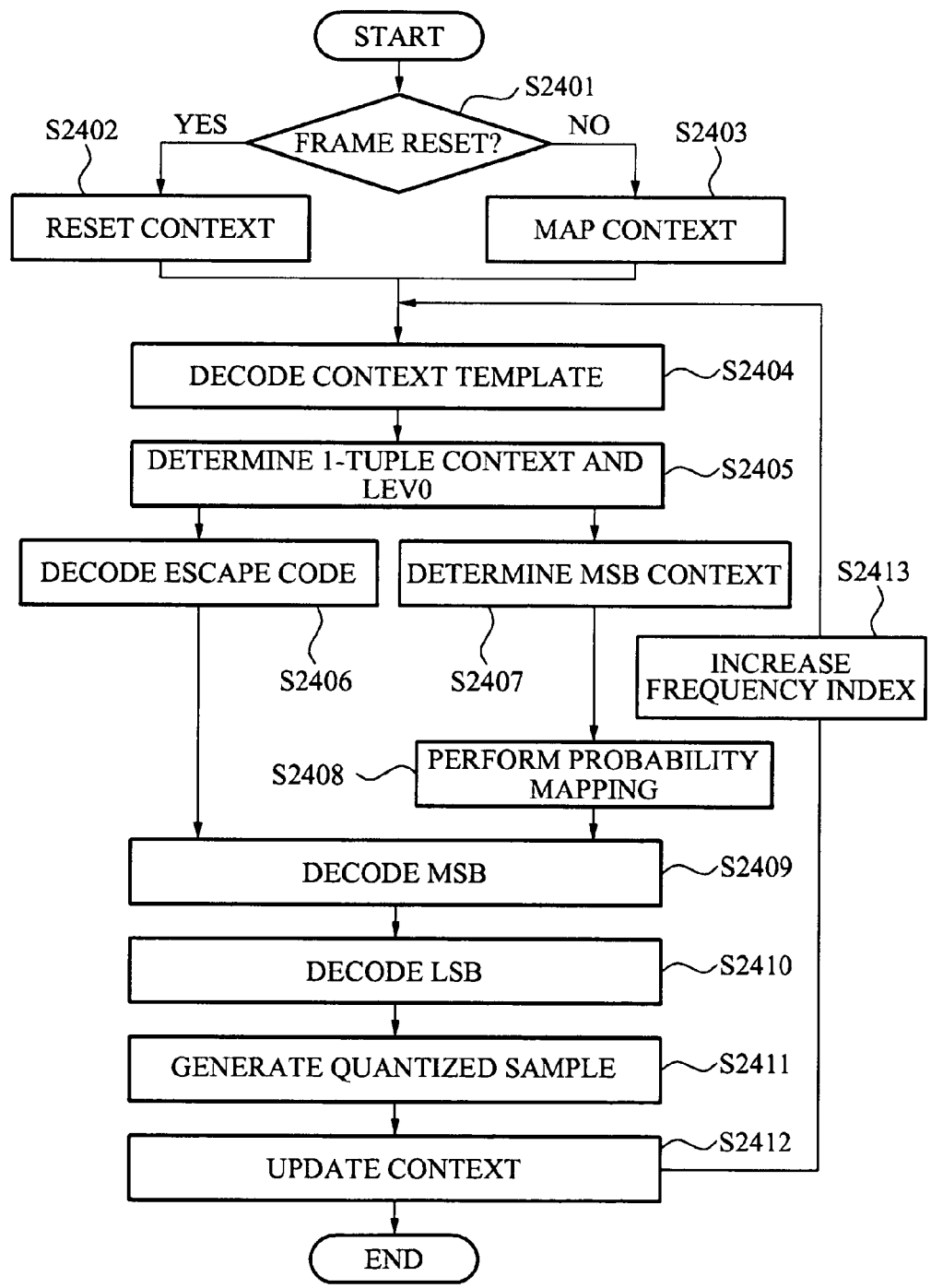
FIG. 24 is a flowchart illustrating a context-based arithmetic decoding method with respect to a 1-tuple according to an embodiment.

FIG. 24 is a flowchart illustrating a context-based arithmetic decoding method with respect to a 1-tuple according to an embodiment.

In operation S2401, the arithmetic decoding apparatus 101 may determine whether a current frame is a reset frame. In operation S2402, when the current frame is the reset frame, the arithmetic decoding apparatus 101 may perform a context reset. In operation S2403, when the current frame is not the reset frame, the arithmetic decoding apparatus 101 may map a context. Specifically, the arithmetic decoding apparatus 101 may regularize a length of a previous frame as a length of the current frame to thereby map the context so that a frequency index between two frames may be mapped in a case where the length of the current frame is different from the length of the previous frame.

In operations S2401 to S2403 may be performed in a frame unit.

In operation S2404, the arithmetic decoding apparatus 101 may perform a decoding on a single context template finally transmitted from among a plurality of contexts to be used when performing a decoding on an MSB of a current 1-tuple. The context template will be further described with reference to FIG. 22. Subsequently, the arithmetic decoding apparatus 101 may determine a 1-tuple context of the current I-tuple, and determine a lev 0 of the current 1-tuple. In this instance, the arithmetic decoding apparatus 101 may estimate the lev 0, that is, an initial LSB's bit depth. The operation of determining of the I-tuple context of the current Ituple, and the operation of estimating the lev 0 may refer to the descriptions of FIG. 20.

In operation S2406, the arithmetic decoding apparatus 101 may perform a decoding on an escape code based on a context (pki) of the 1-tuple and FD/wLPT modes. In operation S2409, whenever the escape code is decoded, the arithmetic decoding apparatus 101 may update the lev 0, and when a value different from the escape code is decoded, the arithmetic decoding apparatus 101 may perform the decoding on the MSB.

In operation S2407, the arithmetic decoding apparatus 101 may determine an MSB context corresponding to an MSB of the current 1-tuple to be currently decoded. In operation S2408, the arithmetic decoding apparatus 101 may determine an appropriate probability model based on the 1-tuple context and the MSB context.

In operation S2409, the arithmetic decoding apparatus 101 may perform the decoding on the MSB based on the probability model.

In operation S2410, the arithmetic decoding apparatus may perform a decoding on bits corresponding to a bit depth of an LSB derived from the decoding of the escape code. In operation S2411, the arithmetic decoding apparatus 101 may generate a quantized sample through the MSB and LSB. In operation S2412, the arithmetic decoding apparatus may update a context to decode the next 1-tuple. In operation S2413, the arithmetic decoding apparatus may increase a frequency index to thereby perform a decoding on the next 1-tuple.

In this instance, the 2-tuple may denote an example of the N-tuple, 2-tuples 401, 402, 403, 404, and 405 denote 2-tuple composed of two frequency spectrum. A current 2-tuple 404 may denote a 2-tuple to be encoded or decoded. 4 numbered neighborhood 2-tuples 401, 402, 403, and 405 having been already decoded and encoded may be used when determining a context of the current 2-tuple 404. In this instance, the neighborhood 2-tuples 401, 403, and 405 may correspond to a previous frame, and the neighborhood 2-tuple 402 may correspond to a current frame identical to the current 2-tuple 404.

Figure 25:
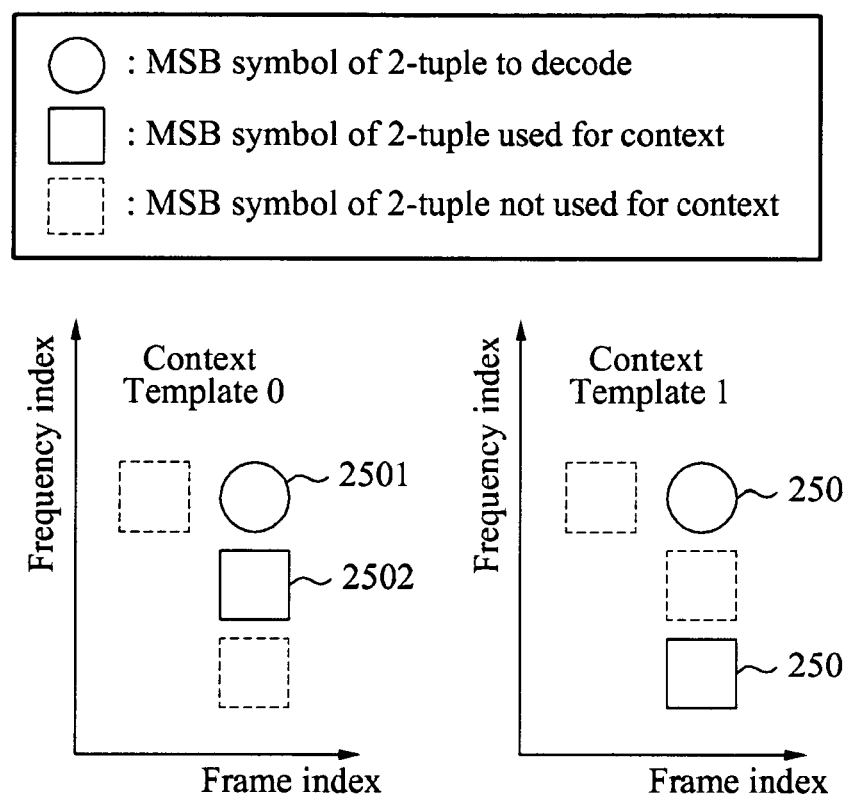
FIG. 25 illustrates a context template with respect to a 2-tuple according to an embodiment.

FIG. 25 illustrates a context template with respect to a 2-tuple according to an embodiment.

A current 2-tuple 2501 may denote a tuple to be currently encoded. Neighborhood 2-tuples 2502 and 2503 may denote tuples to be used as an MSB context in accordance with a context template. Information about the context template may be transmitted once from an encoding apparatus to a frame by an arithmetic encoding scheme, and a probability model may be determined based on a generation frequency using the information about the context template. Also, the context template may be determined differently depending on a low frequency band and a high frequency band.

Figure 26:
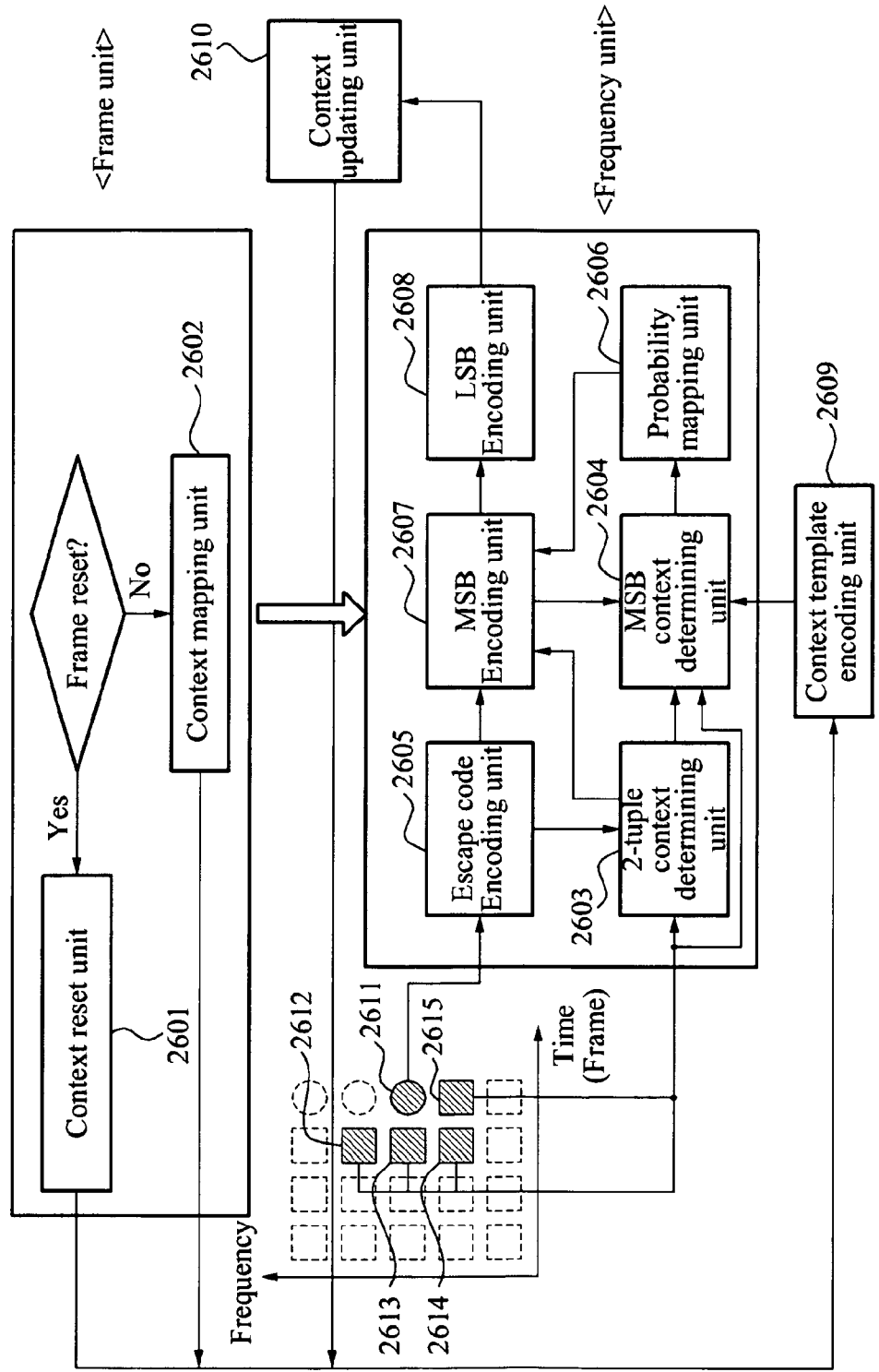
FIG. 26 illustrates a configuration of a fourth example of an arithmetic encoding apparatus according to an embodiment, in detail.

FIG. 26 illustrates a configuration of a fourth example of an arithmetic encoding apparatus 100 according to an embodiment, in detail.

The arithmetic encoding apparatus 100 includes a context reset unit 2601, a context mapping unit 2602, a 2-tuple context determining unit 2603, an additional context determining unit 2604, an escape code encoding unit 2605, a probability mapping unit 2606, an MSB encoding unit 2607, an LSB encoding unit 2608, a context template encoding unit 2609, and a context updating unit 2610.

The context reset unit 2601 and the context mapping unit 2602 may be performed in the same manner as that in the context reset unit 1901 and the context mapping unit 1902, and thus further descriptions thereof will be omitted.

A 2-tuple context determining unit 2603 may determine a context of a current 2-tuple 2611 to be encoded, using a quantized spectrum value of neighborhood 2-tuples 2612 to 2615 neighboring the current 2-tuple 2611. For example, the 2-tuple context determining unit 2603 may determine the context of the current 2-tuple 2611 using four neighborhood 2-tuples 2612 to 2615 having been encoded.

The arithmetic encoding apparatus 100 may divide an input signal into MSB symbols and remaining bits to perform an encoding on the MSB symbols and the remaining bits. Specifically, the arithmetic encoding apparatus 100 may divide the current 2-tuple 2611 corresponding to a quantized frequency spectrum into absolute values and sign information to perform the encoding on the absolute values and the sign information. In this instance, an absolute value of the current 2-tuple 2611 may be divided into an MSB symbol and the remaining LSB to perform the encoding on the MSB symbol and the remaining LSB. A ½ scaling down may be performed on an absolute value of the MSB symbol until the absolute value becomes less than a predetermined threshold. Subsequently, the escape code encoding unit 2605 may perform an encoding on the escape code by a number of times the ½ scaling down is performed.

The remaining LSB may denote bits removed whenever the ½ scaling down is performed on the absolute value of the MSB symbol. When the encoding on the MSB of the current 2-tuple 2611 is completed, an encoding may be performed on the remaining LSB. When the encoding on the 2-tuple corresponding to all quantized spectrums with respect to a current frame is completed, sign information of the quantized spectrum different from 0 may be encoded.

When the scaling down is performed on the MSB symbol, the predetermined threshold may be set as 4. When the predetermined threshold is 4, the MSB may be four cases of 0, 1, 2, and 3. Since two frequency spectrums of the 2-tuples are bundled and processed, the arithmetic encoding apparatus 100 may perform a scaling down on an absolute value of each of the two quantized frequency spectrums corresponding to the current 2-tuple 2611 until each of the two quantized frequency spectrums becomes less than a predetermined threshold.

The arithmetic encoding apparatus 100 may perform a text-based arithmetic encoding using four neighborhood 2-tuples 2612 to 2615 of the current 2-tuple 2611. Specifically, the 2-tuple context determining unit 2603 may additionally quantize quantized spectrums of the three neighborhood 2-tuples 2612 to 2614 corresponding to a previous frame, and two quantized spectrums within the three neighborhood 2-tuples 2612 to 2614 may be expressed as two bits (3*2*2=12). The 2-tuple context determining unit 2603 may generate a 2-tuple context using the two quantized frequency spectrums corresponding to a single neighborhood 2-tuple 2615 corresponding to a previous frequency of a current frame. The generated 2-tuple context may be implemented by a hash table.

The escape code encoding unit 2605 may perform an encoding on an escape code using the generated 2-tuple context. Specifically, the escape code encoding unit 2605 may configure a predetermined number M of probability models by a training, and select one of the M number of probability models to perform an arithmetic encoding on the selected one.

When a value different from the escape code is encoded, the MSB encoding unit 2602 may perform an encoding on the MSB symbol of the current 2-tuple 2611.

Perform Encoding on Current 2-Tuple Based on 2-Tuple Context

For example, the MSB encoding unit 2607 may perform an encoding on the MSB symbol of the current 2-tuple 2611 based on the 2-tuple context generated by the 2-tuple context determining unit 2603. In this instance, the MSB encoding unit 2607 may bundle two MSB symbols of the current 2-tuple 2611 based on the 2-tuple context to perform an encoding on the bundled two MSB symbols. For example, the MSB encoding unit 2607 may express two MSB symbols having a value of 0 to 3 as a single symbol to thereby perform an encoding on the single symbol. In this case, an arithmetic encoding may be performed once on a single current 2-tuple 2611 through 16 symbols in total.

Perform encoding on current 2-tuple based on 2-tuple context in a certain case, and based on 2-tuple context and additional context in another certain case.

For example, the MSB encoding unit 2607 may perform an arithmetic encoding on the MSB symbol of the current 2-tuple 2611 based on the 2-tuple context in a certain case.

Also, the MSB encoding unit 2607 may perform the arithmetic encoding on the MSB symbol of the current 2-tuple 2611 based on the 2-tuple context and the additional context in another certain case. In this instance, the additional context may denote an MSB symbol of the neighborhood 2-tuple 2615 corresponding to a previous frequency of a current frame, with respect to the current 2-tuple 2611.

In this case, the MSB encoding unit 2607 may perform the arithmetic encoding twice by expressing the current 2-tuple 2611 as two MSB symbols. When the arithmetic encoding is performed twice, an MSB symbol to be used as the additional context may be the neighborhood 2-tuple 2602 or 2603 of FIG. 26. That is, the MSB encoding unit 2607 may determine the neighborhood 2-tuple 2602 or 2603 as the additional context based on context template information, with respect to the current 2-tuple 2611.

Perform Encoding on Current 2-Tuple Based on 2-Tuple Context and Additional Context in all Cases For example, the MSB encoding unit 2607 may perform the arithmetic encoding on the MSB symbol of the current 2-tuple 2611 based on the 2-tuple context and the additional context in all cases. The 2-tuple context and the additional context were described as above, and will be herein omitted.

The context template encoding unit 2609 may perform an encoding on the context template. Context template information may be transmitted when encoding input signals. The context template may be encoded by an arithmetic encoding scheme, and transmitted once for each frame. In this instance, the frame may denote a single frame in a case of an FD coding mode, and may denote a frame that may be encoded to a TCX within a super frame in a case of an LPD coding mode.

The context template information may be divided into a low frequency domain and a high frequency domain to be transmitted. For example, the context template information may be assigned differently depending on a frequency domain. The context template information may be expressed as the low frequency domain and the high frequency domain through two bits. In this instance, four cases of 0, 1, 2, 3 may be expressed. When the context template information is 0, both the low frequency domain and the high frequency domain may have the context template of 0, and when the context template information is 1, the low frequency domain may have the context template of 1, and the high frequency domain may have the context template of 0. Also, when the context template information is 2, the low frequency domain may have the context template of 0, and the high frequency domain may have the context template of 1. When the context template information is 3, both the low frequency domain and the high frequency domain may have the context template of 1.

For example, when an absolute value of the spectrum subsequent to the current 2-tuple 2611 is 0 or 1, the MSB encoding unit 2607 may perform a binary arithmetic encoding to encode the MSB symbol of the current 2-tuple 2611. Specifically, when the absolute value of the quantized spectrum of all frequencies subsequent to the current 2-tuple 2611 is 0 or 1, the MSB encoding unit 2607 may perform an exception handling to perform an encoding on an MSB of the current 2-tuple 2611. For example, since the escape code may not be encoded when all symbols of the 2-tuples are 0, and based on this, the exception handling may be performed to perform the encoding on the MSB of the current 2-tuple 2611. That is, the escape code encoding unit 2607 may perform the encoding on the escape code before the MSB encoding unit 2607 encodes, into 0, the current 2-tuple 2611 to be currently encoded.

For example, the LSB encoding unit 2608 may perform an encoding on remaining LSBs of the current 2-tuple 2611 based on a uniform probability, after the encoding is performed on the MSB symbol. The LSB encoding unit 2608 may perform the encoding on the remaining LSBs of the current 2-tuple 2611 by extracting the remaining LSBs by 2 bits in a bit depth unit, the same number of times the escape code is performed.

Four symbols in total may exist, and the LSB encoding unit 2608 may perform the arithmetic encoding on the four symbols.

For another example, the LSB encoding unit 2608 may perform an encoding on context-based LSBs with respect to the current 2-tuple 2611 using the bit depth. Specifically, the LSB encoding unit 2608 may divide the remaining LSBs of the current 2-tuple 2611 into two based on a frequency index, and perform an arithmetic encoding on the divided remaining LSBs in the bit depth by one bit, using bit depth information as a context.

For another example, the LSB encoding unit 2608 may perform the encoding on the remaining LSBs of the current 2-tuple 2611 based on information indicating whether an absolute value having been encoded so far is O. Specifically, the LSB encoding unit 2608 may divide, into two, the remaining LSBs of the current 2-tuple 2611 to be encoded, based on a frequency index, and perform the arithmetic encoding on the divided remaining LSBs using, as a context, information indicating whether an absolute to be currently encoded is O.

For example, it is assumed that, when encoding an absolute value of 3, the MSB is encoded into 0 before performing the encoding on the remaining LSBs, and the remaining LSBs of 11 (binary) is encoded twice.

Since an absolute value having been encoded so far is 0 when encoding the remaining LSB of 1, the LSB encoding unit 2608 may encode a first remaining LSB by applying a probability model in a case of O. Since an absolute value having been encoded so far is 1 including the first remaining LSB when encoding a second remaining LSB of 1, the LSB encoding unit 2608 may encode a second remaining LSB by applying a probability model in a case of being different from O.

For another example, the LSB encoding unit 2608 may encode the remaining LSBs of the current 2-tuple 2611 based on information indicating whether the absolute value having been encoded so far is O. Specifically, the LSB encoding unit 2608 may extract the remaining LSBs of the current 2-tuple 2611 to be encoded, by 2 bits in a bit depth, and perform an arithmetic encoding on the extracted remaining LSBs using, as a context, information indicating whether an absolute value to be currently encoded is O. Remaining LSB symbols to be encoded may be four cases of 00(2), 01(2), 10(2), and 11(2). Since two cases where an absolute value of the current 2-tuple used as the context is 0 or not are considered, there may exist four cases such as a case where two absolute values of the 2-tuples are 0, a case where a low frequency value is 0 and a high frequency value is not 0, a case where the low frequency value is 0 and the high frequency value is 0, and a case where the low frequency value and the high frequency value is O. However, in the case where both the low frequency value and the high frequency value is 0, there is no need to perform the encoding on the remaining LSBs, and thus the arithmetic encoding may be performed using the remaining three cases as the context.

For another example, the LSB encoding unit 2608 may encode sign information. Specifically, when the absolute value is not 0 after the encoding on each of the absolute values of the quantized spectrums is completed, the LSB encoding unit 2608 may transmit sign information of each of the quantized spectrums by adopting a bit packing scheme.

Components not described in FIG. 26 may refer to the descriptions of FIG. 10.

Figure 27:
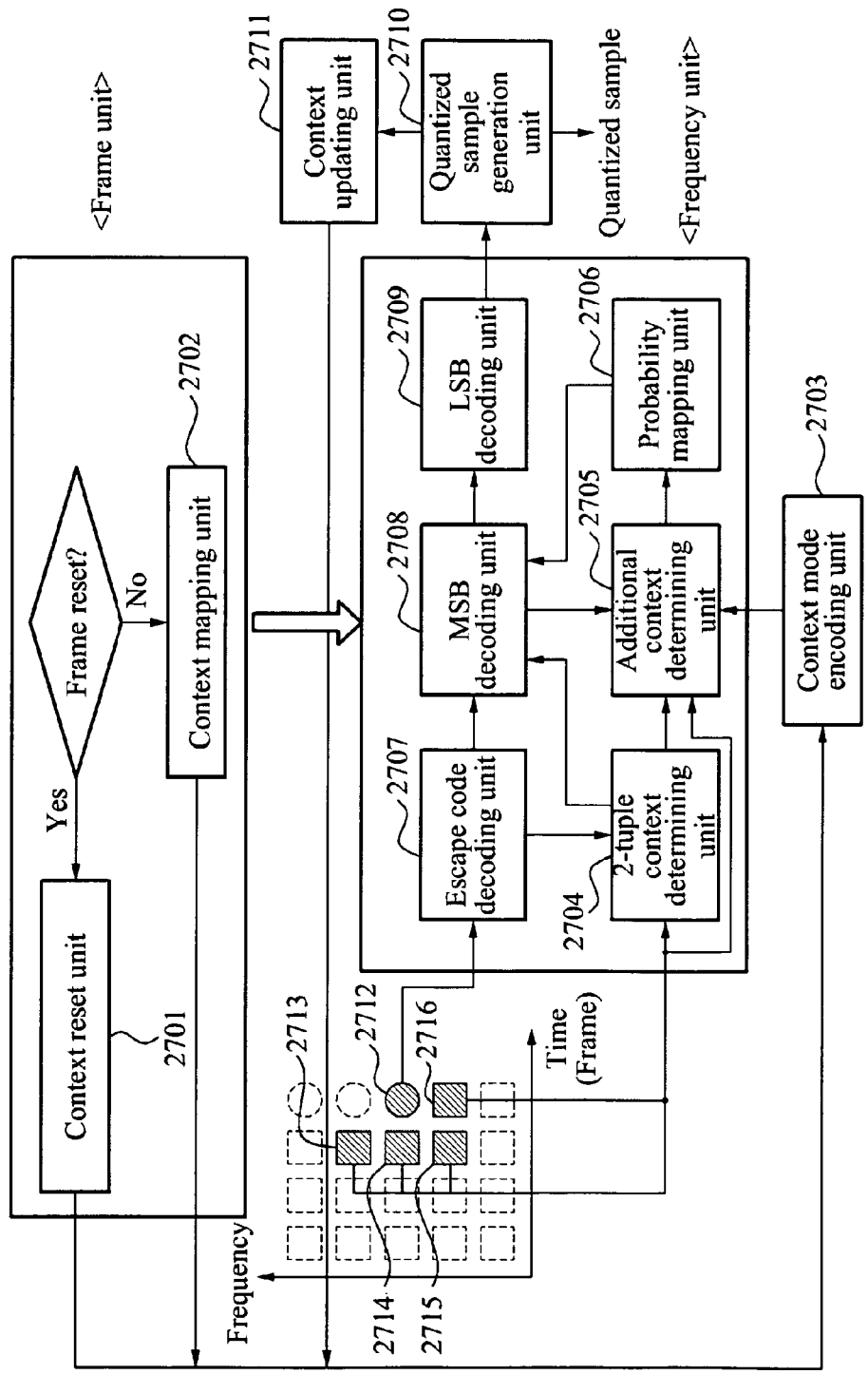
FIG. 27 illustrates a configuration of a fourth example of an arithmetic decoding apparatus according to an embodiment, in detail.

FIG. 27 illustrates a configuration of a fourth example of an arithmetic decoding apparatus according to an embodiment, in detail.

The arithmetic decoding apparatus 101 includes a context reset unit 2701, a context mapping unit 2702, a context template decoding unit 2703, a 2-tuple context determining unit 2704, an additional context determining unit 2705, a probability mapping unit 2706, an escape code decoding unit 2707, an MSB decoding unit 2708, an LSB decoding unit 2709, a quantized sample generation unit 2710, and a context updating unit 2711.

The context reset unit 2701 and the context mapping unit 2702 may be performed in the same manner as that in the context reset unit 2001 and the context mapping unit 2002, and thus further descriptions thereof will be omitted.

The 2-tuple context determining unit 2704 may determine a context of a current 2-tuple 2712 to be decoded, using a quantized spectrum value of neighborhood 2-tuples 2713 to 2716 neighboring the current 2-tuple 2712. For example, the 2-tuple context determining unit 2703 may determine the context of the current 2-tuple 2712 using four neighborhood 2-tuples 2713 to 2716 having been decoded.

The arithmetic decoding apparatus 101 may divide an input signal into MSB symbols and remaining bits to perform a decoding on the MSB symbols and the remaining bits. Specifically, the arithmetic decoding apparatus 101 may divide the current 2-tuple 2712 corresponding to a quantized frequency spectrum into absolute values and sign information to perform a decoding on the absolute values and the sign information. In this instance, an absolute value of the current 2-tuple 2712 may be divided into the MSB symbol and the remaining LSB to perform a decoding on the MSB symbol and the remaining LSB. A ½ scaling down may be performed on an absolute value of the MSB symbol until the absolute value becomes less than a predetermined threshold. Subsequently, the escape code decoding unit 2707 may perform a decoding on the escape code by a number of times the ½ scaling down is performed.

The remaining LSB may denote bits removed whenever the ½ scaling down is performed on the absolute value of the MSB symbol. When the decoding on the MSB of the current 2-tuple 2712 is completed, a decoding may be performed on the remaining LSB. When the decoding on the 2-tuple corresponding to all quantized spectrums with respect to a current frame is completed, sign information of the quantized spectrum different from 0 may be decoded.

When the scaling down is performed on the MSB symbol, the predetermined threshold may be set as 4. When the predetermined threshold is 4, the MSB may be four cases of 0, 1, 2, and 3. Since two frequency spectrums of the 2-tuples are bundled and processed, the arithmetic decoding apparatus 101 may perform a scaling down on an absolute value of each of the two quantized frequency spectrums corresponding to the current 2-tuple 2712 until each of the two quantized frequency spectrums becomes less than a predetermined threshold.

The arithmetic decoding apparatus 101 may perform a text-based arithmetic decoding using four neighborhood 2-tuples 2713 to 2716 of the current 2-tuple 2712. Specifically, the 2-tuple context determining unit 2704 may additionally quantize quantized spectrums of the three neighborhood 2-tuples 2713 to 2716 corresponding to a previous frame, and two quantized spectrums within the three neighborhood 2-tuples 2713 to 2716 may be expressed as two bits (3*2*2=12). The 2-tuple context determining unit 2704 may generate a 2-tuple context using the two quantized frequency spectrums corresponding to a single neighborhood 2-tuple 2716 corresponding to a previous frequency of a current frame. The generated 2-tuple context may be implemented by a hash table.

The escape code decoding unit 2707 may perform a decoding on an escape code using the generated 2-tuple context. Specifically, the escape code decoding unit 2707 may configure a predetermined number M of probability models by a training, and select one of the M number of probability models to perform an arithmetic decoding on the selected one.

When a value different from the escape code is decoded, the MSB decoding unit 2708 may perform a decoding on the MSB symbol of the current 2-tuple 2712.

Perform Decoding on Current 2-Tuple Based on 2-Tuple Context

For example, the MSB decoding unit 2708 may perform a decoding on the MSB symbol of the current 2-tuple 2712 based on the 2-tuple context generated by the 2-tuple context determining unit 2704. In this instance, the MSB decoding unit 2708 may bundle two MSB symbols of the current 2-tuple 2712 based on the 2-tuple context to perform a decoding on the bundled two MSB symbols. For example, the MSB decoding unit 2708 may express two MSB symbols having a value of 0 to 3 as a single symbol to thereby perform a decoding on the single symbol. In this case, an arithmetic decoding may be performed once on a single current 2-tuple 2712 through 16 symbols in total.

Perform decoding on current 2-tuple based on 2-tuple context in a certain case, and based on 2-tuple context and additional context in another certain case.

For example, the MSB decoding unit 2708 may perform an arithmetic decoding on the MSB symbol of the current 2-tuple 2712 based on the 2-tuple context in a certain case. Also, the MSB decoding unit 2708 may perform the arithmetic decoding on the MSB symbol of the current 2-tuple 2712 based on the 2-tuple context and the additional context in another certain case. In this instance, the additional context may denote an MSB symbol of the neighborhood 2-tuple 2716 corresponding to a previous frequency of a current frame with respect to the current 2-tuple 2712.

In this case, the MSB decoding unit 2708 may perform the arithmetic decoding twice by expressing the current 2-tuple 2712 as two MSB symbols. When the arithmetic decoding is performed twice, an MSB symbol to be used as the additional context may be the neighborhood 2-tuple 2602 or 2603 of FIG. 26. That is, the MSB decoding unit 2708 may determine the neighborhood 2-tuple 2602 or 2603 as the additional context based on context template information, with respect to the current 2-tuple 2712.

Case □ is indicated as below syntax. 'i' is frequency index to currently decode. a0, b0 are MSB symbol of 2-tuples of previous frequency, and a, b are MSB symbol to currently decode.

```
if (IsMSBContext(pki)) {
    lut=arith_lut(ctxt,a0,b0,i,lg,pki);
        acod_m1[lut][a] 1..20 Vlclbf
    lut=arith_lut(ctxt,b0,a,i,lg,pki);
        acod_m1[lut][b] 1..20 Vlclbf
        m=4*a+b;
    } else {
    acod_m [pki][m]       1..20 Vlclbf
            b=m/4;
            a=m-4*b;
        }
        a0=a;
        b0=b;
```

IsMSBContext ( ) Function that returns whether 2-tuple coding or 1-tuple coding with additional MSB context is used depending on the 'pki' as Table 1+1 arith_lut( ) Function that returns the index of look-up table for the cumulative frequencies table necessary to decode the codeword acodm1 [Iut][a] or acodm_1 [Iut][b].

a0,b0 Most significant bitplane of the previous 2-tuple in the current frame m Index of the most significant 2-bits-wise plane of the 2-tuple, where 0<=m<=15 a,b 2-tuple corresponding to quantized spectral coefficients

Ig Number of quantized coefficients to decode.

pki Index of the cumulative frequencies table used by the arithmetic decoder for decoding ng.

acod_m[ ][ ] Arithmetic codeword necessary for arithmetic decoding of the most significant 2-bits-wise plane of the 2-tuple.

acod_m$^1$[ ][ ] Arithmetic codeword necessary for arithmetic decoding of the most significant 2-bits-wise plane of the 1-tuple.

□. Perform decoding on current 2-tuple based on 2-tuple context and additional context in all cases For example, the MSB decoding unit 2708 may perform the arithmetic decoding on the MSB symbol of the current 2-tuple 2712 based on the 2-tuple context and the additional context in all cases. The 2-tuple context and the additional context were described as above, and will be herein omitted.

Case □ is indicated as below syntax. 'i' is frequency index to currently decode. a0, b0 are MSB symbol of 2-tuples of previous frequency, and a, b are MSB symbol to currently decode. 'pki' denotes 2-tuple context, 'ctxt' denotes context template of MSB to currently decode. If the decoded symbol is escape symbol, 'esc' symbol is decoded based 'pki', if the decoded symbol is not escape symbol, MSB symbol is decoded. A and b is decoded using additional context based 'ctxt'.

```
acod_esc[pki][esc];       1..20 Vlclbf
    if ( esc != ARITH_ESCAPE){
    lut=arith_lut(ctxt,a0,b0,i,lg/2,pki);
        acod_m1[lut][a]
```

-continued

```
    lut=arith_lut(ctxt,b0,a,i,lg/2,pki);
        acod_m1[lut][b]
    break;
    }
```

The context template decoding unit 2703 may perform a decoding on the context template. Context template information may be transmitted when decoding input signals. The context template may be decoded by an arithmetic decoding scheme, and transmitted once for each frame. In this instance, the frame may denote a single frame in a case of an FD coding mode, and may denote a frame that may be decoded to a TCX within a super frame in a case of an LPD coding mode.

The context template information may be divided into a low frequency domain and a high frequency domain to be transmitted. For example, the context template information may be assigned differently depending on a frequency domain. The context template information may be expressed as the low frequency domain and the high frequency domain through two bits. In this instance, four cases of 0, 1, 2, 3 may be expressed. When the context template information is 0, both the low frequency domain and the high frequency domain may have the context template of 0, and when the context template information is 1, the low frequency domain may have the context template of 1, and the high frequency domain may have the context template of O. Also, when the context template information is 2, the low frequency domain may have the context template of 0, and the high frequency domain may have the context template of 1. When the context template information is 3, both the low frequency domain and the high frequency domain may have the context template of 1.

For example, the LSB decoding unit 2709 may perform a decoding on remaining LSBs of the current 2-tuple 2712 based on a uniform probability, after the encoding is performed on the MSB symbol. The LSB decoding unit 2709 may perform the decoding on the remaining LSBs of the current 2-tuple 2712 by extracting the remaining LSBs by 2 bits in a bit depth unit, the same number of times the escape code is performed.

Four symbols in total may exist, and the LSB decoding unit 2709 may perform the arithmetic decoding on the four symbols.

For another example, the LSB decoding unit 2709 may perform a decoding on context-based LSBs with respect to the current 2-tuple 2712 using the bit depth. Specifically, the LSB decoding unit 2709 may divide the remaining LSBs of the current 2-tuple 2712 into two based on a frequency index, and perform an arithmetic decoding on the divided remaining LSBs in the bit depth by one bit, using bit depth information as a context.

For another example, the LSB decoding unit 2709 may perform the decoding on the remaining LSBs of the current 2-tuple 2712 based on information indicating whether an absolute value having been decoded so far is 0. Specifically, the LSB decoding unit 2709 may divide, into two, the remaining LSBs of the current 2-tuple 2712 to be decoded, based on a frequency index, and perform the arithmetic decoding on the divided remaining LSBs using, as a context, information indicating whether an absolute to be currently decoded is O.

For example, it is assumed that, when decoding an absolute value of 3, the MSB is decoded into 0 before performing the decoding on the remaining LSBs, and the remaining LSBs of 11 (binary) is decoded twice.

Since an absolute value having been decoded so far is 0 when decoding the remaining LSB of 1, the LSB decoding unit 2708 may decode a first remaining LSB by applying a probability model in a case of 0. Since an absolute value having been decoded so far is 1 including the first remaining LSB when decoding a second remaining LSB of 1, the LSB decoding unit 2709 may decode a second remaining LSB by applying a probability model in a case of being different from 0.

For another example, the LSB decoding unit 2709 may decode the remaining LSBs of the current 2-tuple 2712 based on information indicating whether the absolute value having been decoded so far is O. Specifically, the LSB decoding unit 2709 may extract the remaining LSBs of the current 2-tuple 2712 to be currently decoded, in a bit unit by two bits. In this instance, the arithmetic decoding may be performed using, as the context, the information indicating whether the absolute value to be currently decoded is 0 or not. Remaining LSB symbols to be encoded may be four cases of 00(2), 01(2), 10(2), and 11(2). Since two cases where an absolute value of the current 2-tuple used as the context is 0 or not are considered, there may exist four cases such as a case where two absolute values of the 2-tuples are 0, a case where a low frequency value is 0 and a high frequency value is not 0, a case where the low frequency value is 0 and the high frequency value is 0, and a case where the low frequency value and the high frequency value is 0. However, in the case where both the low frequency value and the high frequency value is O, there is no need to perform the decoding on the remaining LSBs, and thus the arithmetic decoding may be performed using the remaining three cases as the context. Each of the 2 bits decoded, as described above, in the bit depth unit may denote a 1 bit, that is an LSB value of the low frequency of the 2-tuple, and denote a 1 bit, that is, an LSB value of the high frequency of the 2-tuple.

Upper description is indicated as below syntax. Here, a, b is absolute value of 2-tuples to currently decode, r denotes low remaining bit to decode.

```
for (l=level; l>0; l--) {
    acod_r[(a==0)?1:((b==0)?0:2)][r] 1..20 Vlclbf
        a=(a<<1)|(r&1);
        b=(b<<1)|((r>>1)&1);
}
``` level Level of bit-planes to decode beyond the most significant 2-bits wise plane.

r Bit plane of the 2-tuple less significant than the most significant 2-bits wise plane.

a,b 2-tuple corresponding to quantized spectral coefficients acod_r01:1 Arithmetic codeword necessary for arithmetic decoding of 'r'

For another example, the LSB decoding unit 2709 may decode sign information. Specifically, when the absolute value is not 0 after the decoding on each of the absolute values of the quantized spectrums is completed, the LSB decoding unit 2709 may transmit sign information of each of the quantized spectrums by adopting a bit packing scheme.

Components not described in FIG. 27 may refer to the descriptions of FIG. 11.

Figure 28:
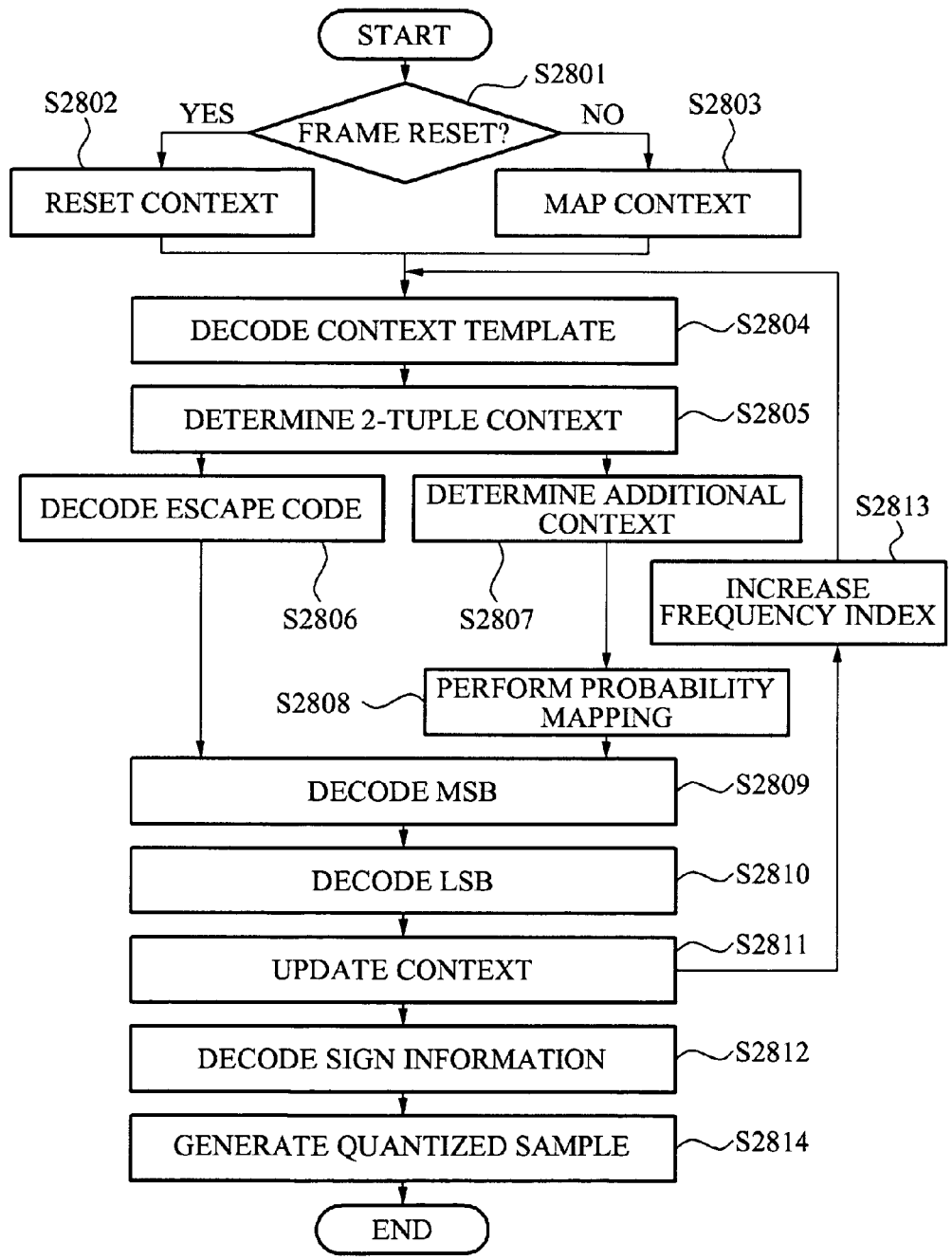
FIG. 28 is a flowchart illustrating a context-based arithmetic decoding method with respect to a 2-tuple according to an embodiment.
Figure 29:
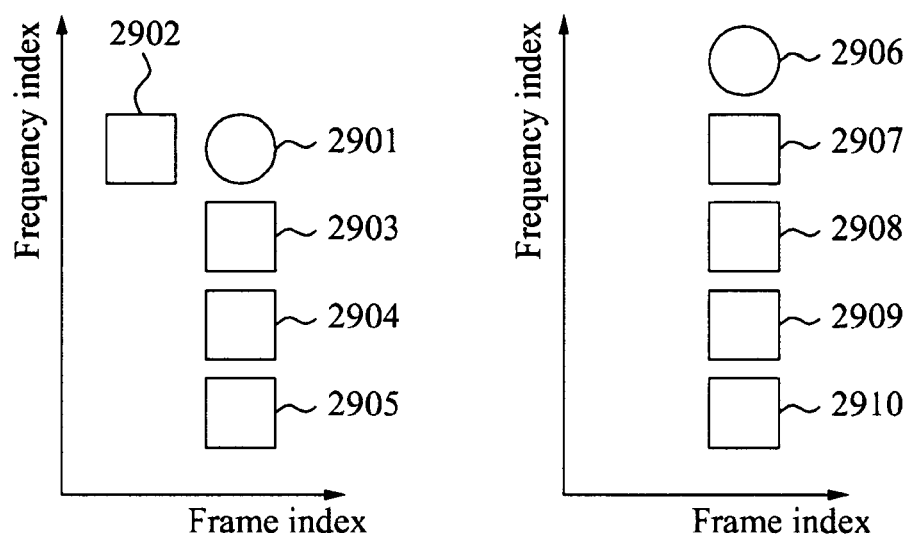
FIG. 29 is a diagram used for describing a process of performing an arithmetic encoding/decoding on a 2-tuple according to an embodiment.

FIG. 28 is a flowchart illustrating a context-based arithmetic decoding method with respect to a 2-tuple according to an embodiment.

In operation S2801, the arithmetic decoding apparatus 101 may determine whether a current frame is a reset frame. In operation S2802, when the current frame is the reset frame, the arithmetic decoding apparatus 101 may perform a context reset. In operation S2803, the arithmetic decoding apparatus 101 may map a context. Specifically, the arithmetic decoding apparatus 101 may regularize a length of a previous frame as a length of the current frame to thereby map the context so that a frequency index between two frames may be mapped in a case where the length of the current frame is different from the length of the previous frame.

Operations S2801 to S2803 may be performed in a frame unit.

In operation S2804, the arithmetic decoding apparatus 101 may perform a decoding on a single context template finally transmitted from a plurality of contexts to be used when performing an MSB of a current 2-tuple. The context template may refer to the descriptions of FIG. 20. In operation S2805, the arithmetic decoding apparatus 101 may determine a 2-tuple context of the current 2-tuple. An operation of determining the 2-tuple context of the current 2-tuple may refer to the description of FIG. 28.

In operation S2806, the arithmetic decoding apparatus 101 may perform a decoding on an escape code. Whenever the escape code is decoded, a lev 0 may be updated, and in operation S2809, when a value different from the escape code is decoded, the arithmetic decoding apparatus 101 may perform a decoding on an MSB.

In operation S2807, the arithmetic decoding apparatus 101 may determine an MSB context corresponding to an MSB of the current 2-tuple to be currently decoded. In operation S2808, the arithmetic decoding apparatus 101 may determine an appropriate probability model based on a 2-tuple context and an additional context.

In operation S2808, the arithmetic decoding apparatus 101 may determine an appropriate probability model based on the 2-tuple context and an additional context.

In operation S2809, the arithmetic decoding apparatus 101 may perform a decoding on an MSB based on the 2-tuple context. In some cases, the arithmetic decoding apparatus 101 may use only the 2-tuple context, and in other cases, the arithmetic decoding apparatus 101 may use both the 2-tuple context and the additional context. In operation S2810, the arithmetic decoding apparatus 101 may perform a decoding on bits by a bit depth of an LSB derived from the decoding of the escape code. In operation S2812, the arithmetic decoding apparatus 101 may update the context, and in operation S2813, may increase a frequency index. When the decoding is performed on both the MSB and the LSB, the arithmetic decoding apparatus 101 may perform a decoding on sign information.

In operation S2815, the arithmetic decoding apparatus 101 may generate a quantized sample.

The above described methods may be recorded, stored, or fixed in one or more computer-readable non-transitory storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable media include magnetic media such as hard disks, floppy disks, and magnetic tape; optical media such as CD ROM disks and DVDs; magnetooptical media such as optical disks; and hardware devices that are specially configured to store and perform program instructions, such as read-only memory (ROM), random access memory (RAM), flash memory, and the like. The computer-readable media may also be a distributed network, so that the program instructions are stored and executed in a distributed fashion. The program instructions may be executed by one or more processors. The computer-readable media may also be embodied in at least one application specific integrated circuit (ASIC) or Field Programmable Gate Array (FPGA), which executes (processes like a processor) program instructions. Examples of program instructions include both machine code, such as produced by a compiler, and files containing higher level code that may be executed by the computer using an interpreter. The described hardware devices may be configured to act as one or more software modules in order to perform the operations and methods described above, or vice versa.

Although a few embodiments have been shown and described, it would be appreciated by those skilled in the art that changes may be made in these embodiments without departing from the principles and spirit of the disclosure, the scope of which is defined in the claims and their equivalents.

What is claimed is:

1. A method of noiseless-decoding a 2-tuple which is a combination of two spectral coefficients, the method comprising:

determining a first context of an input signal including audio or speech, based on a neighboring 2-tuple of a current 2-tuple;

decoding a most significant bit (MSB) of the current 2-tuple, by using a first probability table obtained from the first context, wherein the neighboring 2-tuple is previously decoded prior to the current 2-tuple;

determining, performed by at least one processing device, a second context of the input signal including the audio or the speech based on information indicating whether at least one non-zero bit is included in decoded bits of a spectral coefficient;

decoding a least significant bit (LSB) of the current 2-tuple, by using a second probability table obtained from the second context; and generating quantized spectral coefficients of the current 2-tuple based on the decoded MSB and the decoded LSB, wherein the first context is different from the second context.

2. The method of claim 1, wherein the LSB of the current 2-tuple is decoded when the two spectral coefficients of the current 2-tuple are not 0.

3. The method of claim 1, wherein arithmetic decoding is used for the noiseless-decoding.

* * * * *